US012591407B2

(12) United States Patent
Usher

(10) Patent No.: US 12,591,407 B2
(45) Date of Patent: *Mar. 31, 2026

(54) ROBUST VOICE ACTIVITY DETECTOR SYSTEM FOR USE WITH AN EARPHONE

(71) Applicant: ST R&DTech, LLC

(72) Inventor: John Usher, Beer (GB)

(73) Assignee: ST R&DTech, LLC, Delray Beach, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/111,671

(22) Filed: Feb. 20, 2023

(65) Prior Publication Data

US 2023/0280965 A1 Sep. 7, 2023

Related U.S. Application Data

(63) Continuation of application No. 17/013,538, filed on Sep. 5, 2020, now Pat. No. 11,693,617, which is a (Continued)

(51) Int. Cl.
*G06F 3/16* (2006.01)
*G10L 15/22* (2006.01)
(Continued)

(52) U.S. Cl.
CPC .............. *G06F 3/165* (2013.01); *G10L 15/22* (2013.01); *G10L 21/034* (2013.01); *G10L 25/78* (2013.01);
(Continued)

(58) Field of Classification Search
CPC ..... G10L 25/78; G10L 25/84; G10L 21/0208; G10L 21/02
See application file for complete search history.

(56) References Cited

U.S. PATENT DOCUMENTS

| | | | |
|---|---|---|---|
| 2,803,308 A | 8/1957 | Di Mattia | |
| 3,028,454 A | 4/1962 | Von Kohorn | |

(Continued)

FOREIGN PATENT DOCUMENTS

| | | |
|---|---|---|
| AU | 2006200446 A1 | 2/2006 |
| CA | 1169969 A | 6/1984 |

(Continued)

OTHER PUBLICATIONS

*Samsung Electronics Co., Ltd., and Samsung Electronics, America, Inc.*, v. *Staton Techiya, LLC*, IPR2022-00282, Dec. 21, 2021.
(Continued)

*Primary Examiner* — Mark Villena
(74) *Attorney, Agent, or Firm* — Akerman LLP; Peter A. Chiabotti

(57) ABSTRACT

An electronic device or method for adjusting a gain on a voice operated control system can include one or more processors and a memory having computer instructions. The instructions, when executed by the one or more processors causes the one or more processors to perform the operations of receiving a first microphone signal, receiving a second microphone signal, updating a slow time weighted ratio of the filtered first and second signals, and updating a fast time weighted ratio of the filtered first and second signals. The one or more processors can further perform the operations of calculating an absolute difference between the fast time weighted ratio and the slow time weighted ratio, comparing the absolute difference with a threshold, and increasing the gain when the absolute difference is greater than the threshold. Other embodiments are disclosed.

9 Claims, 3 Drawing Sheets

Exemplary configuration of VAD system.

Related U.S. Application Data continuation of application No. 16/227,695, filed on Dec. 20, 2018, now Pat. No. 10,824,388, which is a continuation of application No. 14/922,475, filed on Oct. 26, 2015, now Pat. No. 10,163,453.

(60) Provisional application No. 62/068,273, filed on Oct. 24, 2014.

(51) Int. Cl.

| | |
|---|---|
| *G10L 21/034* | (2013.01) |
| *G10L 25/78* | (2013.01) |
| *H03G 3/34* | (2006.01) |
| *H04R 1/40* | (2006.01) |
| *H04R 3/00* | (2006.01) |
| *H04R 1/10* | (2006.01) |
| *H04R 29/00* | (2006.01) |

(52) U.S. Cl.

CPC ............. *H03G 3/341* (2013.01); *H04R 1/406* (2013.01); *H04R 3/005* (2013.01); *H04R 1/1083* (2013.01); *H04R 29/006* (2013.01)

(56) References Cited

U.S. PATENT DOCUMENTS

| | | |
|---|---|---|
| 3,729,598 A | 4/1973 | Tegt et al. |
| 3,876,843 A | 4/1975 | Moen |
| 4,041,256 A | 8/1977 | Ohta et al. |
| 4,054,749 A | 10/1977 | Suzuki et al. |
| 4,088,849 A | 5/1978 | Usami et al. |
| 4,455,677 A | 6/1984 | Fox |
| 4,533,795 A | 8/1985 | Baumhauer et al. |
| 4,555,677 A | 11/1985 | Beesley |
| 4,596,902 A | 6/1986 | Gilman |
| 4,827,458 A | 5/1989 | D Alayer De Costemore D Arc |
| 4,891,841 A | 1/1990 | Bohn |
| 4,941,187 A | 7/1990 | Slater |
| 4,947,432 A | 8/1990 | Topholm |
| 4,947,440 A | 8/1990 | Bateman et al. |
| 5,002,151 A | 3/1991 | Oliveira et al. |
| 5,027,410 A | 6/1991 | Williamson et al. |
| 5,033,090 A | 7/1991 | Weinrich |
| 5,182,774 A | 1/1993 | Bourk |
| 5,202,927 A | 4/1993 | Topholm |
| 5,204,906 A | 4/1993 | Nohara et al. |
| 5,208,867 A | 5/1993 | Stites, III |
| 5,251,263 A | 10/1993 | Andrea |
| 5,259,033 A | 11/1993 | Goodings et al. |
| 5,267,321 A | 11/1993 | Langberg |
| 5,276,740 A | 1/1994 | Inanaga et al. |
| 5,298,692 A | 3/1994 | Ikeda et al. |
| 5,317,273 A | 5/1994 | Hanson |
| 5,327,506 A | 7/1994 | Stites, III |
| 5,345,430 A | 9/1994 | Moe |
| 5,390,254 A | 2/1995 | Adelman |
| 5,430,826 A | 7/1995 | Webster et al. |
| 5,473,684 A | 12/1995 | Bartlett et al. |
| 5,479,522 A | 12/1995 | Lindemann |
| 5,524,056 A | 6/1996 | Killion et al. |
| 5,526,819 A | 6/1996 | Lonsbury-Martin et al. |
| 5,528,739 A | 6/1996 | Lucas et al. |
| 5,539,831 A | 7/1996 | Harley |
| 5,550,923 A | 8/1996 | Hotvet |
| 5,557,659 A | 9/1996 | Hyde-Thomson |
| 5,577,511 A | 11/1996 | Killion |
| 5,606,621 A | 2/1997 | Reiter et al. |
| 5,632,002 A | 5/1997 | Hashimoto et al. |
| 5,636,351 A | 6/1997 | Lee |
| 5,647,011 A | 7/1997 | Garvis |
| 5,649,055 A | 7/1997 | Gupta et al. |
| 5,692,059 A | 11/1997 | Kruger |
| 5,740,262 A | 4/1998 | Yoshida et al. |
| 5,748,754 A | 5/1998 | Maag et al. |
| 5,764,778 A | 6/1998 | Zurek |
| 5,787,187 A | 7/1998 | Bouchard et al. |
| 5,799,273 A | 8/1998 | Mitchell et al. |
| 5,826,064 A | 10/1998 | Loring et al. |
| 5,862,065 A | 1/1999 | Muthusamy |
| 5,887,070 A | 3/1999 | Iseberg et al. |
| 5,903,868 A | 5/1999 | Yuen et al. |
| 5,909,667 A | 6/1999 | Leontiades et al. |
| 5,920,835 A | 7/1999 | Huzenlaub et al. |
| 5,923,624 A | 7/1999 | Groeger et al. |
| 5,930,751 A | 7/1999 | Cohrs et al. |
| 5,933,506 A | 8/1999 | Aoki et al. |
| 5,933,510 A | 8/1999 | Bryant et al. |
| 5,937,070 A | 8/1999 | Todter et al. |
| 5,946,050 A | 8/1999 | Wolff |
| 5,953,392 A | 9/1999 | Rhie et al. |
| 5,956,681 A | 9/1999 | Yamakita |
| 5,991,417 A | 11/1999 | Topholm |
| 6,005,525 A | 12/1999 | Kivela |
| 6,021,205 A | 2/2000 | Yamada et al. |
| 6,021,207 A | 2/2000 | Puthuff et al. |
| 6,021,325 A | 2/2000 | Hall |
| 6,028,514 A | 2/2000 | Lemelson et al. |
| 6,048,320 A | 4/2000 | Brainard, II |
| 6,056,698 A | 5/2000 | Iseberg |
| 6,069,963 A | 5/2000 | Martin et al. |
| 6,072,645 A | 6/2000 | Sprague |
| 6,072,884 A | 6/2000 | Kates |
| 6,094,492 A | 7/2000 | Boesen |
| 6,094,494 A | 7/2000 | Haroldson |
| 6,101,256 A | 8/2000 | Steelman |
| 6,118,877 A | 9/2000 | Lindemann et al. |
| 6,118,878 A | 9/2000 | Jones |
| 6,141,426 A | 10/2000 | Stobba et al. |
| 6,151,571 A | 11/2000 | Pertrushin |
| 6,160,758 A | 12/2000 | Spiesberger |
| 6,163,338 A | 12/2000 | Johnson et al. |
| 6,163,508 A | 12/2000 | Kim et al. |
| 6,173,259 B1 | 1/2001 | Bijl et al. |
| 6,175,633 B1 | 1/2001 | Morrill et al. |
| 6,198,971 B1 | 3/2001 | Leysieffer |
| 6,226,389 B1 | 5/2001 | Lemelson et al. |
| 6,263,147 B1 | 7/2001 | Tognazzini |
| 6,269,161 B1 | 7/2001 | McLaughlin et al. |
| 6,298,323 B1 | 10/2001 | Kaemmerer |
| 6,308,158 B1 | 10/2001 | Kuhnen et al. |
| 6,311,092 B1 | 10/2001 | Yamada |
| 6,338,038 B1 | 1/2002 | Hanson |
| 6,359,993 B2 | 3/2002 | Brimhall |
| 6,400,652 B1 | 6/2002 | Goldberg et al. |
| 6,405,165 B1 | 6/2002 | Blum et al. |
| 6,408,272 B1 | 6/2002 | White et al. |
| 6,415,034 B1 | 7/2002 | Hietanen |
| 6,424,721 B1 | 7/2002 | Hohn |
| 6,445,799 B1 | 9/2002 | Taenzer et al. |
| 6,456,975 B1 | 9/2002 | Chang |
| 6,463,413 B1 | 10/2002 | Applebaum et al. |
| 6,475,163 B1 | 11/2002 | Smits et al. |
| 6,483,899 B2 | 11/2002 | Agraharam et al. |
| 6,490,557 B1 | 12/2002 | Jeppesen |
| 6,513,621 B1 | 2/2003 | Deslauriers et al. |
| 6,526,148 B1 | 2/2003 | Jourjine et al. |
| 6,526,381 B1 | 2/2003 | Wilson |
| 6,554,761 B1 | 4/2003 | Puria et al. |
| 6,567,524 B1 | 5/2003 | Svean et al. |
| 6,593,848 B1 | 7/2003 | Atkins, III |
| 6,597,787 B1 | 7/2003 | Lindgren et al. |
| 6,606,598 B1 | 8/2003 | Holthouse et al. |
| 6,639,987 B2 | 10/2003 | McIntosh |
| 6,647,123 B2 | 11/2003 | Kandel et al. |
| 6,647,368 B2 | 11/2003 | Nemirovski |
| 6,648,368 B2 | 11/2003 | Smith et al. |
| RE38,351 E | 12/2003 | Iseberg et al. |
| 6,658,122 B1 | 12/2003 | Westermann et al. |
| 6,661,886 B1 | 12/2003 | Huart et al. |
| 6,661,901 B1 | 12/2003 | Svean et al. |
| 6,671,379 B2 | 12/2003 | Nemirovski |
| 6,671,643 B2 | 12/2003 | Kachler et al. |
| 6,674,862 B1 | 1/2004 | Magilen |

(56) References Cited

U.S. PATENT DOCUMENTS

| | | |
|---|---|---|
| 6,687,339 B2 | 2/2004 | Martin |
| 6,687,377 B2 | 2/2004 | Voix et al. |
| 6,687,671 B2 | 2/2004 | Gudorf et al. |
| 6,717,991 B1 | 4/2004 | Gustafsson et al. |
| 6,725,194 B1 | 4/2004 | Bartosik et al. |
| 6,728,385 B2 | 4/2004 | Kval et al. |
| 6,738,482 B1 | 5/2004 | Jaber |
| 6,738,485 B1 | 5/2004 | Boesen |
| 6,748,238 B1 | 6/2004 | Lau |
| 6,754,359 B1 | 6/2004 | Svean et al. |
| 6,760,754 B1 | 7/2004 | Isaacs et al. |
| 6,775,206 B2 | 8/2004 | Karhu |
| 6,782,106 B1 | 8/2004 | Kong et al. |
| 6,785,394 B1 | 8/2004 | Olsen et al. |
| 6,789,060 B1 | 9/2004 | Wolfe et al. |
| 6,804,638 B2 | 10/2004 | Fiedler |
| 6,804,643 B1 | 10/2004 | Kiss |
| 6,826,286 B1 | 11/2004 | Arndt et al. |
| 6,837,857 B2 | 1/2005 | Stirnemann |
| 6,879,692 B2 | 4/2005 | Nielsen et al. |
| 6,910,013 B2 | 6/2005 | Allegro et al. |
| 6,912,289 B2 | 6/2005 | Vonlanthen et al. |
| 6,941,161 B1 | 9/2005 | Bobisuthi et al. |
| 6,987,992 B2 | 1/2006 | Hundal et al. |
| 7,003,099 B1 | 2/2006 | Zhang |
| 7,003,123 B2 | 2/2006 | Kanevsky et al. |
| 7,020,297 B2 | 3/2006 | Fang et al. |
| 7,037,274 B2 | 5/2006 | Thornton et al. |
| 7,039,195 B1 | 5/2006 | Svean |
| 7,039,585 B2 | 5/2006 | Wilmot et al. |
| 7,043,037 B2 | 5/2006 | Lichtblau |
| 7,050,592 B1 | 5/2006 | Iseberg et al. |
| 7,050,966 B2 | 5/2006 | Schneider et al. |
| 7,050,971 B1 | 5/2006 | Kaufholz |
| 7,072,482 B2 | 7/2006 | Van et al. |
| 7,082,393 B2 | 7/2006 | Lahr |
| 7,092,532 B2 | 8/2006 | Luo et al. |
| 7,103,188 B1 | 9/2006 | Jones |
| 7,107,109 B1 | 9/2006 | Nathan et al. |
| 7,110,554 B2 | 9/2006 | Brennan et al. |
| 7,130,437 B2 | 10/2006 | Stonikas et al. |
| 7,158,643 B2 | 1/2007 | Lavoie et al. |
| 7,158,933 B2 | 1/2007 | Balan |
| 7,162,041 B2 | 1/2007 | Haapapuro et al. |
| 7,174,022 B1 | 2/2007 | Zhang et al. |
| 7,177,433 B2 | 2/2007 | Sibbald |
| 7,181,020 B1 | 2/2007 | Riley |
| 7,181,030 B2 | 2/2007 | Rasmussen et al. |
| 7,209,569 B2 | 4/2007 | Boesen |
| 7,215,766 B2 | 5/2007 | Wurtz |
| 7,223,245 B2 | 5/2007 | Zoth et al. |
| 7,246,058 B2 | 7/2007 | Burnett |
| 7,277,722 B2 | 10/2007 | Rosenzweig |
| 7,280,849 B1 | 10/2007 | Bailey |
| 7,312,699 B2 | 12/2007 | Chornenky |
| 7,346,504 B2 | 3/2008 | Liu et al. |
| 7,359,504 B1 | 4/2008 | Reuss et al. |
| 7,383,178 B2 | 6/2008 | Msser et al. |
| 7,395,090 B2 | 7/2008 | Alden |
| 7,430,299 B2 | 9/2008 | Armstrong et al. |
| 7,430,300 B2 | 9/2008 | Vosburgh et al. |
| 7,433,463 B2 | 10/2008 | Alves et al. |
| 7,433,714 B2 | 10/2008 | Howard et al. |
| 7,444,353 B1 | 10/2008 | Chen |
| 7,450,730 B2 | 11/2008 | Berg et al. |
| 7,464,029 B2 | 12/2008 | Visser et al. |
| 7,477,754 B2 | 1/2009 | Rasmussen et al. |
| 7,477,756 B2 | 1/2009 | Wickstrom et al. |
| 7,477,922 B2 | 1/2009 | Lewis |
| 7,502,484 B2 | 3/2009 | Ngia et al. |
| 7,512,245 B2 | 3/2009 | Rasmussen |
| 7,519,193 B2 | 4/2009 | Fretz |
| 7,529,379 B2 | 5/2009 | Zurek |
| 7,532,734 B2 | 5/2009 | Pham et al. |
| 7,536,006 B2 | 5/2009 | Patel et al. |
| 7,562,020 B2 | 7/2009 | Le et al. |
| 7,574,917 B2 | 8/2009 | Von et al. |
| 7,590,254 B2 | 9/2009 | Olsen |
| 7,617,099 B2 | 11/2009 | Yang et al. |
| 7,623,823 B2 | 11/2009 | Zito et al. |
| 7,634,094 B2 | 12/2009 | Reber |
| 7,659,827 B2 | 2/2010 | Gunderson et al. |
| 7,680,465 B2 | 3/2010 | Zad-Issa |
| 7,702,482 B2 | 4/2010 | Graepel et al. |
| 7,710,654 B2 | 5/2010 | Ashkenazi et al. |
| 7,715,568 B2 | 5/2010 | Nakano |
| 7,715,577 B2 | 5/2010 | Allen et al. |
| 7,729,912 B1 | 6/2010 | Bacchiani et al. |
| 7,756,281 B2 | 7/2010 | Goldstein et al. |
| 7,756,283 B2 | 7/2010 | Lars |
| 7,756,285 B2 | 7/2010 | Sjursen et al. |
| 7,773,743 B2 | 8/2010 | Stokes et al. |
| 7,773,759 B2 | 8/2010 | Alves et al. |
| 7,773,763 B2 | 8/2010 | Pedersen |
| 7,774,202 B2 | 8/2010 | Spengler et al. |
| 7,778,434 B2 | 8/2010 | Juneau et al. |
| 7,801,318 B2 | 9/2010 | Barthel |
| 7,801,726 B2 | 9/2010 | Ariu |
| 7,804,974 B2 | 9/2010 | Paludan-Muller et al. |
| 7,813,520 B2 | 10/2010 | Von et al. |
| 7,817,808 B2 | 10/2010 | Konchitsky et al. |
| 7,844,070 B2 | 11/2010 | Abolfathi |
| 7,844,248 B2 | 11/2010 | Sotack |
| 7,853,031 B2 | 12/2010 | Hamacher |
| 7,861,008 B2 | 12/2010 | Batson et al. |
| 7,861,723 B2 | 1/2011 | Dedrick et al. |
| 7,869,606 B2 | 1/2011 | Fichtl et al. |
| 7,903,825 B1 | 3/2011 | Melanson |
| 7,903,826 B2 | 3/2011 | Boersma |
| 7,903,833 B2 | 3/2011 | Goldberg et al. |
| 7,920,557 B2 | 4/2011 | Moote |
| 7,925,007 B2 | 4/2011 | Stokes et al. |
| 7,929,713 B2 | 4/2011 | Mctorian et al. |
| 7,933,423 B2 | 4/2011 | Baekgaard et al. |
| 7,936,885 B2 | 5/2011 | Frank |
| 7,953,241 B2 | 5/2011 | Jorgensen et al. |
| 7,983,433 B2 | 7/2011 | Nemirovski |
| 7,983,907 B2 | 7/2011 | Msser et al. |
| 7,986,791 B2 | 7/2011 | Bostick et al. |
| 7,986,802 B2 | 7/2011 | Ziller |
| 7,995,773 B2 | 8/2011 | Mao |
| 8,014,553 B2 | 9/2011 | Radivojevic et al. |
| 8,018,337 B2 | 9/2011 | Jones et al. |
| 8,019,091 B2 | 9/2011 | Burnett et al. |
| 8,027,481 B2 | 9/2011 | Beard |
| 8,045,840 B2 | 10/2011 | Murata et al. |
| 8,047,207 B2 | 11/2011 | Perez et al. |
| 8,050,143 B2 | 11/2011 | Bufi et al. |
| 8,068,627 B2 | 11/2011 | Zhang et al. |
| 8,077,872 B2 | 12/2011 | Dyer et al. |
| 8,081,780 B2 | 12/2011 | Goldstein et al. |
| 8,085,943 B2 | 12/2011 | Bizjak |
| 8,086,093 B2 | 12/2011 | Stuckman |
| 8,111,839 B2 | 2/2012 | Goldstein et al. |
| 8,111,840 B2 | 2/2012 | Haulick et al. |
| 8,111,849 B2 | 2/2012 | Tateno et al. |
| 8,116,472 B2 | 2/2012 | Mizuno |
| 8,116,489 B2 | 2/2012 | Mejia et al. |
| 8,121,301 B2 | 2/2012 | Suzuki et al. |
| 8,140,325 B2 | 3/2012 | Kanevsky et al. |
| 8,144,881 B2 | 3/2012 | Crockett et al. |
| 8,144,891 B2 | 3/2012 | Her et al. |
| 8,150,044 B2 | 4/2012 | Goldstein et al. |
| 8,150,084 B2 | 4/2012 | Jessen et al. |
| 8,160,261 B2 | 4/2012 | Schulein et al. |
| 8,160,273 B2 | 4/2012 | Msser et al. |
| 8,162,846 B2 | 4/2012 | Epley |
| 8,180,078 B2 | 5/2012 | Zellner |
| 8,184,823 B2 | 5/2012 | Itabashi et al. |
| 8,186,478 B1 | 5/2012 | Grason |
| 8,189,803 B2 | 5/2012 | Bergeron |
| 8,194,864 B2 | 6/2012 | Goldstein et al. |
| 8,194,865 B2 | 6/2012 | Goldstein et al. |
| 8,199,919 B2 | 6/2012 | Goldstein et al. |

(56)             References Cited

U.S. PATENT DOCUMENTS

| | | | |
|---|---|---|---|
| 8,199,942 | B2 | 6/2012 | Mao |
| 8,204,435 | B2 | 6/2012 | Seshadri et al. |
| 8,208,609 | B2 | 6/2012 | Harris et al. |
| 8,208,642 | B2 | 6/2012 | Edwards |
| 8,208,644 | B2 | 6/2012 | Goldstein et al. |
| 8,208,652 | B2 | 6/2012 | Keady |
| 8,209,181 | B2 | 6/2012 | Heckerman et al. |
| 8,213,629 | B2 | 7/2012 | Goldstein et al. |
| 8,218,784 | B2 | 7/2012 | Schulein et al. |
| 8,221,861 | B2 | 7/2012 | Keady |
| 8,229,127 | B2 | 7/2012 | Jorgensen et al. |
| 8,229,128 | B2 | 7/2012 | Keady |
| 8,229,148 | B2 | 7/2012 | Rasmussen et al. |
| 8,229,513 | B2 | 7/2012 | Ibe |
| 8,251,925 | B2 | 8/2012 | Keady et al. |
| 8,254,586 | B2 | 8/2012 | Voix et al. |
| 8,254,591 | B2 | 8/2012 | Goldstein et al. |
| 8,270,629 | B2 | 9/2012 | Bothra |
| 8,270,634 | B2 | 9/2012 | Harney et al. |
| 8,306,235 | B2 | 11/2012 | Mahowald |
| 8,312,960 | B2 | 11/2012 | Keady |
| 8,315,400 | B2 | 11/2012 | Goldstein et al. |
| 8,322,222 | B2 | 12/2012 | Goldberg et al. |
| 8,340,309 | B2 | 12/2012 | Burnett et al. |
| 8,351,634 | B2 | 1/2013 | Khenkin |
| 8,369,901 | B2 | 2/2013 | Haulick et al. |
| 8,374,361 | B2 | 2/2013 | Moon et al. |
| 8,385,560 | B2 | 2/2013 | Solbeck et al. |
| 8,391,534 | B2 | 3/2013 | Ambrose et al. |
| 8,401,198 | B2 | 3/2013 | Oh et al. |
| 8,401,200 | B2 | 3/2013 | Tiscareno et al. |
| 8,411,880 | B2 | 4/2013 | Wang et al. |
| 8,437,480 | B2 | 5/2013 | Zong |
| 8,437,492 | B2 | 5/2013 | Goldstein et al. |
| 8,447,370 | B2 | 5/2013 | Ueda et al. |
| 8,462,969 | B2 | 6/2013 | Claussen et al. |
| 8,462,974 | B2 | 6/2013 | Jeong et al. |
| 8,472,616 | B1 | 6/2013 | Jiang |
| 8,477,955 | B2 | 7/2013 | Engle et al. |
| 8,488,799 | B2 | 7/2013 | Goldstein et al. |
| 8,493,204 | B2 | 7/2013 | Wong et al. |
| 8,515,089 | B2 | 8/2013 | Nicholson |
| 8,522,916 | B2 | 9/2013 | Keady |
| 8,548,181 | B2 | 10/2013 | Kraemer |
| 8,550,206 | B2 | 10/2013 | Keady et al. |
| 8,554,350 | B2 | 10/2013 | Keady et al. |
| 8,577,062 | B2 | 11/2013 | Goldstein |
| 8,594,341 | B2 | 11/2013 | Rothschild |
| 8,600,067 | B2 | 12/2013 | Usher et al. |
| 8,600,086 | B2 | 12/2013 | Jensen et al. |
| 8,611,548 | B2 | 12/2013 | Bizjak |
| 8,611,560 | B2 | 12/2013 | Goldstein |
| 8,625,818 | B2 | 1/2014 | Stultz et al. |
| 8,625,819 | B2 | 1/2014 | Goldstein et al. |
| 8,631,801 | B2 | 1/2014 | Keady |
| 8,649,540 | B2 | 2/2014 | Killion et al. |
| 8,652,040 | B2 | 2/2014 | Leboeuf et al. |
| 8,657,064 | B2 | 2/2014 | Staab et al. |
| 8,678,011 | B2 | 3/2014 | Goldstein et al. |
| 8,693,704 | B2 | 4/2014 | Kim et al. |
| 8,718,288 | B2 | 5/2014 | Woods et al. |
| 8,718,305 | B2 | 5/2014 | Usher et al. |
| 8,718,313 | B2 | 5/2014 | Keady |
| 8,744,091 | B2 | 6/2014 | Chen et al. |
| 8,750,295 | B2 | 6/2014 | Liron |
| 8,774,433 | B2 | 7/2014 | Goldstein |
| 8,774,435 | B2 | 7/2014 | Ambrose et al. |
| 8,792,669 | B2 | 7/2014 | Harsch |
| 8,798,278 | B2 | 8/2014 | Isabelle et al. |
| 8,798,279 | B2 | 8/2014 | Ranta |
| 8,798,289 | B1 | 8/2014 | Every et al. |
| 8,804,974 | B1 | 8/2014 | Melanson |
| 8,838,445 | B1 * | 9/2014 | Bultemeier ............ G11B 20/22 |
| | | | 704/226 |
| 8,848,939 | B2 | 9/2014 | Keady et al. |
| 8,851,372 | B2 | 10/2014 | Zhou et al. |
| 8,855,343 | B2 | 10/2014 | Usher |
| 8,903,113 | B2 | 12/2014 | Gebert |
| 8,917,880 | B2 | 12/2014 | Goldstein et al. |
| 8,917,892 | B2 | 12/2014 | Poe et al. |
| 8,917,894 | B2 | 12/2014 | Goldstein et al. |
| 8,935,164 | B2 | 1/2015 | Turnbull |
| 8,942,370 | B2 | 1/2015 | Li et al. |
| 8,942,405 | B2 | 1/2015 | Jones et al. |
| 8,948,428 | B2 | 2/2015 | Kates |
| 8,983,081 | B2 | 3/2015 | Bayley et al. |
| 8,992,710 | B2 | 3/2015 | Keady |
| 9,002,023 | B2 | 4/2015 | Gauger, Jr. |
| 9,013,351 | B2 | 4/2015 | Park et al. |
| 9,037,458 | B2 | 5/2015 | Park et al. |
| 9,053,697 | B2 | 6/2015 | Park |
| 9,076,427 | B2 | 7/2015 | Alderson et al. |
| 9,112,701 | B2 | 8/2015 | Sano et al. |
| 9,113,240 | B2 | 8/2015 | Ramakrishman |
| 9,113,267 | B2 | 8/2015 | Usher et al. |
| 9,123,323 | B2 | 9/2015 | Keady |
| 9,123,343 | B2 | 9/2015 | Kurki-Suonio |
| 9,124,982 | B2 | 9/2015 | Goldstein et al. |
| 9,135,797 | B2 | 9/2015 | Couper et al. |
| 9,135,809 | B2 | 9/2015 | Chang et al. |
| 9,137,597 | B2 | 9/2015 | Usher et al. |
| 9,138,353 | B2 | 9/2015 | Keady |
| 9,142,207 | B2 | 9/2015 | Hendrix et al. |
| 9,165,567 | B2 | 10/2015 | Msser et al. |
| 9,185,481 | B2 | 11/2015 | Goldstein et al. |
| 9,191,732 | B2 | 11/2015 | Wurtz |
| 9,191,740 | B2 | 11/2015 | McIntosh |
| 9,196,247 | B2 | 11/2015 | Harada |
| 9,216,237 | B2 | 12/2015 | Keady |
| 9,270,244 | B2 | 2/2016 | Usher et al. |
| 9,288,592 | B2 | 3/2016 | Basseas |
| 9,338,568 | B2 | 5/2016 | Van Hal |
| 9,357,288 | B2 | 5/2016 | Goldstein et al. |
| 9,369,814 | B2 | 6/2016 | Victorian et al. |
| 9,445,183 | B2 | 9/2016 | Dahl |
| 9,462,100 | B2 | 10/2016 | Usher et al. |
| 9,491,542 | B2 | 11/2016 | Usher |
| 9,497,423 | B2 | 11/2016 | Moberly |
| 9,532,139 | B1 | 12/2016 | Lu et al. |
| 9,539,147 | B2 | 1/2017 | Keady et al. |
| 9,554,733 | B2 | 1/2017 | Henriksen et al. |
| 9,609,424 | B2 | 3/2017 | Goldstein |
| 9,628,896 | B2 | 4/2017 | Ichimura |
| 9,653,869 | B1 | 5/2017 | Hersman et al. |
| 9,684,778 | B2 | 6/2017 | Tharappel et al. |
| 9,685,921 | B2 | 6/2017 | Smith et al. |
| 9,757,069 | B2 | 9/2017 | Keady et al. |
| 9,763,003 | B2 | 9/2017 | Usher et al. |
| 9,779,716 | B2 | 10/2017 | Gadonniex et al. |
| 9,781,530 | B2 | 10/2017 | Usher et al. |
| 9,843,854 | B2 | 12/2017 | Keady |
| 9,894,452 | B1 | 2/2018 | Termeulen et al. |
| 9,943,185 | B2 | 4/2018 | Chen |
| 10,012,529 | B2 | 7/2018 | Goldstein et al. |
| 10,045,107 | B2 | 8/2018 | Kirsch et al. |
| 10,142,332 | B2 | 11/2018 | Ravindran et al. |
| 10,171,922 | B2 | 1/2019 | Merks |
| 10,190,904 | B2 | 1/2019 | Goldstein et al. |
| 10,284,939 | B2 | 5/2019 | Radin et al. |
| 10,297,246 | B2 | 5/2019 | Asada et al. |
| 10,365,883 | B2 | 7/2019 | Goldstein et al. |
| 10,413,197 | B2 | 9/2019 | Leboeuf et al. |
| 10,506,320 | B1 | 12/2019 | Lott |
| 10,652,672 | B2 | 5/2020 | Merks |
| 10,709,339 | B1 | 7/2020 | Lusted |
| 10,760,948 | B2 | 9/2020 | Goldstein et al. |
| 10,848,827 | B2 | 11/2020 | Sengupta et al. |
| 10,917,711 | B2 | 2/2021 | Higgins |
| 10,966,015 | B2 | 3/2021 | Usher |
| 10,970,375 | B2 | 4/2021 | Shila et al. |
| 10,979,836 | B2 | 4/2021 | Usher et al. |
| 11,006,198 | B2 | 5/2021 | Lott |
| 11,012,770 | B2 | 5/2021 | Hatfield et al. |
| 11,039,259 | B2 | 6/2021 | Goldstein et al. |

(56) References Cited

U.S. PATENT DOCUMENTS

| | | |
|---|---|---|
| 11,051,704 B1 | 7/2021 | Tran |
| 11,057,701 B2 | 7/2021 | Goldstein et al. |
| 11,115,750 B2 | 9/2021 | Monsarrat-Chanon et al. |
| 11,122,357 B2 | 9/2021 | Burnett |
| 11,172,298 B2 | 11/2021 | Carrigan et al. |
| 11,217,237 B2 | 1/2022 | Usher et al. |
| 11,244,666 B2 | 2/2022 | Goldstein et al. |
| 11,277,682 B2 | 3/2022 | Usher |
| 11,277,700 B2 | 3/2022 | Goldstein |
| 11,294,619 B2 | 4/2022 | Usher et al. |
| 11,383,158 B2 | 7/2022 | Bonanno |
| 11,393,486 B1 | 7/2022 | Woodruff et al. |
| 11,610,587 B2 | 3/2023 | Goldstein et al. |
| 11,659,315 B2 | 5/2023 | Perez et al. |
| 11,665,493 B2 | 5/2023 | Usher et al. |
| 11,710,473 B2 | 7/2023 | Goldstein et al. |
| 11,750,965 B2 | 9/2023 | Usher et al. |
| 2001/0041559 A1 | 11/2001 | Salabaschew |
| 2001/0046304 A1 | 11/2001 | Rast |
| 2002/0003889 A1 | 1/2002 | Fischer |
| 2002/0009203 A1 | 1/2002 | Erten |
| 2002/0018798 A1 | 2/2002 | Sewing et al. |
| 2002/0026311 A1 | 2/2002 | Okitsu |
| 2002/0057817 A1 | 5/2002 | Darbut |
| 2002/0069056 A1 | 6/2002 | Nofsinger |
| 2002/0076057 A1 | 6/2002 | Voix |
| 2002/0076059 A1 | 6/2002 | Joynes |
| 2002/0085690 A1 | 7/2002 | Davidson et al. |
| 2002/0098878 A1 | 7/2002 | Mooney et al. |
| 2002/0106091 A1 | 8/2002 | Furst et al. |
| 2002/0111798 A1 | 8/2002 | Huang |
| 2002/0116541 A1 | 8/2002 | Parker et al. |
| 2002/0118798 A1 | 8/2002 | Langhart et al. |
| 2002/0123893 A1 | 9/2002 | Woodward |
| 2002/0133513 A1 | 9/2002 | Townsend et al. |
| 2002/0141599 A1 | 10/2002 | Trajkovic et al. |
| 2002/0141602 A1 | 10/2002 | Nemirovski |
| 2002/0143534 A1 | 10/2002 | Hol |
| 2002/0165719 A1 | 11/2002 | Wang et al. |
| 2002/0169596 A1 | 11/2002 | Brill et al. |
| 2002/0169615 A1 | 11/2002 | Kruger et al. |
| 2002/0191799 A1 | 12/2002 | Nordqvist et al. |
| 2002/0191952 A1 | 12/2002 | Fiore et al. |
| 2002/0193130 A1 | 12/2002 | Yang |
| 2003/0008633 A1 | 1/2003 | Bartosik |
| 2003/0026438 A1 | 2/2003 | Ray et al. |
| 2003/0032447 A1 | 2/2003 | Bulthuis |
| 2003/0033152 A1 | 2/2003 | Cameron |
| 2003/0035551 A1 | 2/2003 | Ligh |
| 2003/0048882 A1 | 3/2003 | Smith |
| 2003/0050777 A1 | 3/2003 | Walker |
| 2003/0055627 A1 | 3/2003 | Balan et al. |
| 2003/0061032 A1 | 3/2003 | Gonopolskiy |
| 2003/0065512 A1 | 4/2003 | Walker |
| 2003/0065620 A1 | 4/2003 | Gailey et al. |
| 2003/0069002 A1 | 4/2003 | Hunter et al. |
| 2003/0083879 A1 | 5/2003 | Cyr et al. |
| 2003/0083883 A1 | 5/2003 | Cyr et al. |
| 2003/0110040 A1 | 6/2003 | Holland et al. |
| 2003/0130016 A1 | 7/2003 | Matsuura |
| 2003/0138061 A1* | 7/2003 | Li .................... H04L 7/0278 375/326 |
| 2003/0138118 A1 | 7/2003 | Stahl |
| 2003/0152359 A1 | 8/2003 | Kim |
| 2003/0156725 A1 | 8/2003 | Boone et al. |
| 2003/0161097 A1 | 8/2003 | Le et al. |
| 2003/0165246 A1 | 9/2003 | Kvaloy et al. |
| 2003/0165319 A1 | 9/2003 | Barber et al. |
| 2003/0198357 A1 | 10/2003 | Schneider et al. |
| 2003/0198359 A1 | 10/2003 | Killion et al. |
| 2003/0200096 A1 | 10/2003 | Asai |
| 2003/0228019 A1 | 12/2003 | Eichler et al. |
| 2003/0228023 A1 | 12/2003 | Burnett et al. |
| 2004/0008850 A1 | 1/2004 | Gustavsson |
| 2004/0019482 A1 | 1/2004 | Holub |
| 2004/0042103 A1 | 3/2004 | Mayer |
| 2004/0044520 A1 | 3/2004 | Chen |
| 2004/0047474 A1 | 3/2004 | Vries et al. |
| 2004/0047486 A1 | 3/2004 | Van et al. |
| 2004/0049385 A1 | 3/2004 | Lovance et al. |
| 2004/0086138 A1 | 5/2004 | Kuth |
| 2004/0088162 A1 | 5/2004 | He et al. |
| 2004/0109579 A1 | 6/2004 | Izuchi et al. |
| 2004/0109668 A1 | 6/2004 | Stuckman |
| 2004/0125965 A1 | 7/2004 | Alberth et al. |
| 2004/0128136 A1 | 7/2004 | Irani |
| 2004/0133421 A1 | 7/2004 | Burnett |
| 2004/0150717 A1 | 8/2004 | Page et al. |
| 2004/0160573 A1 | 8/2004 | Jannard et al. |
| 2004/0165742 A1 | 8/2004 | Shennib et al. |
| 2004/0175005 A1 | 9/2004 | Roeck |
| 2004/0179694 A1 | 9/2004 | Alley |
| 2004/0185804 A1 | 9/2004 | Kanamori et al. |
| 2004/0190737 A1 | 9/2004 | Kuhnel et al. |
| 2004/0196992 A1 | 10/2004 | Ryan |
| 2004/0202333 A1 | 10/2004 | Csermak et al. |
| 2004/0202339 A1 | 10/2004 | O'Brien et al. |
| 2004/0202340 A1 | 10/2004 | Armstrong et al. |
| 2004/0203351 A1 | 10/2004 | Shearer et al. |
| 2004/0252852 A1 | 12/2004 | Taenzer |
| 2004/0258263 A1 | 12/2004 | Saxton et al. |
| 2004/0264938 A1 | 12/2004 | Felder |
| 2005/0008167 A1 | 1/2005 | Gleissner et al. |
| 2005/0028212 A1 | 2/2005 | Laronne et al. |
| 2005/0033384 A1 | 2/2005 | Sacha |
| 2005/0033571 A1 | 2/2005 | Huang et al. |
| 2005/0047611 A1 | 3/2005 | Mao |
| 2005/0049854 A1 | 3/2005 | Reding et al. |
| 2005/0058300 A1 | 3/2005 | Suzuki et al. |
| 2005/0058313 A1 | 3/2005 | Victorian |
| 2005/0060142 A1 | 3/2005 | Msser et al. |
| 2005/0068171 A1 | 3/2005 | Kelliher et al. |
| 2005/0070337 A1 | 3/2005 | Byford et al. |
| 2005/0071158 A1 | 3/2005 | Byford |
| 2005/0071626 A1 | 3/2005 | Bear et al. |
| 2005/0077102 A1 | 4/2005 | Banter et al. |
| 2005/0078838 A1 | 4/2005 | Simon |
| 2005/0078842 A1 | 4/2005 | Vonlanthen et al. |
| 2005/0090295 A1 | 4/2005 | Ali et al. |
| 2005/0096764 A1 | 5/2005 | Weiser |
| 2005/0096899 A1 | 5/2005 | Padhi et al. |
| 2005/0102142 A1 | 5/2005 | Soufflet et al. |
| 2005/0114124 A1 | 5/2005 | Liu et al. |
| 2005/0123146 A1 | 6/2005 | Voix et al. |
| 2005/0134710 A1 | 6/2005 | Nomura et al. |
| 2005/0157891 A1 | 7/2005 | Johansen |
| 2005/0163289 A1 | 7/2005 | Caspi et al. |
| 2005/0175194 A1 | 8/2005 | Anderson |
| 2005/0182620 A1 | 8/2005 | Kabi et al. |
| 2005/0207605 A1 | 9/2005 | Dehe |
| 2005/0215907 A1 | 9/2005 | Toda et al. |
| 2005/0216531 A1 | 9/2005 | Blandford |
| 2005/0222820 A1 | 10/2005 | Chung |
| 2005/0227674 A1 | 10/2005 | Kopra |
| 2005/0254640 A1 | 11/2005 | Ohki et al. |
| 2005/0254676 A1 | 11/2005 | Rass et al. |
| 2005/0258942 A1 | 11/2005 | Manasseh et al. |
| 2005/0260978 A1 | 11/2005 | Rader et al. |
| 2005/0264425 A1 | 12/2005 | Sato et al. |
| 2005/0276420 A1 | 12/2005 | Davis |
| 2005/0281422 A1 | 12/2005 | Armstrong |
| 2005/0281423 A1 | 12/2005 | Armstrong |
| 2005/0283369 A1 | 12/2005 | Clauser et al. |
| 2005/0288057 A1 | 12/2005 | Lai et al. |
| 2006/0013410 A1 | 1/2006 | Wurtz |
| 2006/0018496 A1 | 1/2006 | Niederdrank et al. |
| 2006/0020451 A1 | 1/2006 | Kushner |
| 2006/0053007 A1 | 3/2006 | Niemisto |
| 2006/0064037 A1 | 3/2006 | Shalon et al. |
| 2006/0067551 A1 | 3/2006 | Cartwright et al. |
| 2006/0074895 A1 | 4/2006 | Belknap |
| 2006/0083387 A1 | 4/2006 | Emoto |
| 2006/0083388 A1 | 4/2006 | Rothschild |
| 2006/0083390 A1 | 4/2006 | Kaderavek et al. |

(56) References Cited

U.S. PATENT DOCUMENTS

| | | |
|---|---|---|
| 2006/0083395 A1 | 4/2006 | Allen et al. |
| 2006/0088176 A1 | 4/2006 | Werner, Jr. |
| 2006/0092043 A1 | 5/2006 | Lagassey |
| 2006/0095199 A1 | 5/2006 | Lagassey |
| 2006/0116175 A1 | 6/2006 | Chu |
| 2006/0116877 A1 | 6/2006 | Pickering et al. |
| 2006/0120545 A1 | 6/2006 | Rasmussen |
| 2006/0126821 A1 | 6/2006 | Sahashi |
| 2006/0126865 A1 | 6/2006 | Blamey et al. |
| 2006/0140425 A1 | 6/2006 | Berg et al. |
| 2006/0147063 A1 | 7/2006 | Chen |
| 2006/0153394 A1 | 7/2006 | Beasley |
| 2006/0154642 A1 | 7/2006 | Scannell, Jr. |
| 2006/0167687 A1 | 7/2006 | Kates |
| 2006/0173563 A1 | 8/2006 | Borovitski |
| 2006/0182287 A1 | 8/2006 | Schulein |
| 2006/0182295 A1 | 8/2006 | Dijkstra et al. |
| 2006/0184983 A1 | 8/2006 | Casey |
| 2006/0188075 A1 | 8/2006 | Peterson |
| 2006/0188105 A1 | 8/2006 | Baskerville et al. |
| 2006/0195322 A1 | 8/2006 | Broussard et al. |
| 2006/0204014 A1 | 9/2006 | Iseberg et al. |
| 2006/0223547 A1 | 10/2006 | Chin et al. |
| 2006/0233413 A1 | 10/2006 | Nam |
| 2006/0241948 A1 | 10/2006 | Abrash et al. |
| 2006/0258325 A1 | 11/2006 | Tsutaichi et al. |
| 2006/0262935 A1 | 11/2006 | Goose et al. |
| 2006/0262938 A1 | 11/2006 | Gauger et al. |
| 2006/0262944 A1 | 11/2006 | Rasmussen et al. |
| 2006/0264176 A1 | 11/2006 | Hong |
| 2006/0274166 A1 | 12/2006 | Lee et al. |
| 2006/0285709 A1 | 12/2006 | Barthel |
| 2006/0287014 A1 | 12/2006 | Matsuura |
| 2007/0003090 A1 | 1/2007 | Anderson |
| 2007/0009122 A1 | 1/2007 | Hamacher |
| 2007/0009127 A1 | 1/2007 | Klemenz et al. |
| 2007/0014423 A1 | 1/2007 | Darbut et al. |
| 2007/0019817 A1 | 1/2007 | Siltmann |
| 2007/0021148 A1 | 1/2007 | Mahini |
| 2007/0021958 A1 | 1/2007 | Msser et al. |
| 2007/0027676 A1 | 2/2007 | Chambers et al. |
| 2007/0036377 A1 | 2/2007 | Stirnemann |
| 2007/0041589 A1 | 2/2007 | Patel et al. |
| 2007/0043563 A1 | 2/2007 | Comerford et al. |
| 2007/0076896 A1 | 4/2007 | Hosaka et al. |
| 2007/0086600 A1 | 4/2007 | Boesen |
| 2007/0092087 A1 | 4/2007 | Bothra |
| 2007/0100637 A1 | 5/2007 | McCune |
| 2007/0127660 A1 | 6/2007 | Roberts et al. |
| 2007/0143820 A1 | 6/2007 | Pawlowski |
| 2007/0147635 A1 | 6/2007 | Dijkstra et al. |
| 2007/0160243 A1 | 7/2007 | Dijkstra |
| 2007/0172087 A1 | 7/2007 | Olsen |
| 2007/0177743 A1 | 8/2007 | Mertens |
| 2007/0185601 A1 | 8/2007 | Lee et al. |
| 2007/0189544 A1 | 8/2007 | Rosenberg |
| 2007/0194893 A1 | 8/2007 | Deyoe |
| 2007/0201705 A1 | 8/2007 | Dorogusker et al. |
| 2007/0206825 A1 | 9/2007 | Thomasson |
| 2007/0206826 A1 | 9/2007 | Gerhard |
| 2007/0223717 A1 | 9/2007 | Boersma |
| 2007/0225035 A1 | 9/2007 | Gauger et al. |
| 2007/0230734 A1 | 10/2007 | Beard |
| 2007/0233487 A1 | 10/2007 | Cohen et al. |
| 2007/0239294 A1 | 10/2007 | Brueckner et al. |
| 2007/0253569 A1 | 11/2007 | Bose |
| 2007/0255435 A1 | 11/2007 | Cohen et al. |
| 2007/0260460 A1 | 11/2007 | Hyatt |
| 2007/0274531 A1 | 11/2007 | Camp |
| 2007/0276657 A1 | 11/2007 | Gournay |
| 2007/0281744 A1 | 12/2007 | Andreasson |
| 2007/0291953 A1 | 12/2007 | Ngia et al. |
| 2008/0037801 A1 | 2/2008 | Alves et al. |
| 2008/0063228 A1 | 3/2008 | Mejia |
| 2008/0069369 A1 | 3/2008 | Dyer |
| 2008/0079571 A1 | 4/2008 | Samadani |
| 2008/0089530 A1 | 4/2008 | Bostick et al. |
| 2008/0091421 A1 | 4/2008 | Gustavsson |
| 2008/0101638 A1 | 5/2008 | Ziller |
| 2008/0107282 A1 | 5/2008 | Asada |
| 2008/0107297 A1 | 5/2008 | Fischer et al. |
| 2008/0123866 A1 | 5/2008 | Rule et al. |
| 2008/0129520 A1 | 6/2008 | Lee |
| 2008/0130908 A1 | 6/2008 | Cohen |
| 2008/0137873 A1 | 6/2008 | Goldstein |
| 2008/0145032 A1 | 6/2008 | Lindroos et al. |
| 2008/0152167 A1 | 6/2008 | Taenzer |
| 2008/0152169 A1 | 6/2008 | Asada et al. |
| 2008/0159547 A1 | 7/2008 | Schuler |
| 2008/0162133 A1 | 7/2008 | Couper et al. |
| 2008/0165988 A1 | 7/2008 | Terlizzi et al. |
| 2008/0175411 A1 | 7/2008 | Greve |
| 2008/0181419 A1 | 7/2008 | Goldstein et al. |
| 2008/0201138 A1 | 8/2008 | Msser et al. |
| 2008/0221880 A1 | 9/2008 | Cerra et al. |
| 2008/0240458 A1 | 10/2008 | Goldstein et al. |
| 2008/0257047 A1 | 10/2008 | Pelecanos et al. |
| 2008/0260180 A1 | 10/2008 | Goldstein et al. |
| 2008/0269926 A1 | 10/2008 | Xiang et al. |
| 2009/0010456 A1 | 1/2009 | Goldstein et al. |
| 2009/0016501 A1 | 1/2009 | May et al. |
| 2009/0016541 A1 | 1/2009 | Goldstein et al. |
| 2009/0024234 A1 | 1/2009 | Archibald |
| 2009/0034748 A1 | 2/2009 | Sibbald |
| 2009/0034765 A1* | 2/2009 | Boillot .................... H04R 25/02 |
| | | 381/59 |
| 2009/0046867 A1 | 2/2009 | Clemow |
| 2009/0067661 A1 | 3/2009 | Keady et al. |
| 2009/0071487 A1 | 3/2009 | Keady |
| 2009/0076821 A1 | 3/2009 | Brenner |
| 2009/0085873 A1 | 4/2009 | Betts et al. |
| 2009/0087003 A1 | 4/2009 | Zurek et al. |
| 2009/0122996 A1 | 5/2009 | Klein et al. |
| 2009/0175474 A1 | 7/2009 | Salvetti et al. |
| 2009/0180631 A1 | 7/2009 | Michael et al. |
| 2009/0192688 A1 | 7/2009 | Padmanabhan et al. |
| 2009/0227888 A1 | 9/2009 | Salmi et al. |
| 2009/0238386 A1 | 9/2009 | Usher et al. |
| 2009/0274314 A1 | 11/2009 | Arndt et al. |
| 2009/0286515 A1 | 11/2009 | Othmer |
| 2010/0061564 A1 | 3/2010 | Clemow et al. |
| 2010/0086139 A1 | 4/2010 | Nicolino, Jr. |
| 2010/0086141 A1 | 4/2010 | Nicolino, Jr. |
| 2010/0119077 A1 | 5/2010 | Platz et al. |
| 2010/0150367 A1 | 6/2010 | Mizuno |
| 2010/0166203 A1 | 7/2010 | Peissig et al. |
| 2010/0223223 A1 | 9/2010 | Sandler et al. |
| 2010/0241256 A1 | 9/2010 | Goldstein et al. |
| 2010/0296668 A1 | 11/2010 | Lee et al. |
| 2010/0316033 A1 | 12/2010 | Atwal |
| 2010/0328224 A1 | 12/2010 | Kerr et al. |
| 2011/0026724 A1 | 2/2011 | Doclo |
| 2011/0055256 A1 | 3/2011 | Phillips |
| 2011/0079227 A1 | 4/2011 | Turcot et al. |
| 2011/0096939 A1 | 4/2011 | Ichimura |
| 2011/0116643 A1 | 5/2011 | Tiscareno et al. |
| 2011/0125063 A1 | 5/2011 | Shalon et al. |
| 2011/0135120 A1 | 6/2011 | Larsen et al. |
| 2011/0187640 A1 | 8/2011 | Jacobsen et al. |
| 2011/0264447 A1 | 10/2011 | Msser et al. |
| 2011/0288860 A1 | 11/2011 | Schevciw et al. |
| 2011/0293103 A1 | 12/2011 | Park et al. |
| 2011/0299695 A1 | 12/2011 | Nicholson |
| 2012/0076317 A1 | 3/2012 | Fratti et al. |
| 2012/0123772 A1 | 5/2012 | Thyssen |
| 2012/0170412 A1 | 7/2012 | Calhoun |
| 2013/0056295 A1 | 3/2013 | Campbell et al. |
| 2013/0098706 A1 | 4/2013 | Keady |
| 2013/0136285 A1 | 5/2013 | Naumann |
| 2013/0149192 A1 | 6/2013 | Keady |
| 2013/0170660 A1 | 7/2013 | Kristensen |
| 2013/0188796 A1 | 7/2013 | Kristensen |
| 2013/0219345 A1 | 8/2013 | Saukko et al. |
| 2013/0251172 A1 | 9/2013 | Mosseri |

(56) References Cited

U.S. PATENT DOCUMENTS

| | | | |
|---|---|---|---|
| 2013/0297305 A1 | 11/2013 | Turnbull | |
| 2013/0329912 A1 | 12/2013 | Krishnaswamy | |
| 2014/0003644 A1 | 1/2014 | Keady et al. | |
| 2014/0010378 A1 | 1/2014 | Voix et al. | |
| 2014/0023203 A1 | 1/2014 | Rothschild | |
| 2014/0026665 A1 | 1/2014 | Keady | |
| 2014/0072165 A1 | 3/2014 | Gebert et al. | |
| 2014/0089672 A1 | 3/2014 | Luna et al. | |
| 2014/0122092 A1 | 5/2014 | Goldstein | |
| 2014/0126748 A1 | 5/2014 | Usher et al. | |
| 2014/0148101 A1 | 5/2014 | Seshadri et al. | |
| 2014/0163976 A1 | 6/2014 | Park et al. | |
| 2014/0166122 A1 | 6/2014 | Goldstein et al. | |
| 2014/0205123 A1 | 7/2014 | Lafort et al. | |
| 2014/0229170 A1 | 8/2014 | Atti | |
| 2014/0238774 A1 | 8/2014 | Blendinger | |
| 2014/0270200 A1 | 9/2014 | Usher et al. | |
| 2014/0278383 A1* | 9/2014 | Fan | G10K 11/002 704/224 |
| 2014/0373854 A1 | 12/2014 | Keady | |
| 2015/0032446 A1* | 1/2015 | Dickins | G10L 25/84 704/233 |
| 2015/0150728 A1 | 6/2015 | Duvall | |
| 2015/0170645 A1 | 6/2015 | Di et al. | |
| 2015/0195641 A1 | 7/2015 | Di et al. | |
| 2015/0215701 A1 | 7/2015 | Usher | |
| 2015/0358730 A1 | 12/2015 | Kirsch et al. | |
| 2016/0012714 A1 | 1/2016 | Patenaude et al. | |
| 2016/0015568 A1 | 1/2016 | Keady | |
| 2016/0019024 A1 | 1/2016 | Suzuki et al. | |
| 2016/0049915 A1 | 2/2016 | Wang | |
| 2016/0050483 A1 | 2/2016 | Kulavik et al. | |
| 2016/0057551 A1 | 2/2016 | Higgins et al. | |
| 2016/0058378 A1 | 3/2016 | Wisby et al. | |
| 2016/0078879 A1 | 3/2016 | Lu | |
| 2016/0104452 A1 | 4/2016 | Guan et al. | |
| 2016/0127818 A1 | 5/2016 | Ambrose | |
| 2016/0165361 A1 | 6/2016 | Miller et al. | |
| 2016/0192077 A1 | 6/2016 | Keady | |
| 2016/0232920 A1* | 8/2016 | Matheja | G10L 25/78 |
| 2016/0249128 A1 | 8/2016 | Goldstein | |
| 2016/0269817 A1 | 9/2016 | Basseas et al. | |
| 2016/0277854 A1 | 9/2016 | Puria et al. | |
| 2016/0295311 A1 | 10/2016 | Keady et al. | |
| 2017/0134865 A1 | 5/2017 | Goldstein et al. | |
| 2017/0142511 A1 | 5/2017 | Dennis | |
| 2017/0223451 A1 | 8/2017 | Kirsch et al. | |
| 2018/0054668 A1 | 2/2018 | Keady | |
| 2018/0115818 A1 | 4/2018 | Asada et al. | |
| 2018/0122400 A1 | 5/2018 | Rasmussen | |
| 2018/0132048 A1 | 5/2018 | Usher et al. | |
| 2018/0160211 A1 | 6/2018 | Kirsch et al. | |
| 2018/0220239 A1 | 8/2018 | Keady et al. | |
| 2018/0233125 A1 | 8/2018 | Mitchell et al. | |
| 2019/0038224 A1 | 2/2019 | Zhang et al. | |
| 2019/0082272 A9 | 3/2019 | Goldstein et al. | |
| 2019/0387305 A1 | 12/2019 | Keady | |
| 2020/0379717 A1 | 12/2020 | Mazur et al. | |
| 2020/0380945 A1 | 12/2020 | Woodruff et al. | |
| 2021/0014597 A1 | 1/2021 | Andersen et al. | |
| 2021/0152924 A1 | 5/2021 | Keady | |
| 2022/0061767 A1 | 3/2022 | Goldstein et al. | |

FOREIGN PATENT DOCUMENTS

| | | |
|---|---|---|
| CA | 2215764 A1 | 11/1996 |
| CA | 2448669 A1 | 12/2002 |
| DE | 4312155 A1 | 10/1994 |
| DE | 102012221233 A1 | 3/2014 |
| DE | 102013203334 B3 | 5/2014 |
| EP | 0495653 A1 | 7/1992 |
| EP | 0643881 A1 | 3/1995 |
| EP | 0692169 A1 | 1/1996 |
| EP | 0935236 A1 | 8/1999 |
| EP | 1033063 B1 | 5/2003 |
| EP | 1320281 A2 | 6/2003 |
| EP | 1385324 | 1/2004 |
| EP | 1385324 A1 | 1/2004 |
| EP | 1401240 | 3/2004 |
| EP | 1415505 A1 | 5/2004 |
| EP | 1483591 A2 | 12/2004 |
| EP | 1489596 A1 | 12/2004 |
| EP | 1519625 A2 | 3/2005 |
| EP | 1570244 A1 | 9/2005 |
| EP | 1594344 A2 | 11/2005 |
| EP | 1638079 A2 | 3/2006 |
| EP | 1640972 | 3/2006 |
| EP | 1640972 A1 | 3/2006 |
| EP | 1674061 A1 | 6/2006 |
| EP | 1681903 A2 | 7/2006 |
| EP | 1800950 A2 | 6/2007 |
| EP | 1841283 A2 | 10/2007 |
| EP | 1322268 B1 | 1/2009 |
| EP | 1313417 B1 | 2/2009 |
| EP | 1313418 B1 | 3/2009 |
| EP | 2146519 | 6/2012 |
| EP | 2749043 A1 | 7/2014 |
| EP | 2884763 | 6/2015 |
| EP | 2991381 A1 | 3/2016 |
| EP | 3068142 A1 | 9/2016 |
| FR | 2560520 A1 | 9/1985 |
| GB | 1518299 A | 7/1978 |
| GB | 2082820 A | 3/1982 |
| GB | 2155276 A | 9/1985 |
| GB | 2441835 A | 3/2008 |
| JP | 02-097362 A | 4/1990 |
| JP | 05-145623 A | 6/1993 |
| JP | 05-199590 A | 8/1993 |
| JP | 05-336599 A | 12/1993 |
| JP | H0877468 | 3/1996 |
| JP | H10162283 | 6/1998 |
| JP | 10-294989 A | 11/1998 |
| JP | 11-331990 A | 11/1999 |
| JP | 3353701 | 11/1999 |
| JP | 3085237 B2 | 9/2000 |
| JP | 2001-045585 A | 2/2001 |
| JP | 2001-054184 A | 2/2001 |
| JP | 2002-204500 A | 7/2002 |
| JP | 2003-304599 A | 10/2003 |
| JP | 3556987 B2 | 8/2004 |
| JP | 2004-289762 A | 10/2004 |
| JP | 2005-064744 A | 3/2005 |
| JP | 2005-130205 A | 5/2005 |
| JP | 2005-168888 A | 6/2005 |
| JP | 2005-227511 A | 8/2005 |
| JP | 2005-260944 A | 9/2005 |
| JP | 2005-295175 A | 10/2005 |
| JP | 2006-107044 A | 4/2006 |
| JP | 2009-003040 A | 1/2009 |
| JP | 2017-147677 A | 8/2017 |
| KR | 10-2002-0086433 A | 11/2002 |
| KR | 10-0366231 B1 | 12/2002 |
| KR | 10-2003-0013732 A | 2/2003 |
| KR | 10-2003-0058432 A | 7/2003 |
| KR | 10-2003-0068021 A | 8/2003 |
| KR | 10-2003-0069471 A | 8/2003 |
| KR | 10-0607492 B1 | 8/2006 |
| KR | 10-0783099 B1 | 12/2007 |
| KR | 10-1154948 B1 | 6/2012 |
| KR | 10-1194923 B1 | 10/2012 |
| TW | 200615862 A | 5/2006 |
| WO | 86/00133 A1 | 1/1986 |
| WO | 93/26084 A1 | 12/1993 |
| WO | WO9326085 | 12/1993 |
| WO | 94/23520 A1 | 10/1994 |
| WO | 97/25790 A2 | 7/1997 |
| WO | 98/54878 A1 | 12/1998 |
| WO | 99/43185 A1 | 8/1999 |
| WO | 01/01731 A1 | 1/2001 |
| WO | 01/57852 A1 | 8/2001 |
| WO | 01/89083 A1 | 11/2001 |
| WO | 02/13522 A2 | 2/2002 |
| WO | 02/17835 A1 | 3/2002 |

(56)　　　　References Cited

FOREIGN PATENT DOCUMENTS

| WO | 02/17836 | A1 | 3/2002 |
|----|----------|-----|--------|
| WO | 02/93891 | A1 | 11/2002 |
| WO | 2002/101720 | A1 | 12/2002 |
| WO | 03/23766 | A2 | 3/2003 |
| WO | 03/73790 | A1 | 9/2003 |
| WO | 03/96031 | A2 | 11/2003 |
| WO | 2004/016037 | A1 | 2/2004 |
| WO | 2004/053435 | A1 | 6/2004 |
| WO | 2004114722 | | 12/2004 |
| WO | 2005/029468 | A1 | 3/2005 |
| WO | 2005/073875 | A1 | 8/2005 |
| WO | 2005/107320 | A1 | 11/2005 |
| WO | 2006/026812 | A2 | 3/2006 |
| WO | 2006/034029 | A2 | 3/2006 |
| WO | 2006/036262 | A2 | 4/2006 |
| WO | 2006/037156 | A1 | 4/2006 |
| WO | 2006/054205 | A1 | 5/2006 |
| WO | 2006054698 | | 5/2006 |
| WO | 2006/074082 | A1 | 7/2006 |
| WO | 2006/097099 | A1 | 9/2006 |
| WO | 2006/114101 | A1 | 11/2006 |
| WO | 2007/007916 | A1 | 1/2007 |
| WO | 2007/017809 | A1 | 2/2007 |
| WO | 2007/017810 | A2 | 2/2007 |
| WO | 2007/028250 | A2 | 3/2007 |
| WO | 2007/073818 | A1 | 7/2007 |
| WO | 2007/082579 | A2 | 7/2007 |
| WO | 2007092660 | | 8/2007 |
| WO | 2007/112838 | A1 | 10/2007 |
| WO | 2007/147077 | A2 | 12/2007 |
| WO | 2008/017326 | A1 | 2/2008 |
| WO | 2008050583 | | 5/2008 |
| WO | 2008/067454 | A2 | 6/2008 |
| WO | 2008/096125 | A2 | 8/2008 |
| WO | 2009/023633 | A1 | 2/2009 |
| WO | 2009023784 | | 2/2009 |
| WO | 2009/097009 | A1 | 8/2009 |
| WO | 2011/110901 | A1 | 9/2011 |
| WO | 2011/161487 | A1 | 12/2011 |
| WO | 2012097150 | | 7/2012 |

OTHER PUBLICATIONS

*Samsung Electronics Co., Ltd., and Samsung Electronics, America, Inc., v. Staton Techiya, LLC*, IPR2022-00242, Dec. 23, 2021.
*Samsung Electronics Co., Ltd., and Samsung Electronics, America, Inc., v. Staton Techiya, LLC*, IPR2022-00243, Dec. 23, 2021.
*Samsung Electronics Co., Ltd., and Samsung Electronics, America, Inc., v. Staton Techiya, LLC*, IPR2022-00234, Dec. 21, 2021.
*Samsung Electronics Co., Ltd., and Samsung Electronics, America, Inc., v. Staton Techiya, LLC*, IPR2022-00253, Jan. 18, 2022.
*Samsung Electronics Co., Ltd., and Samsung Electronics, America, Inc., v. Staton Techiya, LLC*, IPR2022-00324, Jan. 13, 2022.
*Samsung Electronics Co., Ltd., and Samsung Electronics, America, Inc., v. Staton Techiya, LLC*, IPR2022-00281, Jan. 18, 2022.
*Samsung Electronics Co., Ltd., and Samsung Electronics, America, Inc., v. Staton Techiya, LLC*, IPR2022-00302, Jan. 13, 2022.
*Samsung Electronics Co., Ltd., and Samsung Electronics, America, Inc., v. Staton Techiya, LLC*, IPR2022-00369, Feb. 18, 2022.
*Samsung Electronics Co., Ltd., and Samsung Electronics, America, Inc., v. Staton Techiya, LLC*, IPR2022-00388, Feb. 18, 2022.
*Samsung Electronics Co., Ltd., and Samsung Electronics, America, Inc., v. Staton Techiya, LLC*, IPR2022-00410, Feb. 18, 2022.
*Samsung Electronics Co., Ltd., and Samsung Electronics, America, Inc., v. Staton Techiya, LLC*, IPR2022-01078, Jun. 9, 2022.
*Samsung Electronics Co., Ltd., and Samsung Electronics, America, Inc., v. Staton Techiya, LLC*, IPR2022-01099, Jun. 9, 2022.
*Samsung Electronics Co., Ltd., and Samsung Electronics, America, Inc., v. Staton Techiya, LLC*, IPR2022-01106, Jun. 9, 2022.
*Samsung Electronics Co., Ltd., and Samsung Electronics, America, Inc., v. Staton Techiya, LLC*, IPR2022-01098, Jun. 9, 2022.

U.S. Appl. No. 90/015,146, Samsung Electronics Co., Ltd. and Samsung Electronics, America, Inc., Request for Ex Parte Reexamination of U.S. Pat. No. 10,979,836.
'400 Patent Family Tree, Exhibit—1009, Filed on Dec. 10, 2021—Cited in IPR2022-00282, challenging U.S. Pat. No. 8,315,400.
Nov. 3, 2022 [16] Notice of Deposition of David Kleinschmidt, Exhibit—16, Filed on Nov. 3, 2022—Cited in IPR2022-00282, challenging U.S. Pat. No. 8,315,400.
Aarts, Exhibit—1015, Filed on Jan. 14, 2022—Cited in IPR2022-00410, challenging U.S. Pat. No. 10,979,836.
Adaptive Filtering (Dentino), Exhibit—1012, Filed on Dec. 10, 2021—Cited in IPR2022-00282, challenging U.S. Pat. No. 8,315,400.
Adaptive Filtering Algorithims (Diniz), Exhibit—1013, Filed on Dec. 10, 2021—Cited in IPR2022-00282, challenging U.S. Pat. No. 8,315,400.
Adaptive Noise Cancelling (Widrow), Exhibit—1011, Filed on Dec. 10, 2021—Cited in IPR2022-00282, challenging U.S. Pat. No. 8,315,400.
AirPods (1st generation)—Technical Specifications, Exhibit—2009, Filed on Sep. 13, 2022—Cited in IPR2022-00243, challenging U.S. Pat. No. 8,111,839.
Amended Complaint, *Techiya v. Samsung, E.D. Tex.*, Exhibit—1014, Filed on Jan. 14, 2022—Cited in IPR2022-00410, challenging U.S. Pat. No. 10,979,836.
Amended Complaint, *Techiya v. Samsung, E.D. Tex.*, Exhibit—1014, Filed on Dec. 21, 2021—Cited in IPR2022-00302, challenging U.S. Pat. No. 9,609,424.
Amended Complaint, *Techiya v. Samsung, E.D. Tex.*, Exhibit—1017, Filed on Jan. 4, 2022—Cited in IPR2022-00388, challenging U.S. Pat. No. 10,966,015.
Amended Complaint, *Techiya v. Samsung, E.D. Tex.*, Exhibit—1017, Filed on Dec. 30, 2021—Cited in IPR2022-00369, challenging U.S. Pat. No. 10,405,082.
Amended Docket Control Order, DN 156 from E.D. Tex. 21-cv-00413, Exhibit—1029, Filed on Nov. 15, 2022—Cited in IPR2022-01098, challenging U.S. Pat. No. 11,217,237.
Amended Docket Control Order, DN 156 from E.D. Tex., Exhibit—1023, Filed on Nov. 10, 2022—Cited in IPR2022-01099, challenging U.S. Pat. No. 11,244,666.
Amended Docket Control Order, DN 156 from E.D. Tex., Exhibit—1026, Filed on Nov. 10, 2022—Cited in IPR2022-01078, challenging U.S. Pat. No. 11,057,701.
Amended Docket Control Order, DN 156 from E.D. Tex., Exhibit—1032, Filed on Nov. 10, 2022—Cited in IPR2022-01106, challenging U.S. Pat. No. 11,039,259.
Amended Notice of Deposition of Les E. Atlas, Ph.D., Exhibit—15, Filed on Mar. 14, 2023—Cited in IPR2022-01106, challenging U.S. Pat. No. 11,039,259.
Amendment in U.S. Appl. No. 11/616,973, dated Apr. 13, 2015, Exhibit—2009, Filed on Oct. 11, 2022—Cited in IPR2022-01106, challenging U.S. Pat. No. 11,039,259.
Anderson Declaration ISO MSJ of No Infringement of '259 Patent, Exhibit—2019, Filed on Aug. 14, 2023—Cited in IPR2022-01106, challenging U.S. Pat. No. 11,039,259.
Anderson Non-Infringement Report (excerpt, redacted), Exhibit—2020, Filed on Aug. 14, 2023—Cited in IPR2022-01106, challenging U.S. Pat. No. 11,039,259.
Anderson Rebuttal Report (Redacted, Excerpt), Exhibit—2017, Filed on Apr. 10, 2023—Cited in IPR2022-01106, challenging U.S. Pat. No. 11,039,259.
Android Central, The History of True Wireless Earbuds, Exhibit—2009, Filed on Oct. 17, 2022—Cited in IPR2022-00324, challenging U.S. Pat. No. 8,254,591.
Android Central, The History of True Wireless Earbuds, Exhibit—2011, Filed on Sep. 13, 2022—Cited in IPR2022-00243, challenging U.S. Pat. No. 8,111,839.
C.V. of Richard Stern, Ph.D., Exhibit—1003, Filed on Jan. 4, 2022—Cited in IPR2022-00388, challenging U.S. Pat. No. 10,966,015.
C.V. of Richard Stern, Ph.D., Exhibit—1003, Filed on Dec. 10, 2021—Cited in IPR2022-00282, challenging U.S. Pat. No. 8,315,400.
CDC, What Noises Cause Hearing Loss?, Exhibit—2009, Filed on Sep. 13, 2022—Cited in IPR2022-00242, challenging U. S. Patent No. 8,111,839.

(56) References Cited

OTHER PUBLICATIONS

Christopher J. Struck CV, Exhibit—2002, Filed on Apr. 13, 2022—Cited in IPR2022-00302, challenging U.S. Pat. No. 9,609,424.

Claim Construction Order, Exhibit—2008, Filed on Feb. 22, 2023—Cited in IPR2022-00253, challenging U.S. Pat. No. 9,491,542.

Claim Construction Order, Exhibit—2008, Filed on Apr. 18, 2023—Cited in IPR2022-00281, challenging U.S. Pat. No. 9,270,244.

Claim Construction Order, Exhibit—2013, Filed on Apr. 10, 2023—Cited in IPR2022-01106, challenging U.S. Pat. No. 11,039,259.

Complaint, DN 1 from E.D. Tex. 21-cv-00413, Exhibit—1022, Filed on Nov. 10, 2022—Cited in IPR2022-01099, challenging U.S. Pat. No. 11,244,666.

Complaint, DN 1 from E.D. Tex. 21-cv-00413, Exhibit—1025, Filed on Nov. 10, 2022—Cited in IPR2022-01078, challenging U.S. Pat. No. 11,057,701.

Complaint, DN 1 from E.D. Tex. 21-cv-00413, Exhibit—1028, Filed on Nov. 15, 2022—Cited in IPR2022-01098, challenging U.S. Pat. No. 11,217,237.

Complaint, DN 1 from E.D. Tex. 21-cv-00413, Exhibit—1031, Filed on Nov. 10, 2022—Cited in IPR2022-01106, challenging U.S. Pat. No. 11,039,259.

Complaint, E.D. Tex. 22-53, Exhibit—1020, Filed on Jun. 14, 2022—Cited in IPR2022-00369, challenging U.S. Pat. No. 10,405,082.

Complaint, E.D. Tex. 22-53, Exhibit—1020, Filed on Jun. 14, 2022—Cited in IPR2022-00388, challenging U.S. Pat. No. 10,966,015.

Complaint, E.D. Tex. 22-53, Exhibit—1021, Filed on Jun. 14, 2022—Cited in IPR2022-00410, challenging U.S. Pat. No. 10,979,836.

Complaint, E.D. Tex., 22-cv-53, Exhibit—1024, Filed on May 10, 2022—Cited in IPR2022-00302, challenging U.S. Pat. No. 9,609,424.

Complaint, E.D. Tex., 22-cv-53, Exhibit—1032, Filed on May 11, 2022—Cited in IPR2022-00324, challenging U.S. Pat. No. 8,254,591.

Complaint, *Techiya* v. *Samsung, E.D. Tex.*, Exhibit—1008, Filed on Jan. 14, 2022—Cited in IPR2022-00410, challenging U.S. Pat. No. 10,979,836.

Complaint, *Techiya* v. *Samsung, E.D. Tex.*, Exhibit—1008, Filed on Dec. 21, 2021—Cited in IPR2022-00302, challenging U.S. Pat. No. 9,609,424.

Consolidation Order, E.D. Tex. 21-413 & 22-53, Exhibit—1021, Filed on Jun. 14, 2022—Cited in IPR2022-00369, challenging U.S. Pat. No. 10,405,082.

Consolidation Order, E.D. Tex. 21-413 & 22-53, Exhibit—1021, Filed on Jun. 14, 2022—Cited in IPR2022-00388, challenging U.S. Pat. No. 10,966,015.

Consolidation Order, E.D. Tex. 21-413 & 22-53, Exhibit—1022, Filed on Jun. 14, 2022—Cited in IPR2022-00410, challenging U.S. Pat. No. 10,979,836.

Consolidation Order, E.D. Tex., Exhibit—1025, Filed on May 10, 2022—Cited in IPR2022-00302, challenging U.S. Pat. No. 9,609,424.

Consolidation Order, E.D. Tex., Exhibit—1033, Filed on May 11, 2022—Cited in IPR2022-00324, challenging U.S. Pat. No. 8,254,591.

Corrected Declaration of Richard Stern, Ph.D., Exhibit—1002, Filed on Jan. 4, 2022—Cited in IPR2022-00388, challenging U.S. Pat. No. 10,966,015.

Corrected Declaration of Richard Stern, Ph.D., Exhibit—1002, Filed on Dec. 10, 2021—Cited in IPR2022-00282, challenging U.S. Pat. No. 8,315,400.

Corrected Petition for Inter Partes Review of U.S. Pat. No. 8,111,839, Exhibit—11, Filed on Feb. 3, 2022—Cited in IPR2022-00243, challenging U.S. Pat. No. 8,111,839.

Corrected Petition for Inter Partes Review of U.S. Pat. No. 8,111,839, Exhibit—12, Filed on Feb. 3, 2022—Cited in IPR2022-00242, challenging U.S. Pat. No. 8,111,839.

Corrected Petition for IPR of U.S. Pat. No. 8,315,400, Exhibit—4, Filed on Dec. 10, 2021—Cited in IPR2022-00282, challenging U.S. Pat. No. 8,315,400.

Curriculum Vitae of Christopher J. Struck, Exhibit—2002, Filed on Oct. 7, 2022—Cited in IPR2022-01078, challenging U.S. Pat. No. 11,057,701.

Curriculum Vitae of Christopher J. Struck, Exhibit—2002, Filed on Oct. 7, 2022—Cited in IPR2022-01098, challenging U.S. Pat. No. 11,217,237.

Curriculum Vitae of David Kleinschmidt, Exhibit—2002, Filed on Oct. 11, 2022—Cited in IPR2022-01106, challenging U.S. Pat. No. 11,039,259.

Curriculum Vitae of David Kleinschmidt, Exhibit—2002, Filed on Oct. 7, 2022—Cited in IPR2022-01099, challenging U.S. Pat. No. 11,244,666.

CV for Marshall Buck, Ph.D., Exhibit—2002, Filed on May 18, 2022—Cited in IPR2022-00369, challenging U.S. Pat. No. 10,405,082.

CV of Chris Kyriakakis, Ph.D., Exhibit—1003, Filed on Dec. 21, 2021—Cited in IPR2022-00302, challenging U.S. Pat. No. 9,609,424.

CV of Christopher J. Struck, Exhibit—2002, Filed on May 18, 2022—Cited in IPR2022-00410, challenging U.S. Pat. No. 10,979,836.

CV of Daniel P. Anagnos, Exhibit—2002, Filed on Mar. 23, 2022—Cited in IPR2022-00242, challenging U.S. Pat. No. 8,111,839.

CV of Daniel P. Anagnos, Exhibit—2002, Filed on Mar. 23, 2022—Cited in IPR2022-00243, challenging U.S. Pat. No. 8,111,839.

CV of Daniel P. Anagnos; Exhibit—2002, Filed on Mar. 21, 2022—Cited in IPR2022-00234, challenging U.S. Pat. No. 9124982.

CV of Dr. Chris Kyriakakis, Exhibit—1003, Filed on Jan. 14, 2022—Cited in IPR2022-00410, challenging U.S. Pat. No. 10,979,836.

CV of Les E. Atlas, Ph.D., Exhibit—1003, Filed on Dec. 20, 2021—Cited in IPR2022-00324, challenging U.S. Pat. No. 8,254,591.

CV of Les E. Atlas, Ph.D., Exhibit—1004, Filed on Dec. 13, 2021—Cited in IPR2022-00242, challenging U.S. Pat. No. 8,111,839.

CV of Les E. Atlas, Ph.D., Exhibit—1004, Filed on Dec. 13, 2021—Cited in IPR2022-00243, challenging U.S. Pat. No. 8,111,839.

CV of Marshall Buck, Ph.D., Exhibit—2002, Filed on May 18, 2022—Cited in IPR2022-00388, challenging U.S. Pat. No. 10,966,015.

CV of Nathaniel Polish, Ph.D., Exhibit—1003, Filed on Dec. 17, 2021—Cited in IPR2022-00253, challenging U.S. Pat. No. 9,491,542.

CV of Nathaniel Polish, Ph.D., Exhibit—1003, Filed on Dec. 21, 2021—Cited in IPR2022-00281, challenging U.S. Pat. No. 9,270,244.

CV of of Les E. Atlas, Ph.D.; Exhibit—1003, Filed on Dec. 13, 2021—Cited in IPR2022-00234, challenging U.S. Pat. No. 9124982.

CV of Richard Stern, Ph.D., Exhibit—1003, Filed on Dec. 30, 2021—Cited in IPR2022-00369, challenging U.S. Pat. No. 10,405,082.

Daniel P. Anagnos CV, Exhibit—2002, Filed on Apr. 13, 2022—Cited in IPR2022-00324, challenging U.S. Pat. No. 8,254,591.

David Kleinschmidt CV, Exhibit—2002, Filed on Mar. 21, 2022—Cited in IPR2022-00282, challenging U.S. Pat. No. 8,315,400.

David Kleinschmidt CV, Exhibit—2002, Filed on Apr. 18, 2022—Cited in IPR2022-00253, challenging U.S. Pat. No. 9,491,542.

David Kleinschmidt CV, Exhibit—2002, Filed on Apr. 18, 2022—Cited in IPR2022-00281, challenging U.S. Pat. No. 9,270,244.

Decision Denying Institution of Inter Partes Review 35 U.S.C. § 314, Exhibit—10, Filed on Jan. 3, 2023—Cited in IPR2022-01099, challenging U.S. Pat. No. 11,244,666.

Decision Denying Institution of Inter Partes Review 35 U.S.C. § 314, Exhibit—11, Filed on Jan. 3, 2023—Cited in IPR2022-01098, challenging U.S. Pat. No. 11,217,237.

Decision Granting Institution of Inter Partes Review 35 U.S.C. sec 314, Exhibit—10, Filed on Dec. 29, 2022—Cited in IPR2022-01078, challenging U.S. Pat. No. 11,057,701.

Declaration of Chris Kyriakakis, Ph.D., Exhibit—1002, Filed on Dec. 21, 2021—Cited in IPR2022-00302, challenging U.S. Pat. No. 9,609,424.

Declaration of Christopher J. Struck in Support of Patent Owner's Preliminary Response, Exhibit—2001, Filed on Oct. 7, 2022—Cited in IPR2022-01078, challenging U.S. Pat. No. 11,057,701.

Declaration of Christopher J. Struck in Support of Patent Owner's Preliminary Response, Exhibit—2001, Filed on Oct. 7, 2022—Cited in IPR2022-01098, challenging U.S. Pat. No. 11,217,237.

Declaration of Christopher J. Struck in Support of Patent Owner's Preliminary Response, Exhibit—2001, Filed on Apr. 13, 2022—Cited in IPR2022-00302, challenging U.S. Pat. No. 9,609,424.

Declaration of Christopher J. Struck in Support of Patent Owner's Preliminary Response, Exhibit—2001, Filed on May 18, 2022—Cited in IPR2022-00410, challenging U.S. Pat. No. 10,979,836.

(56) References Cited

OTHER PUBLICATIONS

Declaration of Christopher J. Struck in Support of Patent Owner's Response, Exhibit—2006, Filed on Oct. 17, 2022—Cited in IPR2022-00302, challenging U.S. Pat. No. 9,609,424.

Declaration of Christopher Struck in Support of POR, Exhibit—2013, Filed on Mar. 23, 2023—Cited in IPR2022-01078, challenging U.S. Pat. No. 11,057,701.

Declaration of Daniel P. Anagnos in Support of Patent Owner Response; Exhibit—2006, Filed on Sep. 9, 2022—Cited in IPR2022-00234, challenging U.S. Pat. No. 9124982.

Declaration of Daniel P. Anagnos in Support of Patent Owner's Preliminary Response, Exhibit—2001, Filed on Apr. 13, 2022—Cited in IPR2022-00324, challenging U.S. Pat. No. 8,254,591.

Declaration of Daniel P. Anagnos in Support of Patent Owner's Response, Exhibit—2006, Filed on Oct. 17, 2022—Cited in IPR2022-00324, challenging U.S. Pat. No. 8,254,591.

Declaration of Daniel P. Anagnos in Support of Patent Owner's Response, Exhibit—2006, Filed on Sep. 13, 2022—Cited in IPR2022-00242, challenging U.S. Pat. No. 8,111,839.

Declaration of Daniel P. Anagnos in Support of Patent Owner's Response, Exhibit—2006, Filed on Sep. 13, 2022—Cited in IPR2022-00243, challenging U.S. Pat. No. 8,111,839.

Declaration of Daniel P. Anagnos, Exhibit—2001, Filed on Mar. 23, 2022—Cited in IPR2022-00242, challenging U.S. Pat. No. 8,111,839.

Declaration of Daniel P. Anagnos, Exhibit—2001, Filed on Mar. 23, 2022—Cited in IPR2022-00243, challenging U.S. Pat. No. 8,111,839.

Declaration of Daniel P. Anagnos; Exhibit—2001, Filed on Mar. 21, 2022—Cited in IPR2022-00234, challenging U.S. Pat. No. 9124982.

Declaration of David Kleinschmidt in Support of Patent Owner's Preliminary Response, Exhibit—2001, Filed on Oct. 11, 2022—Cited in IPR2022-01106, challenging U.S. Pat. No. 11,039,259.

Declaration of David Kleinschmidt in Support of Patent Owner's Preliminary Response, Exhibit—2001, Filed on Oct. 7, 2022—Cited in IPR2022-01099, challenging U.S. Pat. No. 11,244,666.

Declaration of David Kleinschmidt in Support of Patent Owner's Preliminary Response, Exhibit—2001, Filed on Mar. 21, 2022—Cited in IPR2022-00282, challenging U.S. Pat. No. 8,315,400.

Declaration of David Kleinschmidt in Support of Patent Owner's Preliminary Response, Exhibit—2001, Filed on Apr. 18, 2022—Cited in IPR2022-00253, challenging U.S. Pat. No. 9,491,542.

Declaration of David Kleinschmidt in Support of Patent Owner's Preliminary Response, Exhibit—2001, Filed on Apr. 18, 2022—Cited in IPR2022-00281, challenging U.S. Pat. No. 9,270,244.

Declaration of David Kleinschmidt in Support of Patent Owner's Response, Exhibit—2006, Filed on Oct. 19, 2022—Cited in IPR2022-00253, challenging U.S. Pat. No. 9,491,542.

Declaration of David Kleinschmidt in Support of Patent Owner's Response, Exhibit—2006, Filed on Oct. 19, 2022—Cited in IPR2022-00281, challenging U.S. Pat. No. 9,270,244.

Declaration of David Kleinschmidt in Support of Patent Owner's Response, Exhibit—2009, Filed on Sep. 9, 2022—Cited in IPR2022-00282, challenging U.S. Pat. No. 8,315,400.

Declaration of Dr. Chris Kyriakakis, Exhibit—1002, Filed on Jan. 14, 2022—Cited in IPR2022-00410, challenging U.S. Pat. No. 10,979,836.

Declaration of Dr. David Anderson Regarding Claim Construction dated Oct. 21, 2022, Exhibit—2011, Filed on Nov. 8, 2022—Cited in IPR2022-00388, challenging U.S. Pat. No. 10,966,015.

Declaration of Dr. Eric Tarr, Exhibit—2001, Filed on Dec. 6, 2024—Cited in IPR2024-00559, challenging U.S. Pat. No. 11,610,587.

Declaration of Les E. Atlas, Ph.D., Exhibit—1002, Filed on Dec. 13, 2021—Cited in IPR2022-00242, challenging U.S. Pat. No. 8,111,839.

Declaration of Les E. Atlas, Ph.D., Exhibit—1002, Filed on Dec. 20, 2021—Cited in IPR2022-00324, challenging U.S. Pat. No. 8,254,591.

Declaration of Les E. Atlas, Ph.D., Exhibit—1003, Filed on Dec. 13, 2021—Cited in IPR2022-00243, challenging U.S. Pat. No. 8,111,839.

Declaration of Les E. Atlas, Ph.D.; Exhibit—1002, Filed on Dec. 13, 2021—Cited in IPR2022-00234, challenging U.S. Pat. No. 9124982.

Declaration of Marshall Buck in Support of Patent Owner's Preliminary Response, Exhibit—2001, Filed on May 18, 2022—Cited in IPR2022-00369, challenging U.S. Pat. No. 10,405,082.

Declaration of Marshall Buck in Support of Patent Owner's Preliminary Response, Exhibit—2001, Filed on May 18, 2022—Cited in IPR2022-00388, challenging U.S. Pat. No. 10,966,015.

Declaration of Marshall D. Buck, Ph.D. in Support of Patent Owner Response, Exhibit—2008, Filed on Nov. 8, 2022—Cited in IPR2022-00369, challenging U.S. Pat. No. 10,405,082.

Declaration of Marshall D. Buck, Ph.D. in Support of Patent Owner's Response, Exhibit—2008, Filed on Nov. 8, 2022—Cited in IPR2022-00388, challenging U.S. Pat. No. 10,966,015.

Declaration of Nathaniel Polish, Ph.D., Exhibit—1002, Filed on Dec. 17, 2021—Cited in IPR2022-00253, challenging U.S. Pat. No. 9,491,542.

Declaration of Nathaniel Polish, Ph.D., Exhibit—1002, Filed on Dec. 21, 2021—Cited in IPR2022-00281, challenging U.S. Pat. No. 9,270,244.

Declaration of Richard Stern, Ph.D., Exhibit—1002, Filed on Dec. 10, 2021—Cited in IPR2022-00282, challenging U.S. Pat. No. 8,315,400.

Declaration of Richard Stern, Ph.D., Exhibit—1002, Filed on Dec 30, 2021—Cited in IPR2022-00369, challenging U.S. Pat. No. 10,405,082.

Declaration of Roy Falik In Support of Motion for the Pro Hac Vice Admission, Exhibit—2001, Filed on Jul. 5, 2024—Cited in IPR2024-01003, challenging U.S. Pat. No. 9,191,083.

Declaration of Roy Falik In Support of Motion for the Pro Hac Vice Admission, Exhibit—2001, Filed on Jul. 5, 2024—Cited in IPR2024-01004, challenging U.S. Pat. No. 9,614,943.

Declaration of Roy Falik In Support of Motion for the Pro Hac Vice AdmissionExhibit2001,Jul. 5, 2024—Cited in IPR2024-01033, challenging U.S. Pat. No. 8,434,966.

Declaration of Roy Falik, Exhibit—2001, Filed on Jul. 18, 2024—Cited in IPR2024-01031, challenging U.S. Pat. No. 7,049,850.

Declaration of Roy Falik, Exhibit—2001, Filed on Jul. 18, 2024—Cited in IPR2024-01034, challenging U.S. Pat. No. 9,279,263.

Declaration of Scott Delman with attached exhibit, Exhibit—1024, Filed on Dec. 21, 2021—Cited in IPR2022-00281, challenging U.S. Pat. No. 9,270,244.

Deposition Transcript of David Kleinschmidt, dated Jun. 9, 2023, Exhibit—1034, Filed on Jun. 30, 2023—Cited in IPR2022-01106, challenging U.S. Pat. No. 11,039,259.

Determining All Challenged Claims Unpatentable 35 U.S.C. § 318(a), Exhibit—31, Filed on Aug. 11, 2023—Cited in IPR2022-00388, challenging U.S. Pat. No. 10,966,015.

Determining All Challenged Claims Unpatentable 35 U.S.C. § 318(a), Exhibit—32, Filed on Aug. 11, 2023—Cited in IPR2022-00369, challenging U.S. Pat. No. 10,405,082.

Determining All Challenged Claims Unpatentable 35 U.S.C. § 318(a), Exhibit—26, Filed on Nov. 13, 2023—Cited in IPR2022-01078, challenging U.S. Pat. No. 11,057,701.

Determining Some Challenged Claims Unpatentable 35 U.S.C. § 318(a), Exhibit—37, Filed on Jul. 7, 2023—Cited in IPR2022-00302, challenging U.S. Pat. No. 9,609,424.

Docket Control Order, E.D. Tex., Exhibit—1014, Filed on Apr. 20, 2022—Cited in IPR2022-00282, challenging U.S. Pat. No. 8,315,400.

Docket Control Order, E.D. Tex., Exhibit—1043, Filed on Apr. 20, 2022—Cited in IPR2022-00242, challenging U.S. Pat. No. 8,111,839.

Docket Control Order, E.D. Tex., Exhibit—1043, Filed on Apr. 20, 2022—Cited in IPR2022-00243, challenging U.S. Pat. No. 8,111,839.

Docket Control Order, E.D. Tex.; Exhibit—1033, Filed on Apr. 20, 2022—Cited in IPR2022-00234, challenging U.S. Pat. No. 9124982.

Edwards, The Future of Hearing Aid Technology, Exhibit—2008, Filed on Sep. 13, 2022—Cited in IPR2022-00243, challenging U.S. Pat. No. 8,111,839.

EX 1032—Protective Order (*Staton Techiya, LLC* v. *Samsung Electronics Co., Ltd*, 21-CV-00413-JRG-RSP), Exhibit—1032, Filed on Apr. 13, 2023—Cited in IPR2022-00302, challenging U.S. Pat. No. 9,609,424.

Ex 1045—Nov. 18, 2022, Deposition Transcript of Daniel P Anagnos, Exhibit—1045, Filed on Dec. 6, 2022—Cited in IPR2022-00242, challenging U.S. Pat. No. 8,111,839.

(56) References Cited

OTHER PUBLICATIONS

Ex 1045—Nov. 18, 2022, Deposition Transcript of Daniel P Anagnos, Exhibit—1045, Filed on Dec. 6, 2022—Cited in IPR2022-00243, challenging U.S. Pat. No. 8,111,839.

Ex 1046—Patent Owner's Response in IPR2022-00243, Paper 21, Exhibit—1046, Filed on Dec. 6, 2022—Cited in IPR2022-00242, challenging U.S. Pat. No. 8,111,839.

Ex 1047—Patent Owner Response for IPR2022-00234, Paper 17, Exhibit—1047, Filed on Dec. 6, 2022—Cited in IPR2022-00242, challenging U.S. Pat. No. 8,111,839.

Ex 1047—Patent Owner Response for IPR2022-00234, Paper 17, Exhibit—1047, Filed on Dec. 6, 2022—Cited in IPR2022-00243, challenging U.S. Pat. No. 8,111,839.

Ex 1048—Institution Decision for IPR2022-00234, Paper 12, Exhibit—1048, Filed on Dec. 6, 2022—Cited in IPR2022-00242, challenging U.S. Pat. No. 8,111,839.

Ex 1049—File History for 382 Patent, Exhibit—1049, Filed on Dec. 6, 2022—Cited in IPR2022-00242, challenging U.S. Pat. No. 8,111,839.

Ex 1053—Excerpts from The Authoritative Dictionary of IEEE Standards Terms, Exhibit—1053, Filed on Dec. 6, 2022—Cited in IPR2022-00242, challenging U.S. Pat. No. 8,111,839.

Ex 1054—Supplemental Declaration of Les E Atlas PhD (Atlas-Supp), Exhibit—1054, Filed on Dec. 6, 2022—Cited in IPR2022-00243, challenging U.S. Pat. No. 8,111,839.

Ex. 1002—Declaration of Dr. Les Atlas, Ph.D., Exhibit—1002, Filed on Jun. 9, 2022—Cited in IPR2022-01106, challenging U.S. Pat. No. 11,039,259.

Ex. 1002—Declaration of Nathaniel Polish, Ph.D., Exhibit—1002, Filed on Jun. 9, 2022—Cited in IPR2022-01098, challenging U.S. Pat. No. 11,217,237.

Ex. 1002—Declaration of Nathaniel Polish, Ph.D., Exhibit—1002, Filed on Jun. 9, 2022—Cited in IPR2022-01099, challenging U.S. Pat. No. 11,244,666.

Ex. 1002—Kyriakakis DeclarationExhibit1002,Jun. 18, 2024—Cited in IPR2024-01033, challenging U.S. Pat. No. 8,434,966.

Ex. 1002 Declaration of Chris Kyriakakis, Exhibit—1002, Filed on Jul. 1, 2024—Cited in IPR2024-01034, challenging U.S. Pat. No. 9,279,263.

Ex. 1002 Declaration of Dr. Richard M. Stern, Exhibit—1002, Filed on Jun. 9, 2022—Cited in IPR2022-01078, challenging U.S. Pat. No. 11,057,701.

Ex. 1003—CV of Dr. Les Atlas, Ph.D., Exhibit—1003, Filed on Jun. 9, 2022—Cited in IPR2022-01106, challenging U.S. Pat. No. 11,039,259.

Ex. 1003—CV of Nathaniel Polish, Ph.D., Exhibit—1003, Filed on Jun. 9, 2022—Cited in IPR2022-01098, challenging U.S. Pat. No. 11,217,237.

Ex. 1003—CV of Nathaniel Polish, Ph.D., Exhibit—1003, Filed on Jun. 9, 2022—Cited in IPR2022-01099, challenging U.S. Pat. No. 11,244,666.

Ex. 1003—Kyriakakis CVExhibit1003,Jun. 18, 2024—Cited in IPR2024-01033, challenging U.S. Pat. No. 8,434,966.

Ex. 1003 Chris Kyriakakis CV, Exhibit—1003, Filed on Jul. 1, 2024—Cited in IPR2024-01034, challenging U.S. Pat. No. 9,279,263.

Ex. 1003 CV of Dr. Richard M. Stern, Exhibit—1003, Filed on Jun. 9, 2022—Cited in IPR2022-01078, challenging U.S. Pat. No. 11,057,701.

Ex. 1004—U.S. Appl. No. 16/571,973 File History for 259, Exhibit—1004, Filed on Jun. 9, 2022—Cited in IPR2022-01106, challenging U.S. Pat. No. 11,039,259.

Ex. 1004—File History for U.S. Pat. No. 11,750,965Exhibit1004,Jun. 18, 2024—Cited in IPR2024-01034, challenging U.S. Pat. No. 8,434,966.

Ex. 1004—File History of U.S. Appl. No. 11/217,237, Exhibit—1004, Filed on Jun. 9, 2022—Cited in IPR2022-01098, challenging U.S. Pat. No. 11,217,237.

Ex. 1004—File History of U.S. Appl. No. 11/244,666, Exhibit—1004, Filed on Jun. 9, 2022—Cited in IPR2022-01099, challenging U.S. Pat. No. 11,244,666.

Ex. 1004 File History for U.S. Pat. No. 11,665,493, Exhibit—1004, Filed on Jul. 1, 2024—Cited in IPR2024-01034, challenging U.S. Pat. No. 9,279,263.

Ex. 1004 File History of U.S. Pat. No. 11,057,701, Exhibit—1004, Filed on Jun. 9, 2022—Cited in IPR2022-01078, challenging U.S. Pat. No. 11,057,701.

Ex. 1005—13_917,079 File History part 1 of 2, Exhibit—1005, Filed on Jun. 9, 2022—Cited in IPR2022-01106, challenging U.S. Pat. No. 11,039,259.

Ex. 1005—13_917,079 File History part 2 of 2, Exhibit—1005, Filed on Jun. 9, 2022—Cited in IPR2022-01106, challenging U.S. Pat. No. 11,039,259.

Ex. 1005 U.S. Appl. No. 61/098,250, Exhibit—1005, Filed on Jul. 1, 2024—Cited in IPR2024-01034, challenging U.S. Pat. No. 9,279,263.

Ex. 1006—U.S. Appl. No. 12/555,570 File History, Exhibit—1006, Filed on Jun. 9, 2022—Cited in IPR2022-01106, challenging U.S. Pat. No. 11,039,259.

Ex. 1006 U.S. Appl. No. 12/115,349 File History, Exhibit—1006, Filed on Jun. 9, 2022—Cited in IPR2022-01078, challenging U.S. Pat. No. 11,057,701.

Ex. 1006 Publication of U.S. Appl. No. 12/555,864, Exhibit—1006, Filed on Jul. 1, 2024—Cited in IPR2024-01034, challenging U.S. Pat. No. 9,279,263.

Ex. 1007—U.S. Appl. No. 61/096,128 File History, Exhibit—1007, Filed on Jun. 9, 2022—Cited in IPR2022-01106, challenging U.S. Pat. No. 11,039,259.

Ex. 1007 U.S. Appl. No. 60/916,271 File History, Exhibit—1007, Filed on Jun. 9, 2022—Cited in IPR2022-01078, challenging U.S. Pat. No. 11,057,701.

Ex. 1008—JP3353701B2 to Kondo with Translation, Exhibit—1008, Filed on Jun. 9, 2022—Cited in IPR2022-01098, challenging U.S. Pat. No. 11,217,237.

Ex. 1009 Translation of JPA 2002-204500 (Hayashi), Exhibit—1009, Filed on Jul. 1, 2024—Cited in IPR2024-01034, challenging U.S. Pat. No. 9,279,263.

Ex. 1010—Redline—965 versus parentExhibit1010,Jun. 18, 2024—Cited in IPR2024-01033, challenging U.S. Pat. No. 8,434,966.

Ex. 1012—U.S. Appl. No. 60/893,617Exhibit1012,Jun. 18, 2024—Cited in IPR2024-01033, challenging U.S. Pat. No. 8,434,966.

Ex. 1013—150139_14109987 NOA referred to in 965 NOAExhibit1013,Jun. 18, 2024—Cited in IPR2024-01033, challenging U.S. Pat. No. 8,434,966.

Ex. 1013 Deterministic Broad-Band Signal (Chu), Exhibit—1013, Filed on Jul. 1, 2024—Cited in IPR2024-01034, challenging U.S. Pat. No. 9,279,263.

Ex. 1013 IPR2022-00282 Patent Owner Preliminary Response, Exhibit—1013, Filed on Jun. 9, 2022—Cited in IPR2022-01078, challenging U.S. Pat. No. 11,057,701.

Ex. 1014—Mulgrew 2002, Exhibit—1014, Filed on Jun. 9, 2022—Cited in IPR2022-01099, challenging U.S. Pat. No. 11,244,666.

Ex. 1014—Redline—682 parent versus ultimate parent 812Exhibit1014,Jun. 18, 2024—Cited in IPR2024-01033, challenging U.S. Pat. No. 8,434,966.

Ex. 1014 701 Patent Family Tree, Exhibit—1014, Filed on Jun. 9, 2022—Cited in IPR2022-01078, challenging U.S. Pat. No. 11,057,701.

Ex. 1015—666 Family Tree, Exhibit—1015, Filed on Jun. 9, 2022—Cited in IPR2022-01099, challenging U.S. Pat. No. 11,244,666.

Ex. 1015—Letter re 965 IPR StipulationExhibit1015,Jun. 18, 2024—Cited in IPR2024-01033, challenging U.S. Pat. No. 8,434,966.

Ex. 1015 Complaint, E.D. Tex. 22-53, Exhibit—1015, Filed on Jun. 9, 2022—Cited in IPR2022-01078, challenging U.S. Pat. No. 11,057,701.

Ex. 1016—Complaint, E.D. Tex., 22-53, Exhibit—1016, Filed on Jun. 9, 2022—Cited in IPR2022-01099, challenging U.S. Pat. No. 11,244,666.

Ex. 1016 GSM 6.31, Exhibit—1016, Filed on Jun. 9, 2022—Cited in IPR2022-01078, challenging U.S. Pat. No. 11,057,701.

Ex. 1016 Reply Declaration of Richard Stern, PhD, Exhibit—1016, Filed on Dec. 2, 2022—Cited in IPR2022-00282, challenging U.S. Pat. No. 8,315,400.

Ex. 1017—Amended Complaint, E.D. Tex., 21-413, Exhibit—1017, Filed on Jun. 9, 2022—Cited in IPR2022-01099, challenging U.S. Pat. No. 11,244,666.

(56) References Cited

OTHER PUBLICATIONS

Ex. 1017—Rose 2003, Exhibit—1017, Filed on Jun. 9, 2022—Cited in IPR2022-01106, challenging U.S. Pat. No. 11,039,259.

Ex. 1017 David Kleinschmidt Depo Transcript, Exhibit—1017, Filed on Dec. 2, 2022—Cited in IPR2022-00282, challenging U.S. Pat. No. 8,315,400.

Ex. 1017 Final Rejection from Reexam 90/015,146, Exhibit—1017, Filed on Jul. 1, 2024—Cited in IPR2024-01034, challenging U.S. Pat. No. 9,279,263.

Ex. 1017 GSM 6.12, Exhibit—1017, Filed on Jun. 9, 2022—Cited in IPR2022-01078, challenging U.S. Pat. No. 11,057,701.

Ex. 1018—Confidential Settlement Agreement with Exhibits A-IExhibit1018, Dec. 11, 2024—Cited in IPR2024-01033, challenging U.S. Pat. No. 8,434,966. [Document not publicly available at PTAB].

Ex. 1018—Consolidation Order, E.D. Tex., 21-413 & 22-53, Exhibit—1018, Filed on Jun. 9, 2022—Cited in IPR2022-01099, challenging U.S. Pat. No. 11,244,666.

Ex. 1018 Consolidation Order, E.D. Tex. 21-413 & 22-53, Exhibit—1018, Filed on Jun. 9, 2022—Cited in IPR2022-01078, challenging U.S. Pat. No. 11,057,701.

Ex. 1018 Excerpts from Wiley Electrical & Electronics Engineering Dictionary, Exhibit—1018, Filed on Dec. 2, 2022—Cited in IPR2022-00282, challenging U.S. Pat. No. 8,315,400.

Ex. 1019—Docket Control Order, E.D. Tex., 21-413, Exhibit—1019, Filed on Jun. 9, 2022—Cited in IPR2022-01099, challenging U.S. Pat. No. 11,244,666.

Ex. 1019—Duffner 2006, Exhibit—1019, Filed on Jun. 9, 2022—Cited in IPR2022-01098, challenging U.S. Pat. No. 11,217,237.

Ex. 1019 Docket Control Order, E.D. Tex. 21-413, Exhibit—1019, Filed on Jun. 9, 2022—Cited in IPR2022-01078, challenging U.S. Pat. No. 11,057,701.

Ex. 1019 Dual-Channel MLS-Based Test System (Schneider), Exhibit—1019, Filed on Jul. 1, 2024—Cited in IPR2024-01034, challenging U.S. Pat. No. 9,279,263.

Ex. 1020—Letter re IPR Stipulation, Exhibit—1020, Filed on Jun. 9, 2022—Cited in IPR2022-01099, challenging U.S. Pat. No. 11,244,666.

Ex. 1020 Letter re IPR Stipulation, Exhibit—1020, Filed on Jun. 9, 2022—Cited in IPR2022-01078, challenging U.S. Pat. No. 11,057,701.

Ex. 1021—Complaint. E.D. Tex., 22-00053, Exhibit—1021, Filed on Jun. 9, 2022—Cited in IPR2022-01098, challenging U.S. Pat. No. 11,217,237.

Ex. 1021—Hsu 2005, Exhibit—1021, Filed on Jun. 9, 2022—Cited in IPR2022-01106, challenging U.S. Pat. No. 11,039,259.

Ex. 1021—Stipulation Letter, Exhibit—1021, Filed on May 20, 2022—Cited in IPR2022-00253, challenging U.S. Pat. No. 9,491,542.

Ex. 1021 Amended Complaint, E.D. Tex. 21-413, Exhibit—1021, Filed on Jun. 9, 2022—Cited in IPR2022-01078, challenging U.S. Pat. No. 11,057,701.

Ex. 1021 Claim Construction Order, ED Tex, Exhibit—1021, Filed on Jul. 1, 2024—Cited in IPR2024-01034, challenging U.S. Pat. No. 9,279,263.

Ex. 1022—Amended Complaint, E.D.Tex., 21-00413, Exhibit—1022, Filed on Jun. 9, 2022—Cited in IPR2022-01098, challenging U.S. Pat. No. 11,217,237.

Ex. 1022—Complaint, E.D. Tex., Exhibit—1022, Filed on May 20, 2022—Cited in IPR2022-00253, challenging U.S. Pat. No. 9,491,542.

Ex. 1022 Letter to Techiya re 493 IPR Stipulation, Exhibit—1022, Filed on Jul. 1, 2024—Cited in IPR2024-01034, challenging U.S. Pat. No. 9,279,263.

Ex. 1023—Consolidation Order, E.D. Tex., Exhibit—1023, Filed on May 20, 2022—Cited in IPR2022-00253, challenging U.S. Pat. No. 9,491,542.

Ex. 1023—Consolidation Order, E.D.Tex., 21-00413 & 22-00053, Exhibit—1023, Filed on Jun. 9, 2022—Cited in IPR2022-01098, challenging U.S. Pat. No. 11,217,237.

Ex. 1023 Techiya Appeal Brief from Reexam 90/015,146, Exhibit—1023, Filed on Jul. 1, 2024—Cited in IPR2024-01034, challenging U.S. Pat. No. 9,279,263.

Ex. 1024—259 Family Tree, Exhibit—1024, Filed on Jun. 9, 2022—Cited in IPR2022-01106, challenging U.S. Pat. No. 11,039,259.

Ex. 1024—Docket Control Order, E.D. Tex., 21-00413, Exhibit—1024, Filed on Jun. 9, 2022—Cited in IPR2022-01098, challenging U.S. Pat. No. 11,217,237.

Ex. 1024 Judicial Caseload Profile, Exhibit—1024, Filed on Jul. 1, 2024—Cited in IPR2024-01034, challenging U.S. Pat. No. 9,279,263.

Ex. 1025—Complaint, E.D. Tex. 22-53, Exhibit—1025, Filed on Jun. 9, 2022—Cited in IPR2022-01106, challenging U.S. Pat. No. 11,039,259.

Ex. 1025—Letter re IPR Stipulation, Exhibit—1025, Filed on Jun. 9, 2022—Cited in IPR2022-01098, challenging U.S. Pat. No. 11,217,237.

Ex. 1025—Stipulation Letter, Exhibit—1025, Filed on May 27, 2022—Cited in IPR2022-00281, challenging U.S. Pat. No. 9,270,244.

Ex. 1026—237 Family Tree, Exhibit—1026, Filed on Jun. 9, 2022—Cited in IPR2022-01098, challenging U.S. Pat. No. 11,217,237.

Ex. 1026—Amended Complaint, E.D. Tex. 21-413, Exhibit—1026, Filed on Jun. 9, 2022—Cited in IPR2022-01106, challenging U.S. Pat. No. 11,039,259.

Ex. 1026—Complaint, E.D. Tex., Exhibit—1026, Filed on May 27, 2022—Cited in IPR2022-00281, challenging U.S. Pat. No. 9,270,244.

Ex. 1026—Confidential Settlement Agreement, Exhibit—1026, Filed on Dec. 9, 2024—Cited in IPR2024-01034, challenging U.S. Pat. No. 9,279,263. [Document not publicly available at PTAB].

Ex. 1027—Confidential Settlement Agreement with Exhibits A-I, Exhibit—1027, Filed on Dec. 11, 2024—Cited in IPR2024-01034, challenging U.S. Pat. No. 9,279,263. [Document not publicly available at PTAB].

Ex. 1027—Consolidation Order, E.D. Tex., Exhibit—1027, Filed on May 27, 2022—Cited in IPR2022-00281, challenging U.S. Pat. No. 9,270,244.

Ex. 1027—Docket Control Order, E.D. Tex. 21-413, Exhibit—1027, Filed on Jun. 9, 2022—Cited in IPR2022-01106, challenging U.S. Pat. No. 11,039,259.

Ex. 1027—Transcript of Deposition of Christopher Struck, Exhibit—1027, Filed on Jan. 10, 2023—Cited in IPR2022-00302, challenging U.S. Pat. No. 9,609,424.

Ex. 1028—Consolidation Order, E.D. Tex. 21-413 & 22-53, Exhibit—1028, Filed on Jun. 9, 2022—Cited in IPR2022-01106, challenging U.S. Pat. No. 11,039,259.

Ex. 1028—Errata Sheet for Deposition of Christopher Struck, Exhibit—1028, Filed on Jan. 10, 2023—Cited in IPR2022-00302, challenging U.S. Pat. No. 9,609,424.

Ex. 1029—Letter re IPR Stipulation, Exhibit—1029, Filed on Jun. 9, 2022—Cited in IPR2022-01106, challenging U.S. Pat. No. 11,039,259.

Ex. 1029—Patent Owner's Opening Claim Construction Brief, E.D. Tex., Exhibit—1029, Filed on Jan. 10, 2023—Cited in IPR2022-00302, challenging U.S. Pat. No. 9,609,424.

Ex. 1029 Petitioners' Oral Hearing Demonstratives, Exhibit—1029, Filed on Sep. 26, 2023—Cited in IPR2022-01078, challenging U.S. Pat. No. 11,057,701.

Ex. 1030—Petitioners' Oral Hearing Demonstratives, Exhibit—1030, Filed on Apr. 11, 2023—Cited in IPR2022-00302, challenging U.S. Pat. No. 9,609,424.

Ex. 1033—Confidential Deposition of Christopher Struck, E.D. Tex., Exhibit—1033, Filed on May 15, 2023—Cited in IPR2022-00302, challenging U.S. Pat. No. 9,609,424. [Document not publicly available at PTAB].

Ex. 1034—Redacted Deposition of Christopher Struck, E.D. Tex., Exhibit—1034, Filed on May 15, 2023—Cited in IPR2022-00302, challenging U.S. Pat. No. 9,609,424.

Ex. 1037—Petitioners' Oral Hearing Demonstratives, Exhibit—1037, Filed on Oct. 11, 2023—Cited in IPR2022-01106, challenging U.S. Pat. No. 11,039,259.

Ex. 3001, Exhibit—3001, Filed on Nov. 8, 2024—Cited in IPR2024-01003, challenging U.S. Pat. No. 9,191,083.

Ex. 3001, Exhibit—3001, Filed on Nov. 8, 2024—Cited in IPR2024-01004, challenging U.S. Pat. No. 9,614,943.

Ex. 3001, Exhibit—3001, Filed on Nov. 8, 2024—Cited in IPR2024-01031, challenging U.S. Pat. No. 7,049,850.

(56) References Cited

OTHER PUBLICATIONS

Ex. 3001, Exhibit—3001, Filed on Nov. 8, 2024—Cited in IPR2024-01033, challenging U.S. Pat. No. 8,434,966.

Ex. 3001, Exhibit—3001, Filed on Nov. 8, 2024—Cited in IPR2024-01034, challenging U.S. Pat. No. 9,279,263.

Ex. 3001, Exhibit—3001, Filed on Apr. 6, 2023—Cited in IPR2022-00388, challenging U.S. Pat. No. 10,966,015.

EX1002—Declaration of Christopher Schmandt, Exhibit—1002, Filed on Feb. 9, 2024—Cited in IPR2024-00559, challenging U.S. Pat. No. 11,610,587.

EX1002—Declaration of Nathaniel Polish, Exhibit—1002, Filed on Jun. 25, 2024—Cited in IPR2024-01031, challenging U. S. Pat. No. 7,049,850.

EX1002—Kyriakakis Declaration, Exhibit—1002, Filed on Jun. 12, 2024—Cited in IPR2024-01003, challenging U.S. Pat. No. 9,191,083.

EX1002—Kyriakakis Declaration, Exhibit—1002, Filed on Jun. 12, 2024—Cited in IPR2024-01004, challenging U.S. Pat. No. 9,614,943.

EX1003—Nathaniel Polish CV, Exhibit—1003, Filed on Jun. 25, 2024—Cited in IPR2024-01031, challenging U.S. Pat. No. 7,049,850.

EX1003—Kyriakakis CV, Exhibit—1003, Filed on Jun. 12, 2024—Cited in IPR2024-01003, challenging U.S. Pat. No. 9,191,083.

EX1003—Kyriakakis CV, Exhibit—1003, Filed on Jun. 12, 2024—Cited in IPR2024-01004, challenging U.S. Pat. No. 9,614,943.

EX1003—Schmandt CV, Exhibit—1003, Filed on Feb. 9, 2024—Cited in IPR2024-00559, challenging U.S. Pat. No. 11,610,587.

EX1004—File History for U.S. Pat. No. 11,659,315—Part 1 of 2, Exhibit—1004, Filed on Jun. 25, 2024—Cited in IPR2024-01031, challenging U.S. Pat. No. 7,049,850.

EX1004—File History for U.S. Pat. No. 11,659,315—Part 2 of 2, Exhibit—1004, Filed on Jun. 25, 2024—Cited in IPR2024-01031, challenging U.S. Pat. No. 7,049,850.

EX1004—File History for U.S. Pat. No. 11,710,473_Part 1 of 3, Exhibit—1004, Filed on Jun. 12, 2024—Cited in IPR2024-01003, challenging U.S. Pat. No. 9,191,083.

EX1004—File History for U.S. Pat. No. 11,710,473_Part 1 of 3, Exhibit—1004, Filed on Jun. 12, 2024—Cited in IPR2024-01004, challenging U.S. Pat. No. 9,614,943.

EX1004—File History for U.S. Pat. No. 11,710,473_Part 2 of 3, Exhibit—1004, Filed on Jun. 12, 2024—Cited in IPR2024-01003, challenging U.S. Pat. No. 9,191,083.

EX1004—File History for U.S. Pat. No. 11,710,473_Part 2 of 3, Exhibit—1004, Filed on Jun. 12, 2024—Cited in IPR2024-01004, challenging U.S. Pat. No. 9,614,943.

EX1004—File History for U.S. Pat. No. 11,710,473_Part 3 of 3, Exhibit—1004, Filed on Jun. 12, 2024—Cited in IPR2024-01003, challenging U.S. Pat. No. 9,191,083.

EX1004—File History for U.S. Pat. No. 11,710,473_Part 3 of 3, Exhibit—1004, Filed on Jun. 12, 2024—Cited in IPR2024-01004, challenging U.S. Pat. No. 9,614,943.

EX1004—USFH11610587 Part 1 of 2, Exhibit—1004, Filed on Feb. 9, 2024—Cited in IPR2024-00559, challenging U.S. Pat. No. 11,610,587.

EX1004—USFH11610587 Part 2 of 2, Exhibit—1004, Filed on Feb. 9, 2024—Cited in IPR2024-00559, challenging U.S. Pat. No. 11,610,587.

EX1005—U.S. Appl. No. 60/885,917, Exhibit—1005, Filed on Jun. 12, 2024—Cited in IPR2024-01003, challenging U.S. Pat. No. 9,191,083.

EX1005—U.S. Appl. No. 60/885,917, Exhibit—1005, Filed on Jun. 12, 2024—Cited in IPR2024-01004, challenging U.S. Pat. No. 9,614,943.

EX1005—U.S. Appl. No. 61/737,932 Provisional, Exhibit—1005, Filed on Jun. 25, 2024—Cited in IPR2024-01031, challenging U.S. Pat. No. 7,049,850.

EX1005—U.S. Appl. No. 61/098,914 (Provisional Application), Exhibit—1005, Filed on Feb. 9, 2024—Cited in IPR2024-00559, challenging U.S. Pat. No. 11,610,587.

EX1006—U.S. Appl. No. 16/266,829 (829 App), Exhibit—1006, Filed on Jun. 25, 2024—Cited in IPR2024-01031, challenging U.S. Pat. No. 7,049,850.

EX1006—U.S. Appl. No. 17/321,892, Exhibit—1006, Filed on Jun. 12, 2024—Cited in IPR2024-01003, challenging U.S. Pat. No. 9,191,083.

EX1006—U.S. Appl. No. 17/321,892, Exhibit—1006, Filed on Jun. 12, 2024—Cited in IPR2024-01004, challenging U.S. Pat. No. 9,614,943.

EX1006—U.S. Appl. No. 17/203,731, Exhibit—1006, Filed on Feb. 9, 2024—Cited in IPR2024-00559, challenging U.S. Pat. No. 11,610,587.

EX1007—315 Patent Family Tree, Exhibit—1007, Filed on Jun. 25, 2024—Cited in IPR2024-01031, challenging U.S. Pat. No. 7,049,850.

EX1008—Docket Control Order, Exhibit—1008, Filed on Jun. 25, 2024—Cited in IPR2024-01031, challenging U.S. Pat. No. 7,049,850.

EX1008—File History for U.S. Pat. No. 11,244,666, Exhibit—1008, Filed on Jun. 12, 2024—Cited in IPR2024-01003, challenging U.S. Pat. No. 9,191,083.

EX1008—File History for U.S. Pat. No. 11,244,666, Exhibit—1008, Filed on Jun. 12, 2024—Cited in IPR2024-01004, challenging U.S. Pat. No. 9,614,943.

EX1009—Letter from Nikhil Krishnan to Thomas J. Friel, Jr., Exhibit—1009, Filed on Jun. 25, 2024—Cited in IPR2024-01031, challenging U.S. Pat. No. 7,049,850.

EX1009—U.S. Appl. No. 90/019,169 RE of U.S. Pat. No. 11,244,666_Part 1 of 5, Exhibit—1009, Filed on Jun. 12, 2024—Cited in IPR2024-01003, challenging U.S. Pat. No. 9,191,083.

EX1009—U.S. Appl. No. 90/019,169 RE of U.S. Pat. No. 11,244,666_Part 1 of 5, Exhibit—1009, Filed on Jun. 12, 2024—Cited in IPR2024-01004, challenging U.S. Pat. No. 9,614,943.

EX1009—U.S. Appl. No. 90/019,169 RE of U.S. Pat. No. 11,244,666_Part 2 of 5, Exhibit—1009, Filed on Jun. 12, 2024—Cited in IPR2024-01003, challenging U.S. Pat. No. 9,191,083.

EX1009—U.S. Appl. No. 90/019,169 RE of U.S. Pat. No. 11,244,666_Part 2 of 5, Exhibit—1009, Filed on Jun. 12, 2024—Cited in IPR2024-01004, challenging U.S. Pat. No. 9,614,943.

EX1009—U.S. Appl. No. 90/019,169 RE of U.S. Pat. No. 11,244,666_Part 3 of 5, Exhibit—1009, Filed on Jun. 12, 2024—Cited in IPR2024-01003, challenging U.S. Pat. No. 9,191,083.

EX1009—U.S. Appl. No. 90/019,169 RE of U.S. Pat. No. 11,244,666_Part 3 of 5, Exhibit—1009, Filed on Jun. 12, 2024—Cited in IPR2024-01004, challenging U.S. Pat. No. 9,614,943.

EX1009—U.S. Appl. No. 90/019,169 RE of U.S. Pat. No. 11,244,666_Part 4 of 5, Exhibit—1009, Filed on Jun. 12, 2024—Cited in IPR2024-01003, challenging U.S. Pat. No. 9,191,083.

EX1009—U.S. Appl. No. 90/019,169 RE of U.S. Pat. No. 11,244,666_Part 4 of 5, Exhibit—1009, Filed on Jun. 12, 2024—Cited in IPR2024-01004, challenging U.S. Pat. No. 9,614,943.

EX1009—U.S. Appl. No. 90/019,169 RE of U.S. Pat. No. 11,244,666_Part 5 of 5, Exhibit—1009, Filed on Jun. 12, 2024—Cited in IPR2024-01003, challenging U.S. Pat. No. 9,191,083.

EX1009—U.S. Appl. No. 90/019,169 RE of U.S. Pat. No. 11,244,666_Part 5 of 5, Exhibit—1009, Filed on Jun. 12, 2024—Cited in IPR2024-01004, challenging U.S. Pat. No. 9,614,943.

EX1010—473 Patent Family Tree, Exhibit—1010, Filed on Jun. 12, 2024—Cited in IPR2024-01003, challenging U.S. Pat. No. 9,191,083.

EX1010—473 Patent Family Tree, Exhibit—1010, Filed on Jun. 12, 2024—Cited in IPR2024-01004, challenging U.S. Pat. No. 9,614,943.

EX1011—Claim Construction Order, ED Tex, Exhibit—1011, Filed on Jun. 12, 2024—Cited in IPR2024-01003, challenging U.S. Pat. No. 9,191,083.

EX1011—Claim Construction Order, ED Tex, Exhibit—1011, Filed on Jun. 12, 2024—Cited in IPR2024-01004, challenging U.S. Pat. No. 9,614,943.

EX1012—Docket Control Order, ED Tex, Exhibit—1012, Filed on Jun. 12, 2024—Cited in IPR2024-01003, challenging U.S. Pat. No. 9,191,083.

EX1012—Docket Control Order, ED Tex, Exhibit—1012, Filed on Jun. 12, 2024—Cited in IPR2024-01004, challenging U.S. Pat. No. 9,614,943.

EX1013—Letter from Nikhil Krishnan to Thomas J Friel, Jr, Exhibit—1013, Filed on Jun. 12, 2024—Cited in IPR2024-01003, challenging U.S. Pat. No. 9,191,083.

(56)        References Cited

OTHER PUBLICATIONS

EX1013—Letter from Nikhil Krishnan to Thomas J Friel, Jr, Exhibit—1013, Filed on Jun. 12, 2024—Cited in IPR2024-01004, challenging U.S. Pat. No. 9,614,943.

EX1016—Stay Order from E.D. Tex. Exhibit1016, Nov. 20, 2024—Cited in IPR2024-01033, challenging U.S. Pat. No. 8,434,966.

EX1019—U.S. Appl. No. 60/841,990 (Rosenberg Provisional) (annotated), Exhibit—1019, Filed on Jun. 12, 2024—Cited in IPR2024-01003, challenging U.S. Pat. No. 9,191,083.

EX1023—Preliminary Constructions, E.D. Tex., Exhibit—1023, Filed on Jan. 31, 2023—Cited in IPR2022-00369, challenging U.S. Pat. No. 10,405,082.

EX1023—Preliminary Constructions, E.D. Tex., Exhibit—1023, Filed on Jan. 31, 2023—Cited in IPR2022-00388, challenging U.S. Pat. No. 10,966,015.

EX1024—Cohen, Exhibit—1024, Filed on Feb. 9, 2024—Cited in IPR2024-00559, challenging U.S. Pat. No. 11,610,587.

EX1024—Transcript of Deposition of Marshall Buck, Exhibit—1024, Filed on Jan. 31, 2023—Cited in IPR2022-00369, challenging U.S. Pat. No. 10,405,082.

EX1024—Transcript of Deposition of Marshall Buck, Exhibit—1024, Filed on Jan. 31, 2023—Cited in IPR2022-00388, challenging U.S. Pat. No. 10,966,015.

EX1025—Blattner et al., Earcons and Icons, Exhibit—1025, Filed on Jun. 25, 2024—Cited in IPR2024-01031, challenging U.S. Pat. No. 7,049,850.

Ex1025—Deposition Transcript of David Kleinschmidt, Exhibit—1025, Filed on Jan. 11, 2023—Cited in IPR2022-00253, challenging U.S. Pat. No. 9,491,542.

EX1025—Stay Order from E.D. Tex., Exhibit—1025, Filed on Nov. 20, 2024—Cited in IPR2024-01034, challenging U.S. Pat. No. 9,279,263.

EX1025—Tanenbaum, Exhibit—1025, Filed on Feb. 9, 2024—Cited in IPR2024-00559, challenging U.S. Pat. No. 11,610,587.

EX1025 Petitioners' Oral Hearing Demonstratives, Exhibit—1025, Filed on May 9, 2023—Cited in IPR2022-00369, challenging U.S. Pat. No. 10,405,082.

EX1025 Petitioners' Oral Hearing Demonstratives, Exhibit—1025, Filed on May 9, 2023—Cited in IPR2022-00388, challenging U.S. Pat. No. 10,966,015.

Ex1026—Cessation from Merriam-Webster's Collegiate Dictionary, 10th Ed, Exhibit—1026, Filed on Jan. 11, 2023—Cited in IPR2022-00253, challenging U.S. Pat. No. 9,491,542.

EX1026—Computer Dictionary 2nd Ed, Exhibit—1026, Filed on Feb. 9, 2024—Cited in IPR2024-00559, challenging U.S. Pat. No. 11,610,587.

Ex1027—Cessation from New World Dictionary, 2d College Ed, Exhibit—1027, Filed on Jan. 11, 2023—Cited in IPR2022-00253, challenging U.S. Pat. No. 9,491,542.

EX1028—Basu, Exhibit—1028, Filed on Jun. 12, 2024—Cited in IPR2024-01003, challenging U.S. Pat. No. 9,191,083.

EX1028—Basu, Smart Headphones, Exhibit—1028, Filed on Jun. 12, 2024—Cited in IPR2024-01004, challenging U.S. Pat. No. 9,614,943.

Ex1028—Supplemental Declaration of Nathanial Polish, Ph.D., Exhibit—1028, Filed on Jan. 11, 2023—Cited in IPR2022-00253, challenging U.S. Pat. No. 9,491,542.

EX1029—Declaration of Nathanial Polish, Exhibit—1029, Filed on Jan. 11, 2023—Cited in IPR2022-00281, challenging U.S. Pat. No. 9,270,244.

EX1029—Mueller, Transparent Hearing, Exhibit—1029, Filed on Jun. 12, 2024—Cited in IPR2024-01003, challenging U.S. Pat. No. 9,191,083.

EX1029—Mueller, Transparent Hearing, Exhibit—1029, Filed on Jun. 12, 2024—Cited in IPR2024-01004, challenging U.S. Pat. No. 9,614,943.

EX1030—Deposition Transcript of David Kleinschmidt, Exhibit—1030, Filed on Jan. 11, 2023—Cited in IPR2022-00281, challenging U.S. Pat. No. 9,270,244.

EX1031—587 Patent Family Tree, Exhibit—1031, Filed on Feb. 9, 2024—Cited in IPR2024-00559, challenging U.S. Pat. No. 11,610,587.

EX1031—Basu, et al., Smart Headphones, Exhibit—1031, Filed on Jun. 25, 2024—Cited in IPR2024-01031, challenging U.S. Pat. No. 7,049,850.

EX1031—Cessation from Merriam-Webster's Collegiate Dictionary, 10th Ed, Exhibit—1031, Filed on Jan. 11, 2023—Cited in IPR2022-00281, challenging U.S. Pat. No. 9,270,244.

EX1031—Patent Rule 4-3 Joint Claim Construction and Prehearing Statement, E.D. Tx, Exhibit—1031, Filed on Mar. 7, 2023—Cited in IPR2022-00253, challenging U.S. Pat. No. 9,491,542.

EX1032—Cessation from New World Dictionary, 2d College Ed, Exhibit—1032, Filed on Jan. 11, 2023—Cited in IPR2022-00281, challenging U.S. Pat. No. 9,270,244.

EX1032—Ex. A-01_U.S. Appl. No. 11/610,587 Samsung Infringement Claim Chart, Exhibit—1032, Filed on Feb. 9, 2024—Cited in IPR2024-00559, challenging U.S. Pat. No. 11,610,587.

EX1032—Excerpts from Microsoft Computer Dictionary, 4th ed, Exhibit—1032, Filed on Jun. 25, 2024—Cited in IPR2024-01031, challenging U.S. Pat. No. 7,049,850.

Ex1032—Petitioners' Oral Hearing Demonstratives, Exhibit—1032, Filed on Apr. 12, 2023—Cited in IPR2022-00253, challenging U.S. Pat. No. 9,491,542.

EX1033—Order Granting Proposed Docket Control Order, Exhibit—1033, Filed on Feb. 9, 2024—Cited in IPR2024-00559, challenging U.S. Pat. No. 11,610,587.

EX1033—Pending from Merriam-Webster's Collegiate Dictionary, 10th Ed, Exhibit—1033, Filed on Jan. 11, 2023—Cited in IPR2022-00281, challenging U.S. Pat. No. 9,270,244.

EX1034—Computer Dictionary 2nd Ed, Exhibit—1034, Filed on Jun. 12, 2024—Cited in IPR2024-01003, challenging U.S. Pat. No. 9,191,083.

EX1034—D Del Statistics, Exhibit—1034, Filed on Feb. 9, 2024—Cited in IPR2024-00559, challenging U.S. Pat. No. 11,610,587.

EX1034—Pause from Merriam-Webster's Collegiate Dictionary, 10th Ed, Exhibit—1034, Filed on Jan. 11, 2023—Cited in IPR2022-00281, challenging U.S. Pat. No. 9,270,244.

EX1035—Deposition Transcript for Daniel P. Anagnos, Exhibit—1035, Filed on Jan. 10, 2023—Cited in IPR2022-00324, challenging U.S. Pat. No. 8,254,591.

EX1035—File History of U.S. Pat. No. 10,635,382; Exhibit—1035, Filed on Dec. 2, 2022—Cited in IPR2022-00234, challenging U.S. Pat. No. 9124982.

EX1035—Letter to Techiya re 587 IPR Stipulation, Exhibit—1035, Filed on Feb. 9, 2024—Cited in IPR2024-00559, challenging U.S. Pat. No. 11,610,587.

EX1035—National Judicial Caseload Profile, Exhibit—1035, Filed on Jun. 25, 2024—Cited in IPR2024-01031, challenging U.S. Pat. No. 7,049,850.

EX1035—Patent Rule 4-3 Joint Claim Construction and Prehearing Statement, E.D. Tx, Exhibit—1035, Filed on Mar. 7, 2023—Cited in IPR2022-00281, challenging U.S. Pat. No. 9,270,244.

EX1035—Tanenbaum Excerpt, Exhibit—1035, Filed on Jun. 12, 2024—Cited in IPR2024-01003, challenging U.S. Pat. No. 9,191,083.

EX1036—Linkedin Profile for Harish Jonnalagadda, Exhibit—1036, Filed on Jan. 10, 2023—Cited in IPR2022-00324, challenging U.S. Pat. No. 8,254,591.

EX1036—Oshana excerpt, Exhibit—1036, Filed on Jun. 12, 2024—Cited in IPR2024-01003, challenging U.S. Pat. No. 9,191,083.

EX1036—Oshana excerpt, Exhibit—1036, Filed on Jun. 12, 2024—Cited in IPR2024-01004, challenging U.S. Pat. No. 9,614,943.

EX1036—Petitioners' Oral Hearing Demonstratives, Exhibit—1036, Filed on Apr. 13, 2023—Cited in IPR2022-00281, challenging U.S. Pat. No. 9,270,244.

EX1036—Stay Order from E.D. Tex., Exhibit—1036, Filed on Nov. 20, 2024—Cited in IPR2024-01031, challenging U.S. Pat. No. 7,049,850.

EX1037—Confidential Settlement Agrement with Exhibits A-I, Exhibit—1037, Filed on Dec. 11, 2024—Cited in IPR2024-00559, challenging U.S. Pat. No. 11,610,587. [Document not publicly available at PTAB].

(56)                References Cited

OTHER PUBLICATIONS

EX1038—Confidential Settlement Agreement with Exhibits A-I, Exhibit—1038, Filed on Dec. 11, 2024—Cited in IPR2024-01031, challenging U.S. Pat. No. 7,049,850. [Document not publicly available at PTAB].

EX1038—Handbook for Sound Engineers_Part 1 of 2, Exhibit—1038, Filed on Jun. 12, 2024—Cited in IPR2024-01003, challenging U.S. Pat. No. 9,191,083.

EX1038—Handbook for Sound Engineers_Part 2 of 2, Exhibit—1038, Filed on Jun. 12, 2024—Cited in IPR2024-01003, challenging U.S. Pat. No. 9,191,083.

EX1040—IPR2022-00234, Ex 2001, Declaration of Daniel P Anagnos; Exhibit—1040, Filed on Dec. 2, 2022—Cited in IPR2022-00234, challenging U.S. Pat. No. 9124982.

EX1041—Nov. 18, 2022, Deposition Transcript of Daniel P Anagnos; Exhibit—1041, Filed on Dec. 2, 2022—Cited in IPR2022-00234, challenging U.S. Pat. No. 9124982.

EX1041—Supplemental Declaration of Les E. Atlas, Ph.D., Exhibit—1041, Filed on Jan. 10, 2023—Cited in IPR2022-00324, challenging U.S. Pat. No. 8,254,591.

EX1042—Excerpts from the Authoritative Dictionary of IEEE Standards Terms; Exhibit—1042, Filed on Dec. 2, 2022—Cited in IPR2022-00234, challenging U.S. Pat. No. 9124982.

Ex1042—Petitioners' Oral Hearing Demonstratives, Exhibit—1042, Filed on Apr. 4, 2023—Cited in IPR2022-00324, challenging U.S. Pat. No. 8,254,591.

EX1043—Institution Decision, IPR2022-00234, Paper 16; Exhibit—1043, Filed on Dec. 2, 2022—Cited in IPR2022-00234, challenging U.S. Pat. No. 9,124,982.

EX1044—Patent Owner Response, IPR2022-00234, Paper 22; Exhibit—1044, Filed on Dec. 2, 2022—Cited in IPR2022-00234, challenging U.S. Pat. No. 9124982.

EX1045—Excerpt of Prosecution History of U.S. Appl. No. 17/483,190, Exhibit—1045, Filed on Jun. 12, 2024—Cited in IPR2024-01003, challenging U.S. Pat. No. 9,191,083.

EX1056—U.S. Appl. No. 11/710,473 Samsung Infringement Claim Chart, Ex. A-06, Exhibit—1056, Filed on Jun. 12, 2024—Cited in IPR2024-01003, challenging U.S. Pat. No. 9,191,083.

EX1056—U.S. Appl. No. 11/710,473 Samsung Infringement Claim Chart, Ex. A-06, Exhibit—1056, Filed on Jun. 12, 2024—Cited in IPR2024-01004, challenging U.S. Pat. No. 9,614,943.

EX1058—Kuo, Active Noise Control, Exhibit—1058, Filed on Jun. 12, 2024—Cited in IPR2024-01004, challenging U.S. Pat. No. 9,614,943.

Ex1058—Petitioners' Oral Hearing Demonstratives, Exhibit—1058, Filed on Mar. 16, 2023—Cited in IPR2022-00242, challenging U.S. Pat. No. 8,111,839.

Ex1058—Petitioners' Oral Hearing Demonstratives, Exhibit—1058, Filed on Mar. 16, 2023—Cited in IPR2022-00243, challenging U.S. Pat. No. 8,111,839.

EX1059—Stay Order from E.D. Tex., Exhibit—1059, Filed on Nov. 20, 2024—Cited in IPR2024-01003, challenging U.S. Pat. No. 9,191,083.

EX1059—Stay Order from E.D. Tex., Exhibit—1059, Filed on Nov. 20, 2024—Cited in IPR2024-01004, challenging U.S. Pat. No. 9,614,943.

EX1061—Confidential Settlement Agreement with Exhibits A-I, Exhibit—1061, Filed on Dec. 11, 2024—Cited in IPR2024-01004, challenging U.S. Pat. No. 9,614,943. [Document not publicly available at PTAB].

EX1061—Confidential Settlement Agrement with Exhibits A-I, Exhibit—1061, Filed on Dec. 11, 2024—Cited in IPR2024-01003, challenging U.S. Pat. No. 9,191,083. [Document not publicly available at PTAB].

Excerpt from Computer Dictionary, 2d ed., Exhibit—1027, Filed on Dec. 13, 2021—Cited in IPR2022-00242, challenging U.S. Pat. No. 8,111,839.

Excerpt from Computer Dictionary, 2d ed., Exhibit—1027, Filed on Dec. 13, 2021—Cited in IPR2022-00243, challenging U.S. Pat. No. 8,111,839.

Excerpt from Computer Dictionary, 2d ed.; Exhibit—1029, Filed on Dec. 13, 2021—Cited in IPR2022-00234, challenging U.S. Pat. No. 9124982.

Excerpt from Dictionary of Scientific and Technical Terms, 5th ed., Exhibit—1026, Filed on Dec. 20, 2021—Cited in IPR2022-00324, challenging U.S. Pat. No. 8,254,591.

Excerpt from McGraw Hill Dictionary of Scientific and Technical Terms, 5th ed., Exhibit—1025, Filed on Dec. 13, 2021—Cited in IPR2022-00242, challenging U.S. Pat. No. 8,111,839.

Excerpt from McGraw-Hill Dictionary of Scientific and Technical Terms, 5th ed., Exhibit—1025, Filed on Dec. 13, 2021—Cited in IPR2022-00243, challenging U.S. Pat. No. 8,111,839.

Excerpt from Oshana; Exhibit—1030, Filed on Dec. 13, 2021—Cited in IPR2022-00234, challenging U.S. Pat. No. 9124982.

Excerpt of File History of U.S. Appl. No. 12/100,281; Exhibit—1006, Filed on Dec. 13, 2021—Cited in IPR2022-00234, challenging U.S. Pat. No. 9,124,982.

Excerpt of File History of U.S. Appl. No. 13/352,694; Exhibit—1007, Filed on Dec. 13, 2021—Cited in IPR2022-00234, challenging U.S. Pat. No. 9,124,982.

Excerpts from Federal Court Management Statistics, Exhibit—1022, Filed on Jul. 1, 2022—Cited in IPR2022-00369, challenging U.S. Pat. No. 10,405,082.

Excerpts from Federal Court Management Statistics, Exhibit—1022, Filed on Jul. 1, 2022—Cited in IPR2022-00388, challenging U.S. Pat. No. 10,966,015.

Excerpts from Federal Court Management Statistics, Exhibit—1023, Filed on Jul. 1, 2022—Cited in IPR2022-00410, challenging U.S. Pat. No. 10,979,836.

Excerpts from Federal Court Management Statistics, Exhibit—1024, Filed on Jul. 1, 2022—Cited in IPR2022-00253, challenging U.S. Pat. No. 9,491,542.

Excerpts from Federal Court Management Statistics, Exhibit—1026, Filed on Jul. 1, 2022—Cited in IPR2022-00302, challenging U.S. Pat. No. 9,609,424.

Excerpts from Federal Court Management Statistics, Exhibit—1028, Filed on Jul. 1, 2022—Cited in IPR2022-00281, challenging U.S. Pat. No. 9,270,244.

Excerpts from Federal Court Management Statistics, Exhibit—1034, Filed on Jul. 1, 2022—Cited in IPR2022-00324, challenging U.S. Pat. No. 8,254,591.

Excerpts from McGraw-Hill Dictionary of Scientific and Technical Terms, 5th ed.; Exhibit—1021, Filed on Dec. 13, 2021—Cited in IPR2022-00234, challenging U.S. Pat. No. 9124982.

Excerpts from Openheim, Exhibit—1016, Filed on Jan. 4, 2022—Cited in IPR2022-00388, challenging U.S. Pat. No. 10,966,015.

Excerpts from Oppenheim & Schafer, 3rd ed., Exhibit—1016, Filed on Dec. 30, 2021—Cited in IPR2022-00369, challenging U.S. Pat. No. 10,405,082.

Excerpts from Oshana, Exhibit—1027, Filed on Dec. 20, 2021—Cited in IPR2022-00324, challenging U.S. Pat. No. 8,254,591.

Excerpts from Oshana, Exhibit—1028, Filed on Dec. 13, 2021—Cited in IPR2022-00242, challenging U.S. Pat. No. 8,111,839.

Excerpts from Oshana, Exhibit—1028, Filed on Dec. 13, 2021—Cited in IPR2022-00243, challenging U.S. Pat. No. 8,111,839.

Exhibit 3001, Exhibit—3001, Filed on Jan. 5, 2023—Cited in IPR2022-00282, challenging U.S. Pat. No. 8,315,400.

Exhibit 3001, Exhibit—3001, Filed on Nov. 3, 2022—Cited in IPR2022-01078, challenging U.S. Pat. No. 11,057,701.

Exhibit 3001, Exhibit—3001, Filed on Nov. 3, 2022—Cited in IPR2022-01106, challenging U.S. Pat. No. 11,039,259.

Exhibit 3001, Exhibit—3001, Filed on Apr. 6, 2023—Cited in IPR2022-00369, challenging U.S. Pat. No. 10,405,082.

Expunged, Exhibit—1002, Filed on Jan. 4, 2022—Cited in IPR2022-00388, challenging U.S. Pat. No. 10,966,015. [Document expunged from PTAB record].

Expunged, Exhibit—1006, Filed on Dec. 13, 2021—Cited in IPR2022-00242, challenging U.S. Pat. No. 8,111,839.

Expunged, Exhibit—1006, Filed on Dec. 13, 2021—Cited in IPR2022-00243, challenging U.S. Pat. No. 8,111,839.

Expunged, Exhibit—1031, Filed on Apr. 13, 2023—Cited in IPR2022-00302, challenging U.S. Pat. No. 9,609,424.

(56) References Cited

OTHER PUBLICATIONS

Expunged, Exhibit—1036, Filed on Dec. 9, 2024—Cited in IPR2024-00559, challenging U.S. Pat. No. 11,610,587. [Document expunged from PTAB record].

Expunged, Exhibit—1037, Filed on Dec. 9, 2024—Cited in IPR2024-01031, challenging U.S. Pat. No. 7,049,850. [Document expunged from PTAB record].

Expunged, Exhibit—1060, Filed on Dec. 9, 2024—Cited in IPR2024-01003, challenging U.S. Pat. No. 9,191,083. [Document expunged from PTAB record].

Expunged, Exhibit—1060, Filed on Dec. 9, 2024—Cited in IPR2024-01004, challenging U.S. Pat. No. 9,614,943. [Document expunged from PTAB record].

Expunged, Exhibit—11, Filed on Jan. 18, 2023—Cited in IPR2022-01099, challenging U.S. Pat. No. 11,244,666. [Document expunged from PTAB record].

Expunged, Exhibit—12, Filed on Jan. 18, 2023—Cited in IPR2022-01098, challenging U.S. Pat. No. 11,217,237. [Document expunged from PTAB record].

Expunged, Exhibit—2008, Filed on Feb. 22, 2023—Cited in IPR2022-00281, challenging U.S. Pat. No. 9,270,244.

Expunged, Exhibit—3, Filed on Dec. 10, 2021—Cited in IPR2022-00282, challenging U.S. Pat. No. 8,315,400. [Document expunged from PTAB record].

Expunged, Exhibit—3, Filed on Jun. 9, 2022—Cited in IPR2022-01098, challenging U.S. Pat. No. 11,217,237. [Document expunged from PTAB record].

Expunged, Exhibit—3002, Filed on Apr. 6, 2023—Cited in IPR2022-00388, challenging U.S. Pat. No. 10,966,015. [Document expunged from PTAB record].

Expunged, Exhibit—37, Filed on Aug. 15, 2023—Cited in IPR2022-00243, challenging U.S. Pat. No. 8,111,839.

Expungedexhibit1017, Dec. 9, 2024—Cited in IPR2024-01033, challenging U.S. Pat. No. 8,434,966. [Document expunged from PTAB record].

Extract from Federal Court Management Statistics, Exhibit—1021, Filed on Nov. 10, 2022—Cited in IPR2022-01099, challenging U.S. Pat. No. 11,244,666.

Extract from Federal Court Management Statistics, Exhibit—1024, Filed on Nov. 10, 2022—Cited in IPR2022-01078, challenging U.S. Pat. No. 11,057,701.

Extract from Federal Court Management Statistics, Exhibit—1027, Filed on Nov. 15, 2022—Cited in IPR2022-01098, challenging U.S. Pat. No. 11,217,237.

Extract from Federal Court Management Statistics, Exhibit—1030, Filed on Nov. 10, 2022—Cited in IPR2022-01106, challenging U.S. Pat. No. 11,039,259.

Federal Court Management Statistics (excerpt), Exhibit—2004, Filed on Jul. 1, 2022—Cited in IPR2022-00253, challenging U.S. Pat. No. 9,491,542.

Federal Court Management Statistics (excerpt), Exhibit—2004, Filed on Jul. 1, 2022—Cited in IPR2022-00281, challenging U.S. Pat. No. 9,270,244.

Federal Court Management Statistics (excerpt), Exhibit—2004, Filed on Jul. 1, 2022—Cited in IPR2022-00302, challenging U.S. Pat. No. 9,609,424.

Federal Court Management Statistics (excerpt), Exhibit—2004, Filed on Jul. 1, 2022—Cited in IPR2022-00324, challenging U.S. Pat. No. 8,254,591.

Federal Court Management Statistics (excerpt), Exhibit—2005, Filed on Jul. 1, 2022—Cited in IPR2022-00369, challenging U.S. Pat. No. 10,405,082.

Federal Court Management Statistics (excerpt), Exhibit—2005, Filed on Jul. 1, 2022—Cited in IPR2022-00410, challenging U.S. Pat. No. 10,979,836.

Federal Court Management Statistics (excerpt), Exhibit—2006, Filed on Jul. 1, 2022—Cited in IPR2022-00388, challenging U.S. Pat. No. 10,966,015.

File History for U.S. Pat. No. 9,491,542, Exhibit—1004, Filed on Dec. 17, 2021—Cited in IPR2022-00253, challenging U.S. Pat. No. 9,491,542.

File History of U.S. Appl. No. 16/168,752, Exhibit—2005, Filed on May 18, 2022—Cited in IPR2022-00388, challenging U.S. Pat. No. 10,966,015.

File History of U.S. Appl. No. 12/555,864, Exhibit—1012, Filed on Jan. 14, 2022—Cited in IPR2022-00410, challenging U.S. Pat. No. 10,979,836.

File History of U.S. Appl. No. 14/054,015, Exhibit—1011, Filed on Jan. 14, 2022—Cited in IPR2022-00410, challenging U.S. Pat. No. 10,979,836.

File History of U.S. Appl. No. 14/827,332, Exhibit—1010, Filed on Jan. 14, 2022—Cited in IPR2022-00410, challenging U.S. Pat. No. 10,979,836.

File History of U.S. Appl. No. 15/700,511, Exhibit—1009, Filed on Jan. 14, 2022—Cited in IPR2022-00410, challenging U.S. Pat. No. 10,979,836.

File History of U.S. Appl. 16/414,136, Exhibit—1013, Filed on Jan. 14, 2022—Cited in IPR2022-00410, challenging U.S. Pat. No. 10,979,836.

File History of U.S. Pat. No. 8,111,839, Exhibit—1005, Filed on Dec. 13, 2021—Cited in IPR2022-00242, challenging U.S. Pat. No. 8,111,839.

File History of U.S. Pat. No. 8,111,839, Exhibit—1005, Filed on Dec. 13, 2021—Cited in IPR2022-00243, challenging U.S. Pat. No. 8,111,839.

File History of U.S. Pat. No. 8,254,591, Exhibit—1004, Filed on Dec. 20, 2021—Cited in IPR2022-00324, challenging U.S. Pat. No. 8,254,591.

File History of U.S. Pat. No. 9,124,982; Exhibit—1004, Filed on Dec. 13, 2021—Cited in IPR2022-00234, challenging U.S. Pat. No. 9124982.

File History of U.S. Pat. No. 10,405,082, Exhibit—1004, Filed on Dec. 30, 2021—Cited in IPR2022-00369, challenging U.S. Pat. No. 10,405,082.

File History of U.S. Pat. No. 10,966,015, Exhibit—1005, Filed on Jan. 4, 2022—Cited in IPR2022-00388, challenging U.S. Pat. No. 10,966,015.

File History of U.S. Pat. No. 10,979,836,, U.S. Appl. No. 16/838,277, Exhibit—1004, Filed on Jan. 14, 2022—Cited in IPR2022-00410, challenging U.S. Pat. No. 10,979,836.

File History of U.S. Pat. No. 8,315,400, Exhibit—1004, Filed on Dec. 10, 2021—Cited in IPR2022-00282, challenging U.S. Pat. No. 8,315,400.

File History of U.S. Pat. No. 8,774,433, Exhibit—1009, Filed on Dec. 21, 2021—Cited in IPR2022-00302, challenging U.S. Pat. No. 9,609,424.

File History of U.S. Pat. No. 9,270,244, Exhibit—1004, Filed on Dec. 21, 2021—Cited in IPR2022-00281, challenging U.S. Pat. No. 9,270,244.

File History of U.S. Pat. No. 9,332,364, Exhibit—1005, Filed on Dec. 21, 2021—Cited in IPR2022-00302, challenging U.S. Pat. No. 9,609,424.

File History of U.S. Pat. No. 9,609,424, Exhibit—1004, Filed on Dec. 21, 2021—Cited in IPR2022-00302, challenging U.S. Pat. No. 9,609,424.

File History of U.S. Appl. No. 60/910,808; Exhibit—1005, Filed on Dec. 13, 2021—Cited in IPR2022-00234, challenging U.S. Pat. No. 9,124,982.

File History of U.S. Appl. No. 61/098,250, Exhibit—1005, Filed on Jan. 14, 2022—Cited in IPR2022-00410, challenging U.S. Pat. No. 10,979,836.

File History of U.S. Appl. No. 60/619,517 (Allen Provisional), Exhibit—1020, Filed on Dec. 21, 2021—Cited in IPR2022-00302, challenging U.S. Pat. No. 9,609,424.

File History of U.S. Appl. No. 60/866,420, Exhibit—1010, Filed on Dec. 21, 2021—Cited in IPR2022-00302, challenging U.S. Pat. No. 9,609,424.

Final Written Decision, IPR2022-00282 (Paper No. 28, Jun. 14, 2023), Exhibit—1035, Filed on Jun. 30, 2023—Cited in IPR2022-01106, challenging U.S. Pat. No. 11,039,259.

(56) References Cited

OTHER PUBLICATIONS

Final Written Decision: Final Written Decision Determining All Challenged Claims Unpatentable 35 U.S.C. sec. 318a, Exhibit—32, Filed on Jan. 5, 2024—Cited in IPR2022-01106, challenging U.S. Pat. No. 11,039,259.

Final Written Decision: original, Exhibit—28, Filed on Jun. 14, 2023—Cited in IPR2022-00282, challenging U.S. Pat. No. 8,315,400.

Final Written Decision: original, Exhibit—31, Filed on Jul. 13, 2023—Cited in IPR2022-00281, challenging U.S. Pat. No. 9,270,244.

Final Written Decision: original, Exhibit—33, Filed on Jul. 10, 2023—Cited in IPR2022-00324, challenging U.S. Pat. No. 8,254,591.

Final Written Decision: original, Exhibit—33, Filed on Jul. 14, 2023—Cited in IPR2022-00253, challenging U.S. Pat. No. 9,491,542.

Final Written Decision: original, Exhibit—36, Filed on Jun. 16, 2023—Cited in IPR2022-00242, challenging U.S. Pat. No. 8,111,839.

Final Written Decision: original; Exhibit—29, Filed on Jun. 14, 2023—Cited in IPR2022-00234, challenging U.S. Pat. No. 9124982.

Final Written Decision: Judgment Final Written Decision Determining All Challenged Claims Unpatentable 35 U.S. C. § 318(a), Exhibit—35, Filed on Jun. 20, 2023—Cited in IPR2022-00243, challenging U.S. Pat. No. 8,111,839.

First Amended Complaint, *Staton Techiya* v. *Samsung, E.D. Tex.*, Exhibit—1008, Filed on Dec. 10, 2021—Cited in IPR2022-00282, challenging U.S. Pat. No. 8,315,400.

First Amended Complaint, *Techiya* v. *Samsung, E.D. Tex.*, Exhibit—1018, Filed on Dec. 21, 2021—Cited in IPR2022-00281, challenging U.S. Pat. No. 9,270,244.

First Amended Complaint, *Techiya* v. *Samsung, E.D. Tex.*, Exhibit—1020, Filed on Dec. 17, 2021—Cited in IPR2022-00253, challenging U.S. Pat. No. 9,491,542.

First Amended Complaint, *Techiya* v. *Samsung, E.D. Tex.*, Exhibit—1029, Filed on Dec. 20, 2021—Cited in IPR2022-00324, challenging U.S. Pat. No. 8,254,591.

First Amended Complaint, *Techiya* v. *Samsung, E.D. Tex.*, Exhibit—1040, Filed on Dec. 13, 2021—Cited in IPR2022-00242, challenging U.S. Pat. No. 8,111,839.

First Amended Complaint, *Techiya* v. *Samsung, E.D. Tex.*, Exhibit—1040, Filed on Dec. 13, 2021—Cited in IPR2022-00243, challenging U.S. Pat. No. 8,111,839.

First Amended Complaint, *Techiya* v. *Samsung, E.D. Tex.*; Exhibit—1031, Filed on Dec. 13, 2021—Cited in IPR2022-00234, challenging U.S. Pat. No. 9124982.

Granting Institution of Inter Partes Review 35 U.S.C. § 314, Exhibit—13, Filed on Jul. 15, 2022—Cited in IPR2022-00253, challenging U.S. Pat. No. 9,491,542.

Granting Institution of Inter Partes Review 35 U.S.C. § 314, Exhibit—13, Filed on Jul. 15, 2022—Cited in IPR2022-00281, challenging U.S. Pat. No. 9,270,244.

Granting Institution of Inter Partes Review 35 U.S.C. § 314, Exhibit—13, Filed on Aug. 16, 2022—Cited in IPR2022-00388, challenging U.S. Pat. No. 10,966,015.

Granting Institution of Inter Partes Review 35 U.S.C. § 314, Exhibit—14, Filed on Aug. 16, 2022—Cited in IPR2022-00369, challenging U.S. Pat. No. 10,405,082.

Harman Q&As about Microphone Windscreens, Exhibit—2013, Filed on Sep. 13, 2022—Cited in IPR2022-00242, challenging U.S. Pat. No. 8,111,839.

Harman, Q&As about Microphone Screens; Exhibit—2012, Filed on Sep. 9, 2022—Cited in IPR2022-00234, challenging U.S. Pat. No. 9,124,982.

IEEE Dictionary of Standards Terms (excerpts), Exhibit—2006, Filed on Mar. 21, 2022—Cited in IPR2022-00282, challenging U.S. Pat. No. 8,315,400.

Institution Decision: Deny, Exhibit—12, Filed on Aug. 12, 2022—Cited in IPR2022-00410, challenging U.S. Pat. No. 10,979,836.

Institution Decision: Grant, Exhibit—10, Filed on Jan. 9, 2023—Cited in IPR2022-01106, challenging U.S. Pat. No. 11,039,259.

Institution Decision: Grant, Exhibit—12, Filed on Jun. 17, 2022—Cited in IPR2022-00282, challenging U.S. Pat. No. 8,315,400.

Institution Decision: Grant, Exhibit—13, Filed on Jul. 11, 2022—Cited in IPR2022-00302, challenging U.S. Pat. No. 9,609,424.

Institution Decision: Grant, Exhibit—13, Filed on Jul. 11, 2022—Cited in IPR2022-00324, challenging U.S. Pat. No. 8,254,591.

Institution Decision: Grant, Exhibit—15, Filed on Jun. 21, 2022—Cited in IPR2022-00243, challenging U.S. Pat. No. 8,111,839.

Institution Decision: Grant, Exhibit—16, Filed on Jun. 21, 2022—Cited in IPR2022-00242, challenging U.S. Pat. No. 8,111,839.

Institution Decision: Grant, Exhibit—8, Filed on Aug. 16, 2024—Cited in IPR2024-00559, challenging U.S. Pat. No. 11,610,587.

Institution Decision: Grant; Exhibit—12, Filed on Jun. 17, 2022—Cited in IPR2022-00234, challenging U.S. Pat. No. 9,124,982.

Joint Motion to Consolidate; Exhibit—2005, Filed on Apr. 29, 2022—Cited in IPR2022-00234, challenging U.S. Pat. No. 9124982.

Joint Motion to Terminate Proceeding, Exhibit—17, Filed on Dec. 9, 2024—Cited in IPR2024-00559, challenging U.S. Pat. No. 11,610,587.

Joint Request to Treat Settlement Agreement as Business Confidential Information, Exhibit—14, Filed on Dec. 9, 2024—Cited in IPR2024-01003, challenging U.S. Pat. No. 9,191,083.

Joint Request to Treat Settlement Agreement as Business Confidential Information, Exhibit—14, Filed on Dec. 9, 2024—Cited in IPR2024-01004, challenging U.S. Pat. No. 9,614,943.

Joint Request to Treat Settlement Agreement as Business Confidential Information, Exhibit—14, Filed on Dec. 9, 2024—Cited in IPR2024-01031, challenging U.S. Pat. No. 7,049,850.

Joint Request to Treat Settlement Agreement as Business Confidential Information, Exhibit—15, Filed on Dec. 9, 2024—Cited in IPR2024-01034, challenging U.S. Pat. No. 9,279,263.

Joint Request to Treat Settlement Agreement as Business Confidential Information, Exhibit—18, Filed on Dec. 9, 2024—Cited in IPR2024-00559, challenging U.S. Pat. No. 11,610,587.

Joint Request to Treat Settlement Agreement as Business Confidential InformationPaper13, Dec. 9, 2024—Cited in IPR2024-01033, challenging U.S. Pat. No. 8,434,966.

Joint Statement Regarding Oral Argument, Exhibit—15, Filed on Jul. 29, 2022—Cited in IPR2022-00253, challenging U.S. Pat. No. 9,491,542.

Joint Statement Regarding Oral Argument, Exhibit—15, Filed on Jul. 29, 2022—Cited in IPR2022-00281, challenging U.S. Pat. No. 9,270,244.

Joint Statement Regarding Oral Argument, Exhibit—15, Filed on Jul. 29, 2022—Cited in IPR2022-00302, challenging U.S. Pat. No. 9,609,424.

Joint Statement Regarding Oral Argument, Exhibit—15, Filed on Aug. 24, 2022—Cited in IPR2022-00388, challenging U.S. Pat. No. 10,966,015.

Joint Statement Regarding Oral Argument, Exhibit—16, Filed on Jul. 29, 2022—Cited in IPR2022-00324, challenging U.S. Pat. No. 8,254,591.

Joint Statement Regarding Oral Argument, Exhibit—16, Filed on Aug. 24, 2022—Cited in IPR2022-00369, challenging U.S. Pat. No. 10,405,082.

Joint Statement Regarding Oral Argument, Exhibit—18, Filed on Jul. 29, 2022—Cited in IPR2022-00243, challenging U.S. Pat. No. 8,111,839.

Joint Statement Regarding Oral Argument, Exhibit—19, Filed on Jul. 29, 2022—Cited in IPR2022-00242, challenging U.S. Pat. No. 8,111,839.

Joint Stipulation To Modify Due Dates 1-3, Exhibit—10, Filed on Oct. 25, 2024—Cited in IPR2024-00559, challenging U.S. Pat. No. 11,610,587.

Joint Stipulation To Modify Due Dates 1-3, Exhibit—12, Filed on Nov. 22, 2024—Cited in IPR2024-00559, challenging U.S. Pat. No. 11,610,587.

Joint Stipulation to Modify Scheduling Order, Exhibit—14, Filed on Mar. 14, 2023—Cited in IPR2022-01106, challenging U.S. Pat. No. 11,039,259.

Joint Stipulation to Modify the Scheduling Order, Exhibit—16, Filed on Aug. 16, 2022—Cited in IPR2022-00253, challenging U.S. Pat. No. 9,491,542.

(56) References Cited

OTHER PUBLICATIONS

Joint Stipulation to Modify the Scheduling Order, Exhibit—16, Filed on Aug. 16, 2022—Cited in IPR2022-00281, challenging U.S. Pat. No. 9,270,244.

Joint Stipulation to Modify the Scheduling Order, Exhibit—16, Filed on Aug. 16, 2022—Cited in IPR2022-00302, challenging U.S. Pat. No. 9,609,424.

Joint Stipulation to Modify the Scheduling Order, Exhibit—19, Filed on Aug. 16, 2022—Cited in IPR2022-00324, challenging U.S. Pat. No. 8,254,591.

Kleinschmidt Declaration in Support of Patent Owner Response, Exhibit—2018, Filed on Apr. 10, 2023—Cited in IPR2022-01106, challenging U.S. Pat. No. 11,039,259.

LEAP Practitioner Request and Verification Form (Patent Owner), Exhibit—29, Filed on Feb. 28, 2023—Cited in IPR2022-00243, challenging U.S. Pat. No. 8,111,839.

LEAP Practitioner Request and Verification Form (Patent Owner), Exhibit—30, Filed on Feb. 28, 2023—Cited in IPR2022-00242, challenging U.S. Pat. No. 8,111,839.

LEAP Practitioner Request and Verification Form (Petitioner), Exhibit—30, Filed on Mar. 13, 2023—Cited in IPR2022-00243, challenging U.S. Pat. No. 8,111,839.

LEAP Practitioner Request and Verification Form (Petitioner), Exhibit—31, Filed on Mar. 13, 2023—Cited in IPR2022-00242, challenging U.S. Pat. No. 8,111,839.

Letter from Petitioners' Counsel to PO's Counsel Apr. 20, 2022, Exhibit—2004, Filed on May 18, 2022—Cited in IPR2022-00369, challenging U.S. Pat. No. 10,405,082.

Letter from Petitioners' Counsel to PO's Counsel Apr. 20, 2022, Exhibit—2004, Filed on May 18, 2022—Cited in IPR2022-00388, challenging U.S. Pat. No. 10,966,015.

Letter from Petitioners' Counsel to PO's Counsel Apr. 20, 2022, Exhibit—2004, Filed on May 18, 2022—Cited in IPR2022-00410, challenging U.S. Pat. No. 10,979,836.

Markman Hearing Transcript (excerpts), Exhibit—2022, Filed on Oct. 19, 2023—Cited in IPR2022-01106, challenging U.S. Pat. No. 11,039,259.

Mauer, Embedded Indexing, Exhibit—2008, Filed on Sep. 13, 2022—Cited in IPR2022-00242, challenging U.S. Pat. No. 8,111,839.

Mauer, Embedded Indexing: Pros and Cons for the Indexer, Exhibit—2008, Filed on Sep. 9, 2022—Cited in IPR2022-00234, challenging U.S. Pat. No. 9,124,982.

McGraw-Hill Dictionary of Scientific and Technical Terms, Exhibit—2010, Filed on Sep. 13, 2022—Cited in IPR2022-00242, challenging U.S. Pat. No. 8,111,839.

McGraw-Hill Dictionary of Scientific and Technical Terms; Exhibit—2009, Filed on Sep. 9, 2022—Cited in IPR2022-00234, challenging U.S. Pat. No. 9,124,982.

Merriam-Webster's Collegiate Dictionary (excerpt), Exhibit—2010, Filed on Oct. 11, 2022—Cited in IPR2022-01106, challenging U.S. Pat. No. 11,039,259.

Montgomery Declaration with Exhibit A, Exhibit—1018, Filed on Jan. 14, 2022—Cited in IPR2022-00410, challenging U.S. Pat. No. 10,979,836.

Motion for Leave to File Corrected Petition, Exhibit—10, Filed on Jan. 31, 2022—Cited in IPR2022-00242, challenging U.S. Pat. No. 8,111,839.

Motion: Motion to dismiss due to settlement (pre-DI), Exhibit—13, Filed on Dec. 9, 2024—Cited in IPR2024-01003, challenging U.S. Pat. No. 9,191,083.

Motion: Motion to dismiss due to settlement (pre-DI), Exhibit—13, Filed on Dec. 9, 2024—Cited in IPR2024-01004, challenging U.S. Pat. No. 9,614,943.

Motion: Motion to dismiss due to settlement (pre-DI), Exhibit—13, Filed on Dec. 9, 2024—Cited in IPR2024-01031, challenging U.S. Pat. No. 7,049,850.

Motion: Motion to dismiss due to settlement (pre-DI), Exhibit—14, Filed on Dec. 9, 2024—Cited in IPR2024-01034, challenging U.S. Pat. No. 9,279,263.

Motion: Motion to dismiss due to settlement (pre-DI)Paper12, Dec. 9, 2024—Cited in IPR2024-01033, challenging U.S. Pat. No. 8,434,966.

Notice : Mandatory Notice, Exhibit—5, Filed on Jul. 16, 2024—Cited in IPR2024-01031, challenging U.S. Pat. No. 7,049,850.

Notice : Mandatory Notice, Exhibit—6, Filed on Jul. 16, 2024—Cited in IPR2024-01034, challenging U.S. Pat. No. 9,279,263.

Notice : Mandatory Notice, Exhibit—7, Filed on Mar. 1, 2024—Cited in IPR2024-00559, challenging U.S. Pat. No. 11,610,587.

Notice : Other—Notice of Ranking, Exhibit—4, Filed on Jul. 1, 2024—Cited in IPR2024-01034, challenging U.S. Pat. No. 9,279,263.

Notice : Power of Attorney for Harman International Industries, Exhibit—3, Filed on Feb. 9, 2024—Cited in IPR2024-00559, challenging U.S. Pat. No. 11,610,587.

Notice : Power of Attorney for Harman International Industries, Inc., Exhibit—3, Filed on Jun. 25, 2024—Cited in IPR2024-01031, challenging U.S. Pat. No. 7,049,850.

Notice : Power of Attorney for Harman International Industries, Inc., Exhibit—3, Filed on Jul. 1, 2024—Cited in IPR2024-01034, challenging U.S. Pat. No. 9,279,263.

Notice : Power of Attorney for Samsung Electronics America, Exhibit—2, Filed on Feb. 9, 2024—Cited in IPR2024-00559, challenging U.S. Pat. No. 11,610,587.

Notice : Power of Attorney for Samsung Electronics America, Inc., Exhibit—2, Filed on Jun. 12, 2024—Cited in IPR2024-01003, challenging U.S. Pat. No. 9,191,083.

Notice : Power of Attorney for Samsung Electronics America, Inc., Exhibit—2, Filed on Jun. 12, 2024—Cited in IPR2024-01004, challenging U.S. Pat. No. 9,614,943.

Notice : Power of Attorney for Samsung Electronics America, Inc., Exhibit—2, Filed on Jun. 25, 2024—Cited in IPR2024-01031, challenging U.S. Pat. No. 7,049,850.

Notice : Power of Attorney for Samsung Electronics America, Inc., Exhibit—2, Filed on Jul. 1, 2024—Cited in IPR2024-01034, challenging U.S. Pat. No. 9,279,263.

Notice : Power of Attorney for Samsung Electronics America, Inc. Paper2,Jun. 18, 2024—Cited in IPR2024-01033, challenging U.S. Pat. No. 8,434,966.

Notice : Power of Attorney for Samsung Electronics Co., Ltd., Exhibit—1, Filed on Feb. 9, 2024—Cited in IPR2024-00559, challenging U.S. Pat. No. 11,610,587.

Notice : Power of Attorney for Samsung Electronics Co., Ltd., Exhibit—1, Filed on Jun. 12, 2024—Cited in IPR2024-01003, challenging U.S. Pat. No. 9,191,083.

Notice : Power of Attorney for Samsung Electronics Co., Ltd., Exhibit—1, Filed on Jun. 12, 2024—Cited in IPR2024-01004, challenging U.S. Pat. No. 9,614,943.

Notice : Power of Attorney for Samsung Electronics Co., Ltd., Exhibit—1, Filed on Jul. 1, 2024—Cited in IPR2024-01034, challenging U.S. Pat. No. 9,279,263.

Notice : Power of Attorney for Samsung Electronics Co., Ltd. Paper1,Jun. 18, 2024—Cited in IPR2024-01033, challenging U.S. Pat. No. 8,434,966.

Notice : Power of Attorney for Samsung Electronics Corp., Exhibit—1, Filed on Jun. 25, 2024—Cited in IPR2024-01031, challenging U.S. Pat. No. 7,049,850.

Notice : Power of Attorney, Exhibit—6, Filed on Mar. 1, 2024—Cited in IPR2024-00559, challenging U.S. Pat. No. 11,610,587.

Notice : Power of Attorney, Exhibit—6, Filed on Jul. 16, 2024—Cited in IPR2024-01031, challenging U.S. Pat. No. 7,049,850.

Notice : Power of Attorney, Exhibit—7, Filed on Jul. 16, 2024—Cited in IPR2024-01034, challenging U.S. Pat. No. 9,279,263.

Notice of Deposition of Chris Kyriakakis, Ph.D., Exhibit—17, Filed on Sep. 13, 2022—Cited in IPR2022-00302, challenging U.S. Pat. No. 9,609,424.

Notice of Deposition of Daniel P Anagnos, Exhibit—21, Filed on Dec. 14, 2022—Cited in IPR2022-00324, challenging U.S. Pat. No. 8,254,591.

Notice of Deposition of David Kleinschmidt, Exhibit—20, Filed on Dec. 2, 2022—Cited in IPR2022-00253, challenging U.S. Pat. No. 9,491,542.

Notice of Deposition of David Kleinschmidt, Exhibit—20, Filed on Dec. 2, 2022—Cited in IPR2022-00281, challenging U.S. Pat. No. 9,270,244.

(56)            References Cited

OTHER PUBLICATIONS

Notice of Deposition of Les E. Atlas, Ph.D., Exhibit—13, Filed on Mar. 9, 2023—Cited in IPR2022-01106, challenging U.S. Pat. No. 11,039,259.
Notice of Deposition of Les E. Atlas, Ph.D., Exhibit—17, Filed on Aug. 8, 2022—Cited in IPR2022-00324, challenging U.S. Pat. No. 8,254,591.
Notice of Deposition of Les E. Atlas, Ph.D., Exhibit—19, Filed on Aug. 4, 2022—Cited in IPR2022-00243, challenging U.S. Pat. No. 8,111,839.
Notice of Deposition of Les E. Atlas, Ph.D., Exhibit—20, Filed on Aug. 4, 2022—Cited in IPR2022-00242, challenging U.S. Pat. No. 8,111,839.
Notice of Deposition of Les E. Atlas, Ph.D.; Exhibit—15, Filed on Aug. 4, 2022—Cited in IPR2022-00234, challenging U.S. Pat. No. 9124982.
Notice of Deposition of Marshall Buck, Exhibit—19, Filed on Dec. 16, 2022—Cited in IPR2022-00388, challenging U.S. Pat. No. 10,966,015.
Notice of Deposition of Marshall Buck, Exhibit—20, Filed on Dec. 16, 2022—Cited in IPR2022-00369, challenging U.S. Pat. No. 10,405,082.
Notice of Deposition of Nathaniel Polish, Ph.D., Exhibit—18, Filed on Sep. 13, 2022—Cited in IPR2022-00253, challenging U.S. Pat. No. 9,491,542.
Notice of Deposition of Nathaniel Polish, Ph.D., Exhibit—18, Filed on Sep. 13, 2022—Cited in IPR2022-00281, challenging U.S. Pat. No. 9,270,244.
Notice of Deposition of Richard M. Stern, Ph.D., Exhibit—13, Filed on Feb. 28, 2023—Cited in IPR2022-01078, challenging U.S. Pat. No. 11,057,701.
Notice of Deposition of Richard M. Stern, Ph.D., Exhibit—14, Filed on Aug. 5, 2022—Cited in IPR2022-00282, challenging U.S. Pat. No. 8,315,400.
Notice of Deposition of Richard M. Stern, Ph.D., Exhibit—17, Filed on Oct. 14, 2022—Cited in IPR2022-00388, challenging U.S. Pat. No. 10,966,015.
Notice of Deposition of Richard M. Stern, Ph.D., Exhibit—18, Filed on Oct. 14, 2022—Cited in IPR2022-00369, challenging U.S. Pat. No. 10,405,082.
Notice of Filing Date Accorded To Petition, Exhibit—5, Filed on Dec. 23, 2021—Cited in IPR2022-00242, challenging U.S. Pat. No. 8,111,839.
Notice of Filing Date Accorded To Petition, Exhibit—5, Filed on Dec. 23, 2021—Cited in IPR2022-00243, challenging U.S. Pat. No. 8,111,839.
Notice of Ranking, Exhibit—4, Filed on Dec. 13, 2021—Cited in IPR2022-00242, challenging U.S. Pat. No. 8,111,839.
Notice of Ranking, Exhibit—4, Filed on Dec. 13, 2021—Cited in IPR2022-00243, challenging U.S. Pat. No. 8,111,839.
Notice of Ranking, Exhibit—4, Filed on Jun. 12, 2024—Cited in IPR2024-01003, challenging U.S. Pat. No. 9,191,083.
Notice of Ranking, Exhibit—4, Filed on Jun. 12, 2024—Cited in IPR2024-01004, challenging U.S. Pat. No. 9,614,943.
Notice Regarding Transcript of Markman Hearing, Exhibit—29, Filed on Oct. 19, 2023—Cited in IPR2022-01106, challenging U.S. Pat. No. 11,039,259.
Notice: Notice filing date accorded, Exhibit—5, Filed on Dec. 21, 2021—Cited in IPR2022-00282, challenging U.S. Pat. No. 8,315,400.
Notice: Notice filing date accorded, Exhibit—5, Filed on Feb. 27, 2024—Cited in IPR2024-00559, challenging U.S. Pat. No. 11,610,587.
Notice: Notice filing date accorded, Exhibit—5, Filed on Jun. 17, 2024—Cited in IPR2024-01003, challenging U.S. Pat. No. 9,191,083.
Notice: Notice filing date accorded, Exhibit—5, Filed on Jun. 18, 2024—Cited in IPR2024-01004, challenging U.S. Pat. No. 9,614,943.
Notice: Notice filing date accorded, Exhibit—6, Filed on Jan. 13, 2022—Cited in IPR2022-00302, challenging U.S. Pat. No. 9,609,424.
Notice: Notice filing date accorded, Exhibit—6, Filed on Jan. 13, 2022—Cited in IPR2022-00324, challenging U.S. Pat. No. 8,254,591.

Notice: Notice filing date accorded, Exhibit—6, Filed on Jan. 18, 2022—Cited in IPR2022-00253, challenging U.S. Pat. No. 9,491,542.
Notice: Notice filing date accorded, Exhibit—6, Filed on Jan. 18, 2022—Cited in IPR2022-00281, challenging U.S. Pat. No. 9,270,244.
Notice: Notice filing date accorded, Exhibit—6, Filed on Feb. 18, 2022—Cited in IPR2022-00410, challenging U.S. Pat. No. 10,979,836.
Notice: Notice filing date accorded, Exhibit—6, Filed on Jul. 7, 2022—Cited in IPR2022-01078, challenging U.S. Pat. No. 11,057,701.
Notice: Notice filing date accorded, Exhibit—6, Filed on Jul. 7, 2022—Cited in IPR2022-01099, challenging U.S. Pat. No. 11,244,666.
Notice: Notice filing date accorded, Exhibit—6, Filed on Jul. 8, 2022—Cited in IPR2022-01106, challenging U.S. Pat. No. 11,039,259.
Notice: Notice filing date accorded, Exhibit—7, Filed on Feb. 18, 2022—Cited in IPR2022-00388, challenging U.S. Pat. No. 10,966,015.
Notice: Notice filing date accorded, Exhibit—7, Filed on Jul. 7, 2022—Cited in IPR2022-01098, challenging U.S. Pat. No. 11,217,237.
Notice: Notice filing date accorded, Exhibit—8, Filed on Feb. 18, 2022—Cited in IPR2022-00369, challenging U.S. Pat. No. 10,405,082.
Notice: Notice filing date accorded, Exhibit—8, Filed on Jul. 24, 2024—Cited in IPR2024-01031, challenging U.S. Pat. No. 7,049,850.
Notice: Notice filing date accorded, Exhibit—9, Filed on Aug. 16, 2024—Cited in IPR2024-01034, challenging U.S. Pat. No. 9,279,263.
Notice: Notice filing date accorded; Exhibit—4, Filed on Dec. 21, 2021—Cited in IPR2022-00234, challenging U.S. Pat. No. 9124982.
Notice: Notice filing date accordedPaper4,Jun. 20, 2024—Cited in IPR2024-01033, challenging U.S. Pat. No. 8,434,966.
Notice: refund approved, Exhibit—13, Filed on Mar. 7, 2023—Cited in IPR2022-01099, challenging U.S. Pat. No. 11,244,666.
Notice: refund approved, Exhibit—14, Filed on Jan. 20, 2023—Cited in IPR2022-00410, challenging U.S. Pat. No. 10,979,836.
Notice: refund approved, Exhibit—14, Filed on Mar. 7, 2023—Cited in IPR2022-01098, challenging U.S. Pat. No. 11,217,237.
Notice: refund approved, Exhibit—18, Filed on Dec. 17, 2024—Cited in IPR2024-01003, challenging U.S. Pat. No. 9,191,083.
Notice: refund approved, Exhibit—18, Filed on Dec. 17, 2024—Cited in IPR2024-01004, challenging U.S. Pat. No. 9,614,943.
Notice: refund approved, Exhibit—18, Filed on Dec. 17, 2024—Cited in IPR2024-01031, challenging U.S. Pat. No. 7,049,850.
Notice: refund approved, Exhibit—19, Filed on Dec. 17, 2024—Cited in IPR2024-01034, challenging U.S. Pat. No. 9,279,263.
Notice: refund approvedPaper17, Dec. 17, 2024—Cited in IPR2024-01033, challenging U.S. Pat. No. 8,434,966.
Olwal 2005, Exhibit—1023, Filed on Dec. 21, 2021—Cited in IPR2022-00281, challenging U.S. Pat. No. 9,270,244.
Order Adopting Claim Construction Order, Exhibit—2015, Filed on Apr. 10, 2023—Cited in IPR2022-01106, challenging U.S. Pat. No. 11,039,259.
Order Clarifying Claim Construction Order, Exhibit—2014, Filed on Apr. 10, 2023—Cited in IPR2022-01106, challenging U.S. Pat. No. 11,039,259.
Order Conditionally Granting Patent Owner's Motion to Withdraw and Substitute Counsel 37 C.F.R. § 42.10, Exhibit—12, Filed on Dec. 9, 2024—Cited in IPR2024-01003, challenging U.S. Pat. No. 9,191,083.
Order Conditionally Granting Patent Owner's Motion to Withdraw and Substitute Counsel 37 C.F.R. § 42.10, Exhibit—12, Filed on Dec. 9, 2024—Cited in IPR2024-01004, challenging U.S. Pat. No. 9,614,943.
Order Conditionally Granting Patent Owner's Motion to Withdraw and Substitute Counsel 37 C.F.R. § 42.10, Exhibit—12, Filed on Dec. 9, 2024—Cited in IPR2024-01031, challenging U.S. Pat. No. 7,049,850.
Order Conditionally Granting Patent Owner's Motion to Withdraw and Substitute Counsel 37 C.F.R. § 42.10, Exhibit—13, Filed on Dec. 9, 2024—Cited in IPR2024-01034, challenging U.S. Pat. No. 9,279,263.
Order Conditionally Granting Patent Owner's Motion to Withdraw and Substitute Counsel 37 C.F.R. § 42.10Paper11, Dec. 9, 2024—Cited in IPR2024-01033, challenging U.S. Pat. No. 8,434,966.
Order Conditionally Granting Patent Owner's Motion to Withdraw and Substitute Counsel, Exhibit—13, Filed on Dec. 5, 2024—Cited in IPR2024-00559, challenging U.S. Pat. No. 11,610,587.

(56) References Cited

OTHER PUBLICATIONS

Order Granting Patent Owner's Motions for Pro Hac Vice Admission of Roy Falik 37 C.F.R. § 42.10(c), Exhibit—9, Filed on Sep. 23, 2024—Cited in IPR2024-01031, challenging U.S. Pat. No. 7,049,850.

Order Trial Hearing 37 C.F.R. 42.70, Exhibit—23, Filed on Feb. 6, 2023—Cited in IPR2022-00282, challenging U.S. Pat. No. 8,315,400.

Order Trial Hearing 37 C.F.R. 42.70; Exhibit—24, Filed on Feb. 6, 2023—Cited in IPR2022-00234, challenging U.S. Pat. No. 9,124,982.

Order Trial Hearing 37 C.F.R. § 42.70, Exhibit—24, Filed on Mar. 1, 2023—Cited in IPR2022-00302, challenging U.S. Pat. No. 9,609,424.

Order Trial Hearing 37 C.F.R. § 42.70, Exhibit—26, Filed on Oct. 10, 2023—Cited in IPR2022-01106, challenging U.S. Pat. No. 11,039,259.

Order Trial Hearing 37 C.F.R. § 42.70, Exhibit—26, Filed on Mar. 1, 2023—Cited in IPR2022-00324, challenging U.S. Pat. No. 8,254,591.

Order Trial Hearing 37 C.F.R. sec 42.70, Exhibit—28, Filed on Feb. 8, 2023—Cited in IPR2022-00243, challenging U.S. Pat. No. 8,111,839.

Order Trial Hearing 37 C.F.R. sec 42.70, Exhibit—29, Filed on Feb. 8, 2023—Cited in IPR2022-00242, challenging U.S. Pat. No. 8,111,839.

Order Trial Hearing, Exhibit—25, Filed on Mar. 1, 2023—Cited in IPR2022-00281, challenging U.S. Pat. No. 9,270,244.

Order Vacating Standing Orders, Exhibit—2005, Filed on Jul. 1, 2022—Cited in IPR2022-00253, challenging U.S. Pat. No. 9,491,542.

Order Vacating Standing Orders, Exhibit—2005, Filed on Jul. 1, 2022—Cited in IPR2022-00281, challenging U.S. Pat. No. 9,270,244.

Order Vacating Standing Orders, Exhibit—2005, Filed on Jul. 1, 2022—Cited in IPR2022-00302, challenging U.S. Pat. No. 9,609,424.

Order Vacating Standing Orders, Exhibit—2005, Filed on Jul. 1, 2022—Cited in IPR2022-00324, challenging U.S. Pat. No. 8,254,591.

Order Vacating Standing Orders, Exhibit—2006, Filed on Jul. 1, 2022—Cited in IPR2022-00369, challenging U.S. Pat. No. 10,405,082.

Order Vacating Standing Orders, Exhibit—2006, Filed on Jul. 1, 2022—Cited in IPR2022-00410, challenging U.S. Pat. No. 10,979,836.

Order Vacating Standing Orders, Exhibit—2007, Filed on Jul. 1, 2022—Cited in IPR2022-00388, challenging U.S. Pat. No. 10,966,015.

Order: Conduct of the Proceeding 37 C.F.R. sec. 42.5, Exhibit—18, Filed on Jan. 5, 2023—Cited in IPR2022-00282, challenging U.S. Pat. No. 8,315,400.

Order: Granting Patent Owner's Motion for Pro Hac Vice Admission of Roy Falik 37 C.F.R. § 42.10, Exhibit—10, Filed on Oct. 4, 2024—Cited in IPR2024-01034, challenging U.S. Pat. No. 9,279,263.

Order: Granting Patent Owner's Motions for Admission Pro Hac Vice of Roy Falik 37 C.F.R. § 42.10, Exhibit—9, Filed on Oct. 4, 2024—Cited in IPR2024-01004, challenging U.S. Pat. No. 9,614,943.

Order: Granting Patent Owner's Motions for Admission Pro Hac Vice of Roy Falik 37 C.F.R. § 42.10Paper8, Oct. 4, 2024—Cited in IPR2024-01033, challenging U.S. Pat. No. 8,434,966.

Order: on Motion, Exhibit—9, Filed on Oct. 4, 2024—Cited in IPR2024-01003, challenging U.S. Pat. No. 9,191,083.

Order: Order Setting Oral Argument 37 C.F.R. § 42.70, Exhibit—22, Filed on Aug. 21, 2023—Cited in IPR2022-01078, challenging U.S. Pat. No. 11,057,701.

Order: Other, Exhibit—12, Filed on Feb. 22, 2023—Cited in IPR2022-01078, challenging U.S. Pat. No. 11,057,701.

Order: Panel Change Order, Exhibit—22, Filed on Feb. 10, 2023—Cited in IPR2022-00253, challenging U.S. Pat. No. 9,491,542.

Order: Scheduling Order, Exhibit—13, Filed on Jun. 17, 2022—Cited in IPR2022-00282, challenging U.S. Pat. No. 8,315,400.

Order: Scheduling Order; Exhibit—13, Filed on Jun. 17, 2022—Cited in IPR2022-00234, challenging U.S. Pat. No. 9124982.

Order: Trial Hearing (Revised), Exhibit—27, Filed on Mar. 3, 2023—Cited in IPR2022-00324, challenging U.S. Pat. No. 8,254,591.

Order: Trial Hearing—37 CFR 42.70, Exhibit—26, Filed on Mar. 2, 2023—Cited in IPR2022-00253, challenging U.S. Pat. No. 9,491,542.

Order: Hearing Order, Exhibit—26, Filed on Apr. 7, 2023—Cited in IPR2022-00388, challenging U.S. Pat. No. 10,966,015.

Order: Hearing Order, Exhibit—27, Filed on Apr. 7, 2023—Cited in IPR2022-00369, challenging U.S. Pat. No. 10,405,082.

Order: Trial Hearing (Revised), Exhibit—25, Filed on Mar. 3, 2023—Cited in IPR2022-00302, challenging U.S. Pat. No. 9,609,424.

Osha, Appx A to 1910.95—Noise Exposure Computation, Exhibit—2014, Filed on Sep. 13, 2022—Cited in IPR2022-00242, challenging U.S. Pat. No. 8,111,839.

Osha, Appx A to 1910.95—Noise Exposure Computation; Exhibit—2013, Filed on Sep. 9, 2022—Cited in IPR2022-00234, challenging U.S. Pat. No. 9,124,982.

Oshana, Chapters 3-4, Exhibit—1017, Filed on Jan. 14, 2022—Cited in IPR2022-00410, challenging U.S. Pat. No. 10,979,836.

Other: Hearing transcript, Exhibit—25, Filed on Oct. 16, 2023—Cited in IPR2022-01078, challenging U.S. Pat. No. 11,057,701.

Other: Hearing transcript, Exhibit—27, Filed on Apr. 18, 2023—Cited in IPR2022-00282, challenging U.S. Pat. No. 8,315,400.

Other: Hearing transcript, Exhibit—30, Filed on Jul. 25, 2023—Cited in IPR2022-00388, challenging U.S. Pat. No. 10,966,015.

Other: Hearing transcript, Exhibit—31, Filed on Dec. 13, 2023—Cited in IPR2022-01106, challenging U.S. Pat. No. 11,039,259.

Other: Hearing transcript, Exhibit—31, Filed on Jul. 25, 2023—Cited in IPR2022-00369, challenging U.S. Pat. No. 10,405,082.

Other: Hearing transcript, Exhibit—32, Filed on Jul. 3, 2023—Cited in IPR2022-00324, challenging U.S. Pat. No. 8,254,591.

Other: Hearing transcript, Exhibit—32, Filed on Jul. 31, 2023—Cited in IPR2022-00281, challenging U.S. Pat. No. 9,270,244.

Other: Hearing transcript, Exhibit—32, Filed on Jul. 6, 2023—Cited in IPR2022-00253, challenging U.S. Pat. No. 9,491,542.

Other: Hearing transcript, Exhibit—34, Filed on Jun. 1, 2023—Cited in IPR2022-00243, challenging U.S. Pat. No. 8,111,839.

Other: Hearing transcript, Exhibit—34, Filed on Jun. 22, 2023—Cited in IPR2022-00302, challenging U.S. Pat. No. 9,609,424.

Other: Hearing transcript, Exhibit—35, Filed on Jun. 1, 2023—Cited in IPR2022-00242, challenging U.S. Pat. No. 8,111,839.

Other: Hearing transcript, Exhibit—36, Filed on Jul. 6, 2023—Cited in IPR2022-00302, challenging U.S. Pat. No. 9,609,424.

Other: Hearing transcript; Exhibit—28, Filed on Apr. 18, 2023—Cited in IPR2022-00234, challenging U.S. Pat. No. 9124982.

Other: Order Granting Motion for Leave to File Corrected Petition, Exhibit—10, Filed on Feb. 2, 2022—Cited in IPR2022-00243, challenging U.S. Pat. No. 8,111,839.

Other: Order Granting Motion for Leave to File Corrected Petition, Exhibit—11, Filed on Feb. 2, 2022—Cited in IPR2022-00242, challenging U.S. Pat. No. 8,111,839.

Other: Fed Circuit mandate, Exhibit—34, Filed on Jun. 27, 2024—Cited in IPR2022-01106, challenging U.S. Pat. No. 11,039,259.

Other: Fed Circuit mandate, Exhibit—36, Filed on Jun. 27, 2024—Cited in IPR2022-00324, challenging U.S. Pat. No. 8,254,591.

Oxford Dictionary of Elecs and Electrical Eng (excerpts), Exhibit—2005, Filed on Mar. 21, 2022—Cited in IPR2022-00282, challenging U.S. Pat. No. 8,315,400.

P.R. 4-5(d) Joint Claim Construction Chart, Exhibit—2009, Filed on Feb. 22, 2023—Cited in IPR2022-00253, challenging U.S. Pat. No. 9,491,542.

P.R. 4-5(d) Joint Claim Construction Chart, Exhibit—2009, Filed on Feb. 22, 2023—Cited in IPR2022-00281, challenging U.S. Pat. No. 9,270,244.

Panel Change Order, Exhibit—12, Filed on Feb. 3, 2023—Cited in IPR2022-01106, challenging U.S. Pat. No. 11,039,259.

Patent Owner Brief Regarding Interim Procedure for Discretionary Denials, Exhibit—12, Filed on Jul. 1, 2022—Cited in IPR2022-00253, challenging U.S. Pat. No. 9,491,542.

Patent Owner Response; Exhibit—17, Filed on Sep. 9, 2022—Cited in IPR2022-00234, challenging U.S. Pat. No. 9124982.

Patent Owner Stanton Techiya LLC's Mandatory NoticePaper6,Jul. 3, 2024—Cited in IPR2024-01033, challenging U.S. Pat. No. 8,434,966.

Patent Owner Staton Techiya, LLC's Mandatory Notice, Exhibit—7, Filed on Jul. 3, 2024—Cited in IPR2024-01004, challenging U.S. Pat. No. 9,614,943.

Patent Owner Staton Techiya, LLC's Mandatory Notices, Exhibit—7, Filed on Jul. 3, 2024—Cited in IPR2024-01003, challenging U.S. Pat. No. 9,191,083.

Patent Owner Staton Techiya, LLC's Motion for the Pro Hac Vice Admission of Roy Falik, Exhibit—8, Filed on Jul. 5, 2024—Cited in IPR2024-01003, challenging U.S. Pat. No. 9,191,083.

(56)　　　　　References Cited

OTHER PUBLICATIONS

Patent Owner Staton Techiya, LLC's Motion for the Pro Hac Vice Admission of Roy Falik, Exhibit—8, Filed on Jul. 5, 2024—Cited in IPR2024-01004, challenging U.S. Pat. No. 9,614,943.

Patent Owner Staton Techiya, LLC's Motion for the Pro Hac Vice Admission of Roy FalikPaper7,Jul. 5, 2024—Cited in IPR2024-01033, challenging U.S. Pat. No. 8,434,966.

Patent Owner Staton Techiya, LLC's Power of Attorney, Exhibit—6, Filed on Jul. 3, 2024—Cited in IPR2024-01003, challenging U.S. Pat. No. 9,191,083.

Patent Owner Staton Techiya, LLC's Power of Attorney, Exhibit—6, Filed on Jul. 3, 2024—Cited in IPR2024-01004, challenging U.S. Pat. No. 9,614,943.

Patent Owner Staton Techiya, LLC's Power of AttorneyPaper5,Jul. 3, 2024—Cited in IPR2024-01033, challenging U.S. Pat. No. 8,434,966.

Patent Owner's Brief Regarding Interim Procedure for Discretionary Denials, Exhibit—11, Filed on Jul. 1, 2022—Cited in IPR2022-00410, challenging U.S. Pat. No. 10,979,836.

Patent Owner's Brief Regarding Interim Procedure for Discretionary Denials, Exhibit—12, Filed on Jul. 1, 2022—Cited in IPR2022-00281, challenging U.S. Pat. No. 9,270,244.

Patent Owner's Brief Regarding Interim Procedure for Discretionary Denials, Exhibit—12, Filed on Jul. 1, 2022—Cited in IPR2022-00302, challenging U.S. Pat. No. 9,609,424.

Patent Owner's Brief Regarding Interim Procedure for Discretionary Denials, Exhibit—12, Filed on Jul. 1, 2022—Cited in IPR2022-00324, challenging U.S. Pat. No. 8,254,591.

Patent Owner's Brief Regarding Interim Procedure for Discretionary Denials, Exhibit—12, Filed on Jul. 1, 2022—Cited in IPR2022-00388, challenging U.S. Pat. No. 10,966,015.

Patent Owner's Brief Regarding Interim Procedure for Discretionary Denials, Exhibit—13, Filed on Jul. 1, 2022—Cited in IPR2022-00369, challenging U.S. Pat. No. 10,405,082.

Patent Owner's Corrected Notice of Appeal, Exhibit—38, Filed on Aug. 15, 2023—Cited in IPR2022-00243, challenging U.S. Pat. No. 8,111,839.

Patent Owner's Demonstratives, Exhibit—2008, Filed on Apr. 11, 2023—Cited in IPR2022-00302, challenging U.S. Pat. No. 9,609,424.

Patent Owner's Demonstratives, Exhibit—2010, Filed on Apr. 12, 2023—Cited in IPR2022-00253, challenging U.S. Pat. No. 9,491,542.

Patent Owner's Demonstratives, Exhibit—2010, Filed on Apr. 13, 2023—Cited in IPR2022-00281, challenging U.S. Pat. No. 9,270,244.

Patent Owner's Demonstratives, Exhibit—2010, Filed on Apr. 4, 2023—Cited in IPR2022-00324, challenging U.S. Pat. No. 8,254,591.

Patent Owner's Demonstratives, Exhibit—2012, Filed on May 9, 2023—Cited in IPR2022-00369, challenging U.S. Pat. No. 10,405,082.

Patent Owner's Demonstratives, Exhibit—2012, Filed on May 9, 2023—Cited in IPR2022-00388, challenging U.S. Pat. No. 10,966,015.

Patent Owner's Demonstratives, Exhibit—2014, Filed on Mar. 14, 2023—Cited in IPR2022-00282, challenging U.S. Pat. No. 8,315,400.

Patent Owner's Demonstratives, Exhibit—2014, Filed on Sep. 25, 2023—Cited in IPR2022-01078, challenging U.S. Pat. No. 11,057,701.

Patent Owner's Demonstratives, Exhibit—2015, Filed on Mar. 16, 2023—Cited in IPR2022-00242, challenging U.S. Pat. No. 8,111,839.

Patent Owner's Demonstratives, Exhibit—2015, Filed on Mar. 16, 2023—Cited in IPR2022-00243, challenging U.S. Pat. No. 8,111,839.

Patent Owner's Demonstratives, Exhibit—2021, Filed on Oct. 11, 2023—Cited in IPR2022-01106, challenging U.S. Pat. No. 11,039,259.

Patent Owner's Demonstratives; Exhibit—2014, Filed on Mar. 14, 2023—Cited in IPR2022-00234, challenging U.S. Pat. No. 9,124,982.

Patent Owner's Mandatory Notice under 37 C.F.R. 42.8, Exhibit—5, Filed on Jan. 19, 2022—Cited in IPR2022-00388, challenging U.S. Pat. No. 10,966,015.

Patent Owner's Mandatory Notice under 37 C.F.R. 42.8, Exhibit—5, Filed on Jan. 19, 2022—Cited in IPR2022-00410, challenging U.S. Pat. No. 10,979,836.

Patent Owner's Mandatory Notice under 37 C.F.R. 42.8, Exhibit—5, Filed on Dec. 28, 2021—Cited in IPR2022-00253, challenging U.S. Pat. No. 9,491,542.

Patent Owner's Mandatory Notice under 37 C.F.R. 42.8, Exhibit—5, Filed on Dec. 28, 2021—Cited in IPR2022-00281, challenging U.S. Pat. No. 9,270,244.

Patent Owner's Mandatory Notice under 37 C.F.R. 42.8, Exhibit—5, Filed on Dec. 28, 2021—Cited in IPR2022-00302, challenging U.S. Pat. No. 9,609,424.

Patent Owner's Mandatory Notice under 37 C.F.R. 42.8, Exhibit—5, Filed on Dec. 28, 2021—Cited in IPR2022-00324, challenging U.S. Pat. No. 8,254,591.

Patent Owner's Mandatory Notice under 37 C.F.R. 42.8, Exhibit—5, Filed on Jun. 22, 2022—Cited in IPR2022-01078, challenging U.S. Pat. No. 11,057,701.

Patent Owner's Mandatory Notice under 37 C.F.R. 42.8, Exhibit—5, Filed on Jun. 22, 2022—Cited in IPR2022-01099, challenging U.S. Pat. No. 11,244,666.

Patent Owner's Mandatory Notice under 37 C.F.R. 42.8, Exhibit—5, Filed on Jun. 22, 2022—Cited in IPR2022-01106, challenging U.S. Pat. No. 11,039,259.

Patent Owner's Mandatory Notice under 37 C.F.R. 42.8, Exhibit—6, Filed on Jun. 22, 2022—Cited in IPR2022-01098, challenging U.S. Pat. No. 11,217,237.

Patent Owner's Mandatory Notice under 37 C.F.R. 42.8, Exhibit—7, Filed on Dec. 28, 2021—Cited in IPR2022-00242, challenging U.S. Pat. No. 8,111,839.

Patent Owner's Mandatory Notice under 37 C.F.R. 42.8, Exhibit—7, Filed on Dec. 28, 2021—Cited in IPR2022-00243, challenging U.S. Pat. No. 8,111,839.

Patent Owner's Mandatory Notice under 37 C.F.R. 42.8, Exhibit—7, Filed on Dec. 28, 2021—Cited in IPR2022-00282, challenging U.S. Pat. No. 8,315,400.

Patent Owner's Mandatory Notice under 37 C.F.R. 42.8; Exhibit—6, Filed on Dec. 28, 2021—Cited in IPR2022-00234, challenging U.S. Pat. No. 9,124,982.

Patent Owner's Mandatory Notice under 37 CFR 42.8, Exhibit—6, Filed on Jan. 19, 2022—Cited in IPR2022-00369, challenging U.S. Pat. No. 10,405,082.

Patent Owner's Notice of Appeal, Exhibit—30, Filed on Aug. 11, 2023—Cited in IPR2022-00282, challenging U.S. Pat. No. 8,315,400.

Patent Owner's Notice of Appeal, Exhibit—33, Filed on Mar. 5, 2024—Cited in IPR2022-01106, challenging U.S. Pat. No. 11,039,259.

Patent Owner's Notice of Appeal, Exhibit—33, Filed on Sep. 8, 2023—Cited in IPR2022-00281, challenging U.S. Pat. No. 9,270,244.

Patent Owner's Notice of Appeal, Exhibit—34, Filed on Sep. 8, 2023—Cited in IPR2022-00253, challenging U.S. Pat. No. 9,491,542.

Patent Owner's Notice of Appeal, Exhibit—34, Filed on Sep. 8, 2023—Cited in IPR2022-00324, challenging U.S. Pat. No. 8,254,591.

Patent Owner's Notice of Appeal, Exhibit—38, Filed on Aug. 15, 2023—Cited in IPR2022-00242, challenging U.S. Pat. No. 8,111,839.

Patent Owner's Notice of Appeal; Exhibit—31, Filed on Au. 11, 2023—Cited in IPR2022-00234, challenging U.S. Pat. No. 9,124,982.

Patent Owner's Notice of Cross-Appeal, Exhibit—39, Filed on Aug. 23, 2023—Cited in IPR2022-00302, challenging U.S. Pat. No. 9,609,424.

Patent Owner's Power of Attorney, Exhibit—4, Filed on Jan. 19, 2022—Cited in IPR2022-00388, challenging U.S. Pat. No. 10,966,015.

Patent Owner's Power of Attorney, Exhibit—4, Filed on Jan. 19, 2022—Cited in IPR2022-00410, challenging U.S. Pat. No. 10,979,836.

Patent Owner's Power of Attorney, Exhibit—4, Filed on Dec. 28, 2021—Cited in IPR2022-00253, challenging U.S. Pat. No. 9,491,542.

Patent Owner's Power of Attorney, Exhibit—4, Filed on Dec. 28, 2021—Cited in IPR2022-00281, challenging U.S. Pat. No. 9,270,244.

Patent Owner's Power of Attorney, Exhibit—4, Filed on Dec. 28, 2021—Cited in IPR2022-00302, challenging U.S. Pat. No. 9,609,424.

Patent Owner's Power of Attorney, Exhibit—4, Filed on Dec. 28, 2021—Cited in IPR2022-00324, challenging U.S. Pat. No. 8,254,591.

Patent Owner's Power of Attorney, Exhibit—4, Filed on Jun. 22, 2022—Cited in IPR2022-01078, challenging U.S. Pat. No. 11,057,701.

Patent Owner's Power of Attorney, Exhibit—4, Filed on Jun. 22, 2022—Cited in IPR2022-01099, challenging U.S. Pat. No. 11,244,666.

Patent Owner's Power of Attorney, Exhibit—4, Filed on Jun. 22, 2022—Cited in IPR2022-01106, challenging U.S. Pat. No. 11,039,259.

Patent Owner's Power of Attorney, Exhibit—5, Filed on Jan. 19, 2022—Cited in IPR2022-00369, challenging U.S. Pat. No. 10,405,082.

(56) References Cited

OTHER PUBLICATIONS

Patent Owner's Power of Attorney, Exhibit—5, Filed on Jun. 22, 2022—Cited in IPR2022-01098, challenging U.S. Pat. No. 11,217,237.

Patent Owner's Power of Attorney, Exhibit—6, Filed on Dec. 28, 2021—Cited in IPR2022-00242, challenging U.S. Pat. No. 8,111,839.

Patent Owner's Power of Attorney, Exhibit—6, Filed on Dec. 28, 2021—Cited in IPR2022-00243, challenging U.S. Pat. No. 8,111,839.

Patent Owner's Power of Attorney, Exhibit—6, Filed on Dec. 28, 2021—Cited in IPR2022-00282, challenging U.S. Pat. No. 8,315,400.

Patent Owner's Power of Attorney; Exhibit—5, Filed on Dec. 28, 2021—Cited in IPR2022-00234, challenging U.S. Pat. No. 9,124,982.

Patent Owner's Preliminary Response, Exhibit—12, Filed on Mar. 23, 2022—Cited in IPR2022-00243, challenging U.S. Pat. No. 8,111,839.

Patent Owner's Preliminary Response, Exhibit—13, Filed on Mar. 23, 2022—Cited in IPR2022-00242, challenging U.S. Pat. No. 8,111,839.

Patent Owner's Preliminary Response, Exhibit—7, Filed on Oct. 11, 2022—Cited in IPR2022-01106, challenging U.S. Pat. No. 11,039,259.

Patent Owner's Preliminary Response, Exhibit—7, Filed on Oct. 7, 2022—Cited in IPR2022-01078, challenging U.S. Pat. No. 11,057,701.

Patent Owner's Preliminary Response, Exhibit—7, Filed on Oct. 7, 2022—Cited in IPR2022-01099, challenging U.S. Pat. No. 11,244,666.

Patent Owner's Preliminary Response, Exhibit—7, Filed on May 18, 2022—Cited in IPR2022-00410, challenging U.S. Pat. No. 10,979,836.

Patent Owner's Preliminary Response, Exhibit—8, Filed on Oct. 7, 2022—Cited in IPR2022-01098, challenging U.S. Pat. No. 11,217,237.

Patent Owner's Preliminary Response, Exhibit—8, Filed on Apr. 13, 2022—Cited in IPR2022-00302, challenging U.S. Pat. No. 9,609,424.

Patent Owner's Preliminary Response, Exhibit—8, Filed on Apr. 13, 2022—Cited in IPR2022-00324, challenging U.S. Pat. No. 8,254,591.

Patent Owner's Preliminary Response, Exhibit—8, Filed on Apr. 18, 2022—Cited in IPR2022-00253, challenging U.S. Pat. No. 9,491,542.

Patent Owner's Preliminary Response, Exhibit—8, Filed on Apr. 18, 2022—Cited in IPR2022-00281, challenging U.S. Pat. No. 9,270,244.

Patent Owner's Preliminary Response, Exhibit—8, Filed on May 18, 2022—Cited in IPR2022-00388, challenging U.S. Pat. No. 10,966,015.

Patent Owner's Preliminary Response, Exhibit—9, Filed on Mar. 21, 2022—Cited in IPR2022-00282, challenging U.S. Pat. No. 8,315,400.

Patent Owner's Preliminary Response, Exhibit—9, Filed on May 18, 2022—Cited in IPR2022-00369, challenging U.S. Pat. No. 10,405,082.

Patent Owner's Preliminary Response; Exhibit—9, Filed on Mar. 21, 2022—Cited in IPR2022-00234, challenging U.S. Pat. No. 9,124,982.

Patent Owner's Preliminary Sur-Reply, Exhibit—10, Filed on Nov. 22, 2022—Cited in IPR2022-01098, challenging U.S. Pat. No. 11,217,237.

Patent Owner's Preliminary Sur-Reply, Exhibit—10, Filed on May 19, 2022—Cited in IPR2022-00302, challenging U.S. Pat. No. 9,609,424.

Patent Owner's Preliminary Sur-Reply, Exhibit—10, Filed on May 20, 2022—Cited in IPR2022-00324, challenging U.S. Pat. No. 8,254,591.

Patent Owner's Preliminary Sur-Reply, Exhibit—10, Filed on May 31, 2022—Cited in IPR2022-00253, challenging U.S. Pat. No. 9,491,542.

Patent Owner's Preliminary Sur-Reply, Exhibit—10, Filed on Jun. 23, 2022—Cited in IPR2022-00388, challenging U.S. Pat. No. 10,966,015.

Patent Owner's Preliminary Sur-Reply, Exhibit—10, Filed on Jun. 7, 2022—Cited in IPR2022-00281, challenging U.S. Pat. No. 9,270,244.

Patent Owner's Preliminary Sur-Reply, Exhibit—11, Filed on Apr. 29, 2022—Cited in IPR2022-00282, challenging U.S. Pat. No. 8,315,400.

Patent Owner's Preliminary Sur-Reply, Exhibit—11, Filed on Jun. 23, 2022—Cited in IPR2022-00369, challenging U.S. Pat. No. 10,405,082.

Patent Owner's Preliminary Sur-Reply, Exhibit—14, Filed on Apr. 29, 2022—Cited in IPR2022-00243, challenging U.S. Pat. No. 8,111,839.

Patent Owner's Preliminary Sur-Reply, Exhibit—15, Filed on Apr. 29, 2022—Cited in IPR2022-00242, challenging U.S. Pat. No. 8,111,839.

Patent Owner's Preliminary Sur-Reply, Exhibit—9, Filed on Nov. 17, 2022—Cited in IPR2022-01099, challenging U.S. Pat. No. 11,244,666.

Patent Owner's Preliminary Sur-Reply, Exhibit—9, Filed on Nov. 18, 2022—Cited in IPR2022-01078, challenging U.S. Pat. No. 11,057,701.

Patent Owner's Preliminary Sur-Reply, Exhibit—9, Filed on Nov. 18, 2022—Cited in IPR2022-01106, challenging U.S. Pat. No. 11,039,259.

Patent Owner's Preliminary Sur-Reply, Exhibit—9, Filed on Jun. 23, 2022—Cited in IPR2022-00410, challenging U.S. Pat. No. 10,979,836.

Patent Owner's Preliminary Sur-Reply; Exhibit—11, Filed on Apr. 29, 2022—Cited in IPR2022-00234, challenging U.S. Pat. No. 9,124,982.

Patent Owner's Request for Oral Argument, Exhibit—21, Filed on Feb. 3, 2023—Cited in IPR2022-00282, challenging U.S. Pat. No. 8,315,400.

Patent Owner's Request for Oral Argument, Exhibit—21, Filed on Aug. 17, 2023—Cited in IPR2022-01078, challenging U.S. Pat. No. 11,057,701.

Patent Owner's Request for Oral Argument, Exhibit—22, Filed on Feb. 28, 2023—Cited in IPR2022-00302, challenging U.S. Pat. No. 9,609,424.

Patent Owner's Request for Oral Argument, Exhibit—23, Filed on Mar. 1, 2023—Cited in IPR2022-00281, challenging U.S. Pat. No. 9,270,244.

Patent Owner's Request for Oral Argument, Exhibit—24, Filed on Feb. 28, 2023—Cited in IPR2022-00324, challenging U.S. Pat. No. 8,254,591.

Patent Owner's Request for Oral Argument, Exhibit—24, Filed on Mar. 1, 2023—Cited in IPR2022-00253, challenging U.S. Pat. No. 9,491,542.

Patent Owner's Request for Oral Argument, Exhibit—24, Filed on Apr. 4, 2023—Cited in IPR2022-00388, challenging U.S. Pat. No. 10,966,015.

Patent Owner's Request for Oral Argument, Exhibit—25, Filed on Apr. 4, 2023—Cited in IPR2022-00369, challenging U.S. Pat. No. 10,405,082.

Patent Owner's Request for Oral Argument, Exhibit—25, Filed on Aug. 28, 2023—Cited in IPR2022-01106, challenging U.S. Pat. No. 11,039,259.

Patent Owner's Request for Oral Argument, Exhibit—26, Filed on Feb. 7, 2023—Cited in IPR2022-00243, challenging U.S. Pat. No. 8,111,839.

Patent Owner's Request for Oral Argument, Exhibit—27, Filed on Feb. 7, 2023—Cited in IPR2022-00242, challenging U.S. Pat. No. 8,111,839.

Patent Owner's Request for Oral Argument; Exhibit—22, Filed on Feb. 3, 2023—Cited in IPR2022-00234, challenging U.S. Pat. No. 9,124,982.

Patent Owner's Response, Exhibit—14, Filed on Mar. 23, 2023—Cited in IPR2022-01078, challenging U.S. Pat. No. 11,057,701.

Patent Owner's Response, Exhibit—15, Filed on Sep. 9, 2022—Cited in IPR2022-00282, challenging U.S. Pat. No. 8,315,400.

Patent Owner's Response, Exhibit—16, Filed on Dec. 6, 2024—Cited in IPR2024-00559, challenging U.S. Pat. No. 11,610,587.

Patent Owner's Response, Exhibit—17, Filed on Apr. 10, 2023—Cited in IPR2022-01106, challenging U.S. Pat. No. 11,039,259.

Patent Owner's Response, Exhibit—18, Filed on Oct. 17, 2022—Cited in IPR2022-00302, challenging U.S. Pat. No. 9,609,424.

(56) References Cited

OTHER PUBLICATIONS

Patent Owner's Response, Exhibit—18, Filed on Nov. 8, 2022—Cited in IPR2022-00388, challenging U.S. Pat. No. 10,966,015.
Patent Owner's Response, Exhibit—19, Filed on Oct. 19, 2022—Cited in IPR2022-00253, challenging U.S. Pat. No. 9,491,542.
Patent Owner's Response, Exhibit—19, Filed on Oct. 19, 2022—Cited in IPR2022-00281, challenging U.S. Pat. No. 9,270,244.
Patent Owner's Response, Exhibit—19, Filed on Nov. 8, 2022—Cited in IPR2022-00369, challenging U.S. Pat. No. 10,405,082.
Patent Owner's Response, Exhibit—20, Filed on Oct. 17, 2022—Cited in IPR2022-00324, challenging U.S. Pat. No. 8,254,591.
Patent Owner's Response, Exhibit—21, Filed on Sep. 13, 2022—Cited in IPR2022-00243, challenging U.S. Pat. No. 8,111,839.
Patent Owner's Response, Exhibit—22, Filed on Sep. 13, 2022—Cited in IPR2022-00242, challenging U.S. Pat. No. 8,111,839.
Patent Owner's Sur-Reply, Exhibit—19, Filed on Jan. 12, 2023—Cited in IPR2022-00282, challenging U.S. Pat. No. 8,315,400.
Patent Owner's Sur-Reply, Exhibit—19, Filed on Jul. 26, 2023—Cited in IPR2022-01078, challenging U.S. Pat. No. 11,057,701.
Patent Owner's Sur-Reply, Exhibit—21, Filed on Feb. 21, 2023—Cited in IPR2022-00302, challenging U.S. Pat. No. 9,609,424.
Patent Owner's Sur-Reply, Exhibit—22, Filed on Feb. 22, 2023—Cited in IPR2022-00281, challenging U.S. Pat. No. 9,270,244.
Patent Owner's Sur-Reply, Exhibit—22, Filed on Mar. 13, 2023—Cited in IPR2022-00388, challenging U.S. Pat. No. 10,966,015.
Patent Owner's Sur-Reply, Exhibit—23, Filed on Feb. 20, 2023—Cited in IPR2022-00324, challenging U.S. Pat. No. 8,254,591.
Patent Owner's Sur-Reply, Exhibit—23, Filed on Feb. 22, 2023—Cited in IPR2022-00253, challenging U.S. Pat. No. 9,491,542.
Patent Owner's Sur-Reply, Exhibit—23, Filed on Mar. 13, 2023—Cited in IPR2022-00369, challenging U.S. Pat. No. 10,405,082.
Patent Owner's Sur-Reply, Exhibit—23, Filed on Aug. 14, 2023—Cited in IPR2022-01106, challenging U.S. Pat. No. 11,039,259.
Patent Owner's Sur-Reply, Exhibit—25, Filed on Jan. 17, 2023—Cited in IPR2022-00243, challenging U.S. Pat. No. 8,111,839.
Patent Owner's Sur-Reply, Exhibit—26, Filed on Jan. 12, 2023—Cited in IPR2022-00242, challenging U.S. Pat. No. 8,111,839.
Patent Owner's Sur-Reply; Exhibit—21, Filed on Jan. 13, 2023—Cited in IPR2022-00234, challenging U.S. Pat. No. 9,124,982.
Patent Owner's Unopposed Motion To Withdraw and Substitute Counsel Under 37 CFR 11.116, Exhibit—11, Filed on Nov. 13, 2024—Cited in IPR2024-00559, challenging U.S. Pat. No. 11,610,587.
Patent Owner's Unopposed Motion to Withdraw and Substitute Counsel Under 37 CFR 11.116, Exhibit—11, Filed on Nov. 21, 2024—Cited in IPR2024-01003, challenging U.S. Pat. No. 9,191,083.
Patent Owner's Unopposed Motion To Withdraw and Substitute Counsel Under 37 CFR 11.116, Exhibit—11, Filed on Nov. 21, 2024—Cited in IPR2024-01004, challenging U.S. Pat. No. 9,614,943.
Patent Owner's Unopposed Motion To Withdraw and Substitute Counsel Under 37 CFR 11.116, Exhibit—11, Filed on Nov. 21, 2024—Cited in IPR2024-01031, challenging U.S. Pat. No. 7,049,850.
Patent Owner's Unopposed Motion To Withdraw and Substitute Counsel Under 37 CFR 11.116, Exhibit—12, Filed on Nov. 21, 2024—Cited in IPR2024-01034, challenging U.S. Pat. No. 9,279,263.
Patent Owner's Unopposed Motion To Withdraw and Substitute Counsel Under 37 CFR 11.116Paper10, Nov. 21, 2024—Cited in IPR2024-01033, challenging U.S. Pat. No. 8,434,966.
Patent Owner's Updated Exhibit List, Exhibit—23, Filed on Sep. 25, 2023—Cited in IPR2022-01078, challenging U.S. Pat. No. 11,057,701.
Patent Owner's Updated Mandatory Notice under 37 C.F.R. 42.8, Exhibit—15, Filed on Jul. 27, 2022—Cited in IPR2022-00324, challenging U.S. Pat. No. 8,254,591.
Patent Owner's Updated Mandatory Notice under 37 C.F.R. 42.8, Exhibit—17, Filed on Jul. 27, 2022—Cited in IPR2022-00243, challenging U.S. Pat. No. 8,111,839.
Patent Owner's Updated Mandatory Notice under 37 C.F.R. 42.8, Exhibit—18, Filed on Jul. 27, 2022—Cited in IPR2022-00242, challenging U.S. Pat. No. 8,111,839.

Patent Owner's Updated Mandatory Notice under 37 C.F.R. 42.8, Exhibit—8, Filed on Dec. 28, 2021—Cited in IPR2022-00242, challenging U.S. Pat. No. 8,111,839.
Patent Owner's Updated Mandatory Notice under 37 C.F.R. 42.8; Exhibit—14, Filed on Jul. 27, 2022—Cited in IPR2022-00234, challenging U.S. Pat. No. 9,124,982.
Patent Owner's Updated Mandatory Notice under 37 C.F.R. 42.8; Exhibit—7, Filed on Dec. 28, 2021—Cited in IPR2022-00234, challenging U.S. Pat. No. 9124982.
Patent Owner's Updated Mandatory Notice, Exhibit—17, Filed on Sep. 13, 2022—Cited in IPR2022-00253, challenging U.S. Pat. No. 9,491,542.
Patent Owner's Updated Mandatory Notice, Exhibit—17, Filed on Sep. 13, 2022—Cited in IPR2022-00281, challenging U.S. Pat. No. 9,270,244.
Patent Owner's Updated Mandatory Notice, Exhibit—18, Filed on Jun. 28, 2023—Cited in IPR2022-01078, challenging U.S. Pat. No. 11,057,701.
Patent Owner's Updated Mandatory Notice, Exhibit—20, Filed on Jun. 28, 2023—Cited in IPR2022-01106, challenging U.S. Pat. No. 11,039,259.
Patent Owner's Updated Mandatory Notice, Exhibit—29, Filed on Jun. 28, 2023—Cited in IPR2022-00282, challenging U.S. Pat. No. 8,315,400.
Patent Owner's Updated Mandatory Notice, Exhibit—29, Filed on Jun. 28, 2023—Cited in IPR2022-00388, challenging U.S. Pat. No. 10,966,015.
Patent Owner's Updated Mandatory Notice, Exhibit—30, Filed on Jun. 28, 2023—Cited in IPR2022-00281, challenging U.S. Pat. No. 9,270,244.
Patent Owner's Updated Mandatory Notice, Exhibit—30, Filed on Jun. 28, 2023—Cited in IPR2022-00369, challenging U.S. Pat. No. 10,405,082.
Patent Owner's Updated Mandatory Notice, Exhibit—31, Filed on Jun. 28, 2023—Cited in IPR2022-00253, challenging U.S. Pat. No. 9,491,542.
Patent Owner's Updated Mandatory Notice, Exhibit—31, Filed on Jun. 28, 2023—Cited in IPR2022-00324, challenging U.S. Pat. No. 8,254,591.
Patent Owner's Updated Mandatory Notice, Exhibit—35, Filed on Jun. 28, 2023—Cited in IPR2022-00302, challenging U.S. Pat. No. 9,609,424.
Patent Owner's Updated Mandatory Notice, Exhibit—36, Filed on Jun. 28, 2023—Cited in IPR2022-00243, challenging U.S. Pat. No. 8,111,839.
Patent Owner's Updated Mandatory Notice, Exhibit—37, Filed on Jun. 28, 2023—Cited in IPR2022-00242, challenging U.S. Pat. No. 8,111,839.
Patent Owner's Updated Mandatory Notice; Exhibit—30, Filed on Jun. 28, 2023—Cited in IPR2022-00234, challenging U.S. Pat. No. 9,124,982.
Patent Owner's Updated Mandatory Notices, Exhibit—15, Filed on Dec. 6, 2024—Cited in IPR2024-00559, challenging U.S. Pat. No. 11,610,587.
Patent Owner's Updated Power of Attorney Pursuant to 37 CFR 41.10(b), Exhibit—14, Filed on Dec. 6, 2024—Cited in IPR2024-00559, challenging U.S. Pat. No. 11,610,587.
Petition : as filed for Inter Partes Review of U.S. Pat. No. 11,610,587, Exhibit—4, Filed on Feb. 9, 2024—Cited in IPR2024-00559, challenging U.S. Pat. No. 11,610,587.
Petition : as filed, Exhibit—3, Filed on Jun. 12, 2024—Cited in IPR2024-01003, challenging U.S. Pat. No. 9,191,083.
Petition : as filed, Exhibit—3, Filed on Jun. 12, 2024—Cited in IPR2024-01004, challenging U.S. Pat. No. 9,614,943.
Petition : as filed, Exhibit—4, Filed on Jun. 25, 2024—Cited in IPR2024-01031, challenging U.S. Pat. No. 7,049,850.
Petition : as filed, Exhibit—5, Filed on Jul. 1, 2024—Cited in IPR2024-01034, challenging U.S. Pat. No. 9,279,263.
Petition : as filedPaper3,Jun. 18, 2024—Cited in IPR2024-01033, challenging U.S. Pat. No. 8,434,966.
Petition for Inter Partes Review of U.S. Pat. No. 11,217,237, Exhibit—4, Filed on Jun. 9, 2022—Cited in IPR2022-01098, challenging U.S. Pat. No. 11,217,237.

(56) References Cited

OTHER PUBLICATIONS

Petition for Inter Partes Review of U.S. Pat. No. 11,244,666, Exhibit—3, Filed on Jun. 9, 2022—Cited in IPR2022-01099, challenging U.S. Pat. No. 11,244,666.

Petition for Inter Partes Review of U.S. Pat. No. 8,254,591, Exhibit—3, Filed on Dec. 20, 2021—Cited in IPR2022-00324, challenging U.S. Pat. No. 8,254,591.

Petition for Inter Partes Review of U.S. Pat. No. 10,405,082, Exhibit—3, Filed on Dec. 30, 2021—Cited in IPR2022-00369, challenging U.S. Pat. No. 10,405,082.

Petition for Inter Partes Review of U.S. Pat. No. 10,966,015, Exhibit—3, Filed on Jan. 4, 2022—Cited in IPR2022-00388, challenging U.S. Pat. No. 10,966,015.

Petition for Inter Partes Review of U.S. Pat. No. 10,979,836, Exhibit—3, Filed on Jan. 14, 2022—Cited in IPR2022-00410, challenging U.S. Pat. No. 10,979,836.

Petition for Inter Partes Review of U.S. Pat. No. 11,039,259, Exhibit—3, Filed on Jun. 9, 2022—Cited in IPR2022-01106, challenging U.S. Pat. No. 11,039,259.

Petition for Inter Partes Review of U.S. Pat. No. 8,111,839, Exhibit—3, Filed on Dec. 13, 2021—Cited in IPR2022-00242, challenging U.S. Pat. No. 8,111,839.

Petition for Inter Partes Review of U.S. Pat. No. 8,111,839, Exhibit—3, Filed on Dec. 13, 2021—Cited in IPR2022-00243, challenging U.S. Pat. No. 8,111,839.

Petition for Inter Partes Review of U.S. Pat. No. 9,124,982; Exhibit—3, Filed on Dec. 13, 2021—Cited in IPR2022-00234, challenging U.S. Pat. No. 9,124,982.

Petition for Inter Partes Review of U.S. Pat. No. 9,270,244, Exhibit—3, Filed on Dec. 21, 2021—Cited in IPR2022-00281, challenging U.S. Pat. No. 9,270,244.

Petition for Inter Partes Review of U.S. Pat. No. 9,491,542, Exhibit—3, Filed on Dec. 17, 2021—Cited in IPR2022-00253, challenging U.S. Pat. No. 9,491,542.

Petition for Inter Partes Review of U.S. Pat. No. 9,609,424, Exhibit—3, Filed on Dec. 21, 2021—Cited in IPR2022-00302, challenging U.S. Pat. No. 9,609,424.

Petition of Inter Partes Review of U.S. Pat. No. 11,057,701, Exhibit—3, Filed on Jun. 9, 2022—Cited in IPR2022-01078, challenging U.S. Pat. No. 11,057,701.

Petition with Proposed Corrections in Redline, Exhibit—1042, Filed on Jan. 31, 2022—Cited in IPR2022-00242, challenging U.S. Pat. No. 8,111,839.

Petition with Proposed Corrections in Redline, Exhibit—1042, Filed on Jan. 31, 2022—Cited in IPR2022-00243, challenging U.S. Pat. No. 8,111,839.

Petitioner's Power of Attorney from Samsung Electronics Co., Ltd.; Exhibit—1, Filed on Dec. 13, 2021—Cited in IPR2022-00234, challenging U.S. Pat. No. 9124982.

Petitioner's Power of Attorney from Samsung Electronics, America, Inc.; Exhibit—2, Filed on Dec. 13, 2021—Cited in IPR2022-00234, challenging U.S. Pat. No. 9124982.

Petitioner's Updated Mandatory Notices, Exhibit—16, Filed on Oct. 13, 2022—Cited in IPR2022-00388, challenging U.S. Pat. No. 10,966,015.

Petitioner's Updated Mandatory Notices, Exhibit—17, Filed on Oct. 13, 2022—Cited in IPR2022-00369, challenging U.S. Pat. No. 10,405,082.

Petitioner's Updated Mandatory Notices; Exhibit—27, Filed on Apr. 3, 2023—Cited in IPR2022-00234, challenging U.S. Pat. No. 9,124,982.

Petitioners Supplemental Brief on Interim Fintiv Guidance, Exhibit—10, Filed on Jul. 1, 2022—Cited in IPR2022-00410, challenging U.S. Pat. No. 10,979,836.

Petitioners Supplemental Brief on Interim Fintiv Guidance, Exhibit—11, Filed on Jul. 1, 2022—Cited in IPR2022-00253, challenging U.S. Pat. No. 9,491,542.

Petitioners Supplemental Brief on Interim Fintiv Guidance, Exhibit—11, Filed on Jul. 1, 2022—Cited in IPR2022-00281, challenging U.S. Pat. No. 9,270,244.

Petitioners Supplemental Brief on Interim Fintiv Guidance, Exhibit—11, Filed on Jul. 1, 2022—Cited in IPR2022-00302, challenging U.S. Pat. No. 9,609,424.

Petitioners Supplemental Brief on Interim Fintiv Guidance, Exhibit—11, Filed on Jul. 1, 2022—Cited in IPR2022-00324, challenging U.S. Pat. No. 8,254,591.

Petitioners Supplemental Brief on Interim Fintiv Guidance, Exhibit—11, Filed on Jul. 1, 2022—Cited in IPR2022-00388, challenging U.S. Pat. No. 10,966,015.

Petitioners Supplemental Brief on Interim Fintiv Guidance, Exhibit—12, Filed on Jul. 1, 2022—Cited in IPR2022-00369, challenging U.S. Pat. No. 10,405,082.

Petitioners' Demonstrative Exhibits for Oral Argument, Exhibit—1019, Filed on Mar. 14, 2023—Cited in IPR2022-00282, challenging U.S. Pat. No. 8,315,400.

Petitioners' Demonstrative Exhibits for Oral Argument; Exhibit—1045, Filed on Mar. 14, 2023—Cited in IPR2022-00234, challenging U.S. Pat. No. 9,124,982.

Petitioners' Motion for Leave to File Corrected Petition, Exhibit—9, Filed on Jan. 31, 2022—Cited in IPR2022-00243, challenging U.S. Pat. No. 8,111,839.

Petitioners' Motion to Submit Supplemental Information Pursuant to 37 C.F.R. §42.123(b), Exhibit—29, Filed on Apr. 13, 2023—Cited in IPR2022-00302, challenging U.S. Pat. No. 9,609,424.

Petitioners' Notice of Appeal, Exhibit—31, Filed on Aug. 11, 2023—Cited in IPR2022-00282, challenging U.S. Pat. No. 8,315,400.

Petitioners' Notice of Appeal, Exhibit—38, Filed on Aug. 11, 2023—Cited in IPR2022-00302, challenging U.S. Pat. No. 9,609,424.

Petitioners' Notice of Cross-Appeal, Exhibit—34, Filed on Sep. 20, 2023—Cited in IPR2022-00281, challenging U.S. Pat. No. 9,270,244.

Petitioners' Notice of Cross-Appeal, Exhibit—35, Filed on Sep. 20, 2023—Cited in IPR2022-00253, challenging US. Pat. No. 9,491,542.

Petitioners' Notice of Cross-Appeal, Exhibit—35, Filed on Sep. 20, 2023—Cited in IPR2022-00324, challenging U.S. Pat. No. 8,254,591.

Petitioners' Notice of Cross-Appeal, Exhibit—39, Filed on Aug. 24, 2023—Cited in IPR2022-00242, challenging U.S. Pat. No. 8,111,839.

Petitioners' Notice of Cross-Appeal; Exhibit—32, Filed on Aug. 24, 2023—Cited in IPR2022-00234, challenging U.S. Pat. No. 9124982.

Petitioners' Notice of Depo of Chrisotpher Struck, Exhibit—16, Filed on May 15, 2023—Cited in IPR2022-01078, challenging U.S. Pat. No. 11,057,701.

Petitioners' Notice of Deposition of Christopher Struck, Exhibit—19, Filed on Nov. 15, 2022—Cited in IPR2022-00302, challenging U.S. Pat. No. 9,609,424.

Petitioners' Notice of Deposition of Daniel P. Anagnos, Exhibit—23, Filed on Nov. 9, 2022—Cited in IPR2022-00243, challenging U.S. Pat. No. 8,111,839.

Petitioners' Notice of Deposition of Daniel P. Anagnos, Exhibit—24, Filed on Nov. 9, 2022—Cited in IPR2022-00242, challenging U.S. Pat. No. 8,111,839.

Petitioners' Notice of Deposition of Daniel P. Anagnos; Exhibit—19, Filed on Nov. 9, 2022—Cited in IPR2022-00234, challenging U.S. Pat. No. 9,124,982.

Petitioners' Notice of Deposition of David Kleinschmidt, Exhibit—19, Filed on May 24, 2023—Cited in IPR2022-01106, challenging U.S. Pat. No. 11,039,259.

Petitioners' Notice of Objections to Evidence, Exhibit—18, Filed on Apr. 19, 2023—Cited in IPR2022-01106, challenging U.S. Pat. No. 11,039,259.

Petitioners' Notice of Objections to Evidence, Exhibit—22, Filed on Sep. 20, 2022—Cited in IPR2022-00243, challenging U.S. Pat. No. 8,111,839.

Petitioners' Notice of Objections to Evidence, Exhibit—23, Filed on Sep. 20, 2022—Cited in IPR2022-00242, challenging U.S. Pat. No. 8,111,839.

Petitioners' Notice of Objections to Evidence; Exhibit—18, Filed on Sep. 16, 2022—Cited in IPR2022-00234, challenging U.S. Pat. No. 9,124,982.

Petitioners' Preliminary Reply, Exhibit—10, Filed on Apr. 20, 2022—Cited in IPR2022-00282, challenging U.S. Pat. No. 8,315,400.

Petitioners' Preliminary Reply, Exhibit—10, Filed on Jun. 14, 2022—Cited in IPR2022-00369, challenging U.S. Pat. No. 10,405,082.

(56) References Cited

OTHER PUBLICATIONS

Petitioners' Preliminary Reply, Exhibit—13, Filed on Apr. 20, 2022—Cited in IPR2022-00243, challenging U.S. Pat. No. 8,111,839.
Petitioners' Preliminary Reply, Exhibit—14, Filed on Apr. 20, 2022—Cited in IPR2022-00242, challenging U.S. Pat. No. 8,111,839.
Petitioners' Preliminary Reply, Exhibit—8, Filed on Nov. 10, 2022—Cited in IPR2022-01078, challenging U.S. Pat. No. 11,057,701.
Petitioners' Preliminary Reply, Exhibit—8, Filed on Nov. 10, 2022—Cited in IPR2022-01099, challenging U.S. Pat. No. 11,244,666.
Petitioners' Preliminary Reply, Exhibit—8, Filed on Nov. 10, 2022—Cited in IPR2022-01106, challenging U.S. Pat. No. 11,039,259.
Petitioners' Preliminary Reply, Exhibit—8, Filed on Jun. 14, 2022—Cited in IPR2022-00410, challenging U.S. Pat. No. 10,979,836.
Petitioners' Preliminary Reply, Exhibit—9, Filed on Nov. 15, 2022—Cited in IPR2022-01098, challenging U.S. Pat. No. 11,217,237.
Petitioners' Preliminary Reply, Exhibit—9, Filed on May 10, 2022—Cited in IPR2022-00302, challenging U.S. Pat. No. 9,609,424.
Petitioners' Preliminary Reply, Exhibit—9, Filed on May 11, 2022—Cited in IPR2022-00324, challenging U.S. Pat. No. 8,254,591.
Petitioners' Preliminary Reply, Exhibit—9, Filed on May 20, 2022—Cited in IPR2022-00253, challenging U.S. Pat. No. 9,491,542.
Petitioners' Preliminary Reply, Exhibit—9, Filed on May 27, 2022—Cited in IPR2022-00281, challenging U.S. Pat. No. 9,270,244.
Petitioners' Preliminary Reply, Exhibit—9, Filed on Jun. 14, 2022—Cited in IPR2022-00388, challenging U.S. Pat. No. 10,966,015.
Petitioners' Preliminary Reply; Exhibit—10, Filed on Apr. 20, 2022—Cited in IPR2022-00234, challenging U.S. Pat. No. 9,124,982.
Petitioners' Reply to Patent Owner's Response, Exhibit—17, Filed on Dec. 2, 2022—Cited in IPR2022-00282, challenging U.S. Pat. No. 8,315,400.
Petitioners' Reply to Patent Owner's Response, Exhibit—17, Filed on Jun. 15, 2023—Cited in IPR2022-01078, challenging U.S. Pat. No. 11,057,701.
Petitioners' Reply to Patent Owner's Response, Exhibit—20, Filed on Jan. 10, 2023—Cited in IPR2022-00302, challenging U.S. Pat. No. 9,609,424.
Petitioners' Reply to Patent Owner's Response, Exhibit—20, Filed on Jan. 31, 2023—Cited in IPR2022-00388, challenging U.S. Pat. No. 10,966,015.
Petitioners' Reply to Patent Owner's Response, Exhibit—21, Filed on Jan. 11, 2023—Cited in IPR2022-00281, challenging U.S. Pat. No. 9,270,244.
Petitioners' Reply to Patent Owner's Response, Exhibit—21, Filed on Jan. 31, 2023—Cited in IPR2022-00369, challenging U.S. Pat. No. 10,405,082.
Petitioners' Reply to Patent Owner's Response, Exhibit—21, Filed on Jun. 30, 2023—Cited in IPR2022-01106, challenging U.S. Pat. No. 11,039,259.
Petitioners' Reply to Patent Owner's Response, Exhibit—22, Filed on Jan. 10, 2023—Cited in IPR2022-00324, challenging U.S. Pat. No. 8,254,591.
Petitioners' Reply to Patent Owner's Response, Exhibit—24, Filed on Dec. 6, 2022—Cited in IPR2022-00243, challenging U.S. Pat. No. 8,111,839.
Petitioners' Reply to Patent Owner's Response, Exhibit—25, Filed on Dec. 6, 2022—Cited in IPR2022-00242, challenging U.S. Pat. No. 8,111,839.
Petitioners' Reply to Patent Owner's Response; Exhibit—20, Filed on Dec. 2, 2022—Cited in IPR2022-00234, challenging U.S. Pat. No. 9,124,982.
Petitioners' Reply to Patent Owners Response, Exhibit—21, Filed on Jan. 11, 2023—Cited in IPR2022-00253, challenging U.S. Pat. No. 9,491,542.
Petitioners' Request for Oral Argument, Exhibit—20, Filed on Aug. 17, 2023—Cited in IPR2022-01078, challenging U.S. Pat. No. 11,057,701.
Petitioners' Request for Oral Argument, Exhibit—22, Filed on Feb. 3, 2023—Cited in IPR2022-00282, challenging U.S. Pat. No. 8,315,400.

Petitioners' Request for Oral Argument, Exhibit—23, Filed on Feb. 28, 2023—Cited in IPR2022-00302, challenging U.S. Pat. No. 9,609,424.
Petitioners' Request for Oral Argument, Exhibit—24, Filed on Mar. 1, 2023—Cited in IPR2022-00281, challenging U.S. Pat. No. 9,270,244.
Petitioners' Request for Oral Argument, Exhibit—24, Filed on Aug. 28, 2023—Cited in IPR2022-01106, challenging U.S. Pat. No. 11,039,259.
Petitioners' Request for Oral Argument, Exhibit—25, Filed on Feb. 28, 2023—Cited in IPR2022-00324, challenging U.S. Pat. No. 8,254,591.
Petitioners' Request for Oral Argument, Exhibit—25, Filed on Mar. 1, 2023—Cited in IPR2022-00253, challenging U.S. Pat. No. 9,491,542.
Petitioners' Request for Oral Argument, Exhibit—25, Filed on Apr. 4, 2023—Cited in IPR2022-00388, challenging U.S. Pat. No. 10,966,015.
Petitioners' Request for Oral Argument, Exhibit—26, Filed on Apr. 4, 2023—Cited in IPR2022-00369, challenging U.S. Pat. No. 10,405,082.
Petitioners' Request for Oral Argument, Exhibit—27, Filed on Feb. 7, 2023—Cited in IPR2022-00243, challenging U.S. Pat. No. 8,111,839.
Petitioners' Request for Oral Argument, Exhibit—28, Filed on Feb. 7, 2023—Cited in IPR2022-00242, challenging U.S. Pat. No. 8,111,839.
Petitioners' Request for Oral Argument; Exhibit—23, Filed on Feb. 3, 2023—Cited in IPR2022-00234, challenging U.S. Pat. No. 9,124,982.
Petitioners' Request for Refund of Post-Institution Fee, Exhibit—12, Filed on Mar. 2, 2023—Cited in IPR2022-01099, challenging U.S. Pat. No. 11,244,666.
Petitioners' Request for Refund of Post-Institution Fee, Exhibit—13, Filed on Jan. 18, 2023—Cited in IPR2022-00410, challenging U.S. Pat. No. 10,979,836.
Petitioners' Request for Refund of Post-Institution Fee, Exhibit—13, Filed on Mar. 2, 2023—Cited in IPR2022-01098, challenging U.S. Pat. No. 11,217,237.
Petitioners' Request for Refund of Post-Institution Fees, Exhibit—17, Filed on Dec. 16, 2024—Cited in IPR2024-01003, challenging U.S. Pat. No. 9,191,083.
Petitioners' Request for Refund of Post-Institution Fees, Exhibit—17, Filed on Dec. 16, 2024—Cited in IPR2024-01004, challenging U.S. Pat. No. 9,614,943.
Petitioners' Request for Refund of Post-Institution Fees, Exhibit—17, Filed on Dec. 16, 2024—Cited in IPR2024-01031, challenging U.S. Pat. No. 7,049,850.
Petitioners' Request for Refund of Post-Institution Fees, Exhibit—18, Filed on Dec. 16, 2024—Cited in IPR2024-01034, challenging U.S. Pat. No. 9,279,263.
Petitioners' Request for Refund of Post-Institution FeesPaper16, Dec. 16, 2024—Cited in IPR2024-01033, challenging U.S. Pat. No. 8,434,966.
Petitioners' Submission of Supplemental Information, Exhibit—33, Filed on May 15, 2023—Cited in IPR2022-00302, challenging U.S. Pat. No. 9,609,424.
Petitioners' Sur-Sur-Reply to Patent Owner's Sur-Reply, Exhibit—20, Filed on Jan. 27, 2023—Cited in IPR2022-00282, challenging U.S. Pat. No. 8,315,400.
Petitioners' Sur-Sur-Reply to Patent Owner's Sur-Reply, Exhibit—26, Filed on Mar. 7, 2023—Cited in IPR2022-00281, challenging U.S. Pat. No. 9,270,244.
Petitioners' Sur-Sur-Reply to Patent Owner's Sur-Reply, Exhibit—27, Filed on Mar. 7, 2023—Cited in IPR2022-00253, challenging U.S. Pat. No. 9,491,542.
Petitioners' Updated Exhibit List, Exhibit—10, Filed on Nov. 20, 2024—Cited in IPR2024-01003, challenging U.S. Pat. No. 9,191,083.
Petitioners' Updated Exhibit List, Exhibit—10, Filed on Nov. 20, 2024—Cited in IPR2024-01004, challenging U.S. Pat. No. 9,614,943.
Petitioners' Updated Exhibit List, Exhibit—10, Filed on Nov. 20, 2024—Cited in IPR2024-01031, challenging U.S. Pat. No. 7,049,850.
Petitioners' Updated Exhibit List, Exhibit—11, Filed on Nov. 20, 2024—Cited in IPR2024-01034, challenging U.S. Pat. No. 9,279,263.
Petitioners' Updated Exhibit List, Exhibit—15, Filed on Dec. 11, 2024—Cited in IPR2024-01003, challenging U.S. Pat. No. 9,191,083.
Petitioners' Updated Exhibit List, Exhibit—15, Filed on Dec. 11, 2024—Cited in IPR2024-01004, challenging U.S. Pat. No. 9,614,943.

(56) References Cited

OTHER PUBLICATIONS

Petitioners' Updated Exhibit List, Exhibit—15, Filed on Dec. 11, 2024—Cited in IPR2024-01031, challenging U.S. Pat. No. 7,049,850.

Petitioners' Updated Exhibit List, Exhibit—16, Filed on Dec. 11, 2024—Cited in IPR2024-01034, challenging U.S. Pat. No. 9,279,263.

Petitioners' Updated Exhibit List, Exhibit—19, Filed on Dec. 11, 2024—Cited in IPR2024-00559, challenging U.S. Pat. No. 11,610,587.

Petitioners' Updated Exhibit List, Exhibit—24, Filed on Mar. 14, 2023—Cited in IPR2022-00282, challenging U.S. Pat. No. 8,315,400.

Petitioners' Updated Exhibit List, Exhibit—24, Filed on Sep. 26, 2023—Cited in IPR2022-01078, challenging U.S. Pat. No. 11,057,701.

Petitioners' Updated Exhibit List, Exhibit—27, Filed on May 9, 2023—Cited in IPR2022-00388, challenging U.S. Pat. No. 10,966,015.

Petitioners' Updated Exhibit List, Exhibit—28, Filed on Oct. 11, 2023—Cited in IPR2022-01106, challenging U.S. Pat. No. 11,039,259.

Petitioners' Updated Exhibit List, Exhibit—28, Filed on Apr. 11, 2023—Cited in IPR2022-00302, challenging U.S. Pat. No. 9,609,424.

Petitioners' Updated Exhibit List, Exhibit—28, Filed on Apr. 13, 2023—Cited in IPR2022-00281, challenging U.S. Pat. No. 9,270,244.

Petitioners' Updated Exhibit List, Exhibit—28, Filed on May 9, 2023—Cited in IPR2022-00369, challenging U.S. Pat. No. 10,405,082.

Petitioners' Updated Exhibit List, Exhibit—30, Filed on Apr. 12, 2023—Cited in IPR2022-00253, challenging U.S. Pat. No. 9,491,542.

Petitioners' Updated Exhibit List, Exhibit—30, Filed on Apr. 13, 2023—Cited in IPR2022-00302, challenging U.S. Pat. No. 9,609,424.

Petitioners' Updated Exhibit List, Exhibit—30, Filed on Apr. 4, 2023—Cited in IPR2022-00324, challenging U.S. Pat. No. 8,254,591.

Petitioners' Updated Exhibit List, Exhibit—31, Filed on Mar. 16, 2023—Cited in IPR2022-00243, challenging U.S. Pat. No. 8,111,839.

Petitioners' Updated Exhibit List, Exhibit—31, Filed on Apr. 13, 2023—Cited in IPR2022-00302, challenging U.S. Pat. No. 9,609,424.

Petitioners' Updated Exhibit List, Exhibit—32, Filed on Mar. 16, 2023—Cited in IPR2022-00242, challenging U.S. Pat. No. 8,111,839.

Petitioners' Updated Exhibit List; Exhibit—25, Filed on Mar. 14, 2023—Cited in IPR2022-00234, challenging U.S. Pat. No. 9,124,982.

Petitioners' Updated Exhibit ListPaper14, Dec. 11, 2024—Cited in IPR2024-01033, challenging U.S. Pat. No. 8,434,966.

Petitioners' Updated Exhibit ListPaper9,Nov. 20, 2024—Cited in IPR2024-01033, challenging U.S. Pat. No. 8,434,966.

Petitioners' Updated Mandatory Notices, Exhibit—15, Filed on Apr. 3, 2023—Cited in IPR2022-01078, challenging U.S. Pat. No. 11,057,701.

Petitioners' Updated Mandatory Notices, Exhibit—16, Filed on Mar. 28, 2023—Cited in IPR2022-01106, challenging U.S. Pat. No. 11,039,259.

Petitioners' Updated Mandatory Notices, Exhibit—18, Filed on Aug. 10, 2022—Cited in IPR2022-00324, challenging U.S. Pat. No. 8,254,591.

Petitioners' Updated Mandatory Notices, Exhibit—20, Filed on Aug. 10, 2022—Cited in IPR2022-00243, challenging U.S. Pat. No. 8,111,839.

Petitioners' Updated Mandatory Notices, Exhibit—21, Filed on Feb. 8, 2023—Cited in IPR2022-00388, challenging U.S. Pat. No. 10,966,015.

Petitioners' Updated Mandatory Notices, Exhibit—21, Filed on Aug. 10, 2022—Cited in IPR2022-00242, challenging U.S. Pat. No. 8,111,839.

Petitioners' Updated Mandatory Notices, Exhibit—22, Filed on Feb. 8, 2023—Cited in IPR2022-00369, challenging U.S. Pat. No. 10,405,082.

Petitioners' Updated Mandatory Notices, Exhibit—23, Filed on Apr. 3, 2023—Cited in IPR2022-00388, challenging U.S. Pat. No. 10,966,015.

Petitioners' Updated Mandatory Notices, Exhibit—24, Filed on Apr. 3, 2023—Cited in IPR2022-00369, challenging U.S. Pat. No. 10,405,082.

Petitioners' Updated Mandatory Notices, Exhibit—26, Filed on Apr. 3, 2023—Cited in IPR2022-00282, challenging U.S. Pat. No. 8,315,400.

Petitioners' Updated Mandatory Notices, Exhibit—26, Filed on Apr. 3, 2023—Cited in IPR2022-00302, challenging U.S. Pat. No. 9,609,424.

Petitioners' Updated Mandatory Notices, Exhibit—27, Filed on Apr. 3, 2023—Cited in IPR2022-00281, challenging U.S. Pat. No. 9,270,244.

Petitioners' Updated Mandatory Notices, Exhibit—28, Filed on Apr. 3, 2023—Cited in IPR2022-00253, challenging U.S. Pat. No. 9,491,542.

Petitioners' Updated Mandatory Notices, Exhibit—28, Filed on Apr. 3, 2023—Cited in IPR2022-00324, challenging U.S. Pat. No. 8,254,591.

Petitioners' Updated Mandatory Notices, Exhibit—33, Filed on Apr. 3, 2023—Cited in IPR2022-00243, challenging U.S. Pat. No. 8,111,839.

Petitioners' Updated Mandatory Notices, Exhibit—34, Filed on Apr. 3, 2023—Cited in IPR2022-00242, challenging U.S. Pat. No. 8,111,839.

Petitioners' Updated Mandatory Notices, Exhibit—4, Filed on Jan. 6, 2022—Cited in IPR2022-00369, challenging U.S. Pat. No. 10,405,082.

Petitioners' Updated Mandatory Notices, Exhibit—6, Filed on Jan. 20, 2022—Cited in IPR2022-00388, challenging U.S. Pat. No. 10,966,015.

Petitioners' Updated Mandatory Notices, Exhibit—7, Filed on Jan. 20, 2022—Cited in IPR2022-00253, challenging U.S. Pat. No. 9,491,542.

Petitioners' Updated Mandatory Notices, Exhibit—7, Filed on Jan. 20, 2022—Cited in IPR2022-00281, challenging U.S. Pat. No. 9,270,244.

Petitioners' Updated Mandatory Notices, Exhibit—7, Filed on Jan. 20, 2022—Cited in IPR2022-00302, challenging U.S. Pat. No. 9,609,424.

Petitioners' Updated Mandatory Notices, Exhibit—7, Filed on Jan. 20, 2022—Cited in IPR2022-00324, challenging U.S. Pat. No. 8,254,591.

Petitioners' Updated Mandatory Notices, Exhibit—7, Filed on Jan. 20, 2022—Cited in IPR2022-00369, challenging U.S. Pat. No. 10,405,082.

Petitioners' Updated Mandatory Notices, Exhibit—8, Filed on Jan. 20, 2022—Cited in IPR2022-00243, challenging U.S. Pat. No. 8,111,839.

Petitioners' Updated Mandatory Notices, Exhibit—8, Filed on Jan. 20, 2022—Cited in IPR2022-00282, challenging U.S. Pat. No. 8,315,400.

Petitioners' Updated Mandatory Notices, Exhibit—9, Filed on Jan. 20, 2022—Cited in IPR2022-00242, challenging U.S. Pat. No. 8,111,839.

Petitioners' Updated Mandatory Notices; Exhibit—16, Filed on Aug. 10, 2022—Cited in IPR2022-00234, challenging U.S. Pat. No. 9,124,982.

Petitioners' Updated Mandatory Notices; Exhibit—8, Filed on Jan. 20, 2022—Cited in IPR2022-00234, challenging U.S. Pat. No. 9,124,982.

PO's Opposition to Motion to File Supplemental Information, Exhibit—32, Filed on Apr. 17, 2023—Cited in IPR2022-00302, challenging U.S. Pat. No. 9,609,424.

PO's Updated Exhibit List, Exhibit—25, Filed on Mar. 14, 2023—Cited in IPR2022-00282, challenging U.S. Pat. No. 8,315,400.

PO's Updated Exhibit List, Exhibit—27, Filed on Oct. 11, 2023—Cited in IPR2022-01106, challenging U.S. Pat. No. 11,039,259.

PO's Updated Exhibit List, Exhibit—27, Filed on Apr. 11, 2023—Cited in IPR2022-00302, challenging U.S. Pat. No. 9,609,424.

PO's Updated Exhibit List, Exhibit—28, Filed on May 9, 2023—Cited in IPR2022-00388, challenging U.S. Pat. No. 10,966,015.

PO's Updated Exhibit List, Exhibit—29, Filed on Apr. 12, 2023—Cited in IPR2022-00253, challenging U.S. Pat. No. 9,491,542.

PO's Updated Exhibit List, Exhibit—29, Filed on Apr. 13, 2023—Cited in IPR2022-00281, challenging U.S. Pat. No. 9,270,244.

PO's Updated Exhibit List, Exhibit—29, Filed on Apr. 4, 2023—Cited in IPR2022-00324, challenging U.S. Pat. No. 8,254,591.

PO's Updated Exhibit List, Exhibit—29, Filed on May 9, 2023—Cited in IPR2022-00369, challenging U.S. Pat. No. 10,405,082.

(56) References Cited

OTHER PUBLICATIONS

PO's Updated Exhibit List, Exhibit—30, Filed on Oct. 19, 2023—Cited in IPR2022-01106, challenging U.S. Pat. No. 11,039,259.
PO's Updated Exhibit List, Exhibit—32, Filed on Mar. 16, 2023—Cited in IPR2022-00243, challenging U.S. Pat. No. 8,111,839.
PO's Updated Exhibit List, Exhibit—33, Filed on Mar. 16, 2023—Cited in IPR2022-00242, challenging U.S. Pat. No. 8,111,839.
PO's Updated Exhibit List; Exhibit—26, Filed on Mar. 14, 2023—Cited in IPR2022-00234, challenging U.S. Pat. No. 9,124,982.
Power of Attorney for Samsung Electronics America, Inc., Exhibit—2, Filed on Dec. 30, 2021—Cited in IPR2022-00369, challenging U.S. Pat. No. 10,405,082.
Power of Attorney for Samsung Electronics America, Inc., Exhibit—2, Filed on Jun. 9, 2022—Cited in IPR2022-01078, challenging U.S. Pat. No. 11,057,701.
Power of Attorney for Samsung Electronics America, Inc., Exhibit—2, Filed on Jun. 9, 2022—Cited in IPR2022-01098, challenging U.S. Pat. No. 11,217,237.
Power of Attorney for Samsung Electronics America, Inc., Exhibit—2, Filed on Jun. 9, 2022—Cited in IPR2022-01099, challenging U.S. Pat. No. 11,244,666.
Power of Attorney for Samsung Electronics America, Inc., Exhibit—2, Filed on Jun. 9, 2022—Cited in IPR2022-01106, challenging U.S. Pat. No. 11,039,259.
Power of Attorney for Samsung Electronics Co. Ltd., Exhibit—1, Filed on Jun. 9, 2022—Cited in IPR2022-01078, challenging U.S. Pat. No. 11,057,701.
Power of Attorney for Samsung Electronics Co., Ltd., Exhibit—1, Filed on Dec. 10, 2021—Cited in IPR2022-00282, challenging U.S. Pat. No. 8,315,400.
Power of Attorney for Samsung Electronics Co., Ltd., Exhibit—1, Filed on Dec. 30, 2021—Cited in IPR2022-00369, challenging U.S. Pat. No. 10,405,082.
Power of Attorney for Samsung Electronics Co., Ltd., Exhibit—1, Filed on Jun. 9, 2022—Cited in IPR2022-01098, challenging U.S. Pat. No. 11,217,237.
Power of Attorney for Samsung Electronics Co., Ltd., Exhibit—1, Filed on Jun. 9, 2022—Cited in IPR2022-01099, challenging U.S. Pat. No. 11,244,666.
Power of Attorney for Samsung Electronics Co., Ltd., Exhibit—1, Filed on Jun. 9, 2022—Cited in IPR2022-01106, challenging U.S. Pat. No. 11,039,259.
Power of Attorney for Samsung Electronics, America, Inc., Exhibit—2, Filed on Dec. 10, 2021—Cited in IPR2022-00282, challenging U.S. Pat. No. 8,315,400.
Power of Attorney from Samsung Electronics America, Inc., Exhibit—2, Filed on Jan. 14, 2022—Cited in IPR2022-00410, challenging U.S. Pat. No. 10,979,836.
Power of Attorney from Samsung Electronics America, Inc., Exhibit—2, Filed on Jan. 4, 2022—Cited in IPR2022-00388, challenging U.S. Pat. No. 10,966,015.
Power of Attorney from Samsung Electronics America, Inc., Exhibit—2, Filed on Dec. 13, 2021—Cited in IPR2022-00242, challenging U.S. Pat. No. 8,111,839.
Power of Attorney from Samsung Electronics America, Inc., Exhibit—2, Filed on Dec. 13, 2021—Cited in IPR2022-00243, challenging U.S. Pat. No. 8,111,839.
Power of Attorney from Samsung Electronics America, Inc., Exhibit—2, Filed on Dec. 17, 2021—Cited in IPR2022-00253, challenging U.S. Pat. No. 9,491,542.
Power of Attorney from Samsung Electronics America, Inc., Exhibit—2, Filed on Dec. 20, 2021—Cited in IPR2022-00324, challenging U.S. Pat. No. 8,254,591.
Power of Attorney from Samsung Electronics America, Inc., Exhibit—2, Filed on Dec. 21, 2021—Cited in IPR2022-00281, challenging U.S. Pat. No. 9,270,244.
Power of Attorney from Samsung Electronics America, Inc., Exhibit—2, Filed on Dec. 21, 2021—Cited in IPR2022-00302, challenging U.S. Pat. No. 9,609,424.

Power of Attorney from Samsung Electronics Co., Ltd., Exhibit—1, Filed on Jan. 14, 2022—Cited in IPR2022-00410, challenging U.S. Pat. No. 10,979,836.
Power of Attorney from Samsung Electronics Co., Ltd., Exhibit—1, Filed on Jan. 4, 2022—Cited in IPR2022-00388, challenging U.S. Pat. No. 10,966,015.
Power of Attorney from Samsung Electronics Co., Ltd., Exhibit—1, Filed on Dec. 13, 2021—Cited in IPR2022-00242, challenging U.S. Pat. No. 8,111,839.
Power of Attorney from Samsung Electronics Co., Ltd., Exhibit—1, Filed on Dec. 13, 2021—Cited in IPR2022-00243, challenging U.S. Pat. No. 8,111,839.
Power of Attorney from Samsung Electronics Co., Ltd., Exhibit—1, Filed on Dec. 17, 2021—Cited in IPR2022-00253, challenging U.S. Pat. No. 9,491,542.
Power of Attorney from Samsung Electronics Co., Ltd., Exhibit—1, Filed on Dec. 20, 2021—Cited in IPR2022-00324, challenging U.S. Pat. No. 8,254,591.
Power of Attorney from Samsung Electronics Co., Ltd., Exhibit—1, Filed on Dec. 21, 2021—Cited in IPR2022-00281, challenging U.S. Pat. No. 9,270,244.
Power of Attorney from Samsung Electronics Co., Ltd., Exhibit—1, Filed on Dec. 21, 2021—Cited in IPR2022-00302, challenging U.S. Pat. No. 9,609,424.
PR 4-3 JCC Statement, Exhibit—2013, Filed on Jan. 12, 2023—Cited in IPR2022-00282, challenging U.S. Pat. No. 8,315,400.
PR 4-5(d) JCC Chart, Exhibit—2011, Filed on Jan. 12, 2023—Cited in IPR2022-00282, challenging U.S. Pat. No. 8,315,400.
Revised Scheduling Order, Exhibit—22, Filed on Jul. 12, 2023—Cited in IPR2022-01106, challenging U.S. Pat. No. 11,039,259.
Roy Falik, Exhibit—7, Filed on Jul. 18, 2024—Cited in IPR2024-01031, challenging U.S. Pat. No. 7,049, 850.
Roy Falik, Exhibit—8, Filed on Jul. 18, 2024—Cited in IPR2024-01034, challenging U.S. Pat. No. 9,279,263.
Sage Journal, The Future of Hearing Aid Technology, Exhibit—2008, Filed on Oct. 17, 2022—Cited in IPR2022-00324, challenging U.S. Pat. No. 8,254,591.
*Samsung Elecs. Co., Ltd., et al.* v. *Staton Techiya, LLC*, IPR2022-00302, Paper 11, Exhibit—2006, Filed on Oct. 11, 2022—Cited in IPR2022-01106, challenging U.S. Pat. No. 11,039,259.
*Samsung Elecs. Co., Ltd., et al.* v. *Staton Techiya, LLC*, IPR2022-00302, Paper 11, Exhibit—2006, Filed on Oct. 7, 2022—Cited in IPR2022-01078, challenging U.S. Pat. No. 11,057,701.
*Samsung Elecs. Co., Ltd., et al.* v. *Staton Techiya, LLC*, IPR2022-00302, Paper 11, Exhibit—2006, Filed on Oct. 7, 2022—Cited in IPR2022-01098, challenging U.S. Pat. No. 11,217,237.
*Samsung Elecs. Co., Ltd., et al.* v. *Staton Techiya, LLC*, IPR2022-00302, Paper 11, Exhibit—2006, Filed on Oct. 7, 2022—Cited in IPR2022-01099, challenging U.S. Pat. No. 11,244,666.
Samsung's Claim Construction Brief, Exhibit—2012, Filed on Jan. 12, 2023—Cited in IPR2022-00282, challenging U.S. Pat. No. 8,315,400.
Samsung's Responsive Claim Construction Brief, Exhibit—2012, Filed on Apr. 10, 2023—Cited in IPR2022-01106, challenging U.S. Pat. No. 11,039,259.
Scheduling Order, Exhibit—11, Filed on Jan. 9, 2023—Cited in IPR2022-01106, challenging U.S. Pat. No. 11,039,259.
Scheduling Order, Exhibit—11, Filed on Dec. 30, 2022—Cited in IPR2022-01078, challenging U.S. Pat. No. 11,057,701.
Scheduling Order, Exhibit—14, Filed on Jul. 12, 2022—Cited in IPR2022-00302, challenging U.S. Pat. No. 9,609,424.
Scheduling Order, Exhibit—14, Filed on Jul. 12, 2022—Cited in IPR2022-00324, challenging U.S. Pat. No. 8,254,591.
Scheduling Order, Exhibit—14, Filed on Jul. 15, 2022—Cited in IPR2022-00253, challenging U.S. Pat. No. 9,491,542.
Scheduling Order, Exhibit—14, Filed on Jul. 15, 2022—Cited in IPR2022-00281, challenging U.S. Pat. No. 9,270,244.
Scheduling Order, Exhibit—14, Filed on Aug. 16, 2022—Cited in IPR2022-00388, challenging U.S. Pat. No. 10,966,015.
Scheduling Order, Exhibit—15, Filed on Aug. 16, 2022—Cited in IPR2022-00369, challenging U.S. Pat. No. 10,405,082.
Scheduling Order, Exhibit—16, Filed on Jun. 21, 2022—Cited in IPR2022-00243, challenging U.S. Pat. No. 8,111,839.

(56) References Cited

OTHER PUBLICATIONS

Scheduling Order, Exhibit—17, Filed on Jun. 21, 2022—Cited in IPR2022-00242, challenging U.S. Pat. No. 8,111,839.

Scheduling Order, Exhibit—9, Filed on Aug. 22, 2024—Cited in IPR2024-00559, challenging U.S. Pat. No. 11,610,587.

*Staton Techiya* v *Samsung*—Docket Control Order, Exhibit—2003, Filed on Apr. 18, 2022—Cited in IPR2022-00253, challenging U.S. Pat. No. 9,491,542.

*Staton Techiya* v *Samsung*—Docket Control Order, Exhibit—2003, Filed on Apr. 18, 2022—Cited in IPR2022-00281, challenging U.S. Pat. No. 9,270,244.

*Staton Techiya* v *Samsung*, Docket Control Order, Exhibit—2003, Filed on Mar. 21, 2022—Cited in IPR2022-00282, challenging U.S. Pat. No. 8,315,400.

*Staton Techiya* v *Samsung*, Docket Control Order, Exhibit—2003, Filed on Apr. 13, 2022—Cited in IPR2022-00302, challenging U.S. Pat. No. 9,609,424.

*Staton Techiya* v *Samsung*, Docket Control Order, Exhibit—2003, Filed on Apr. 13, 2022—Cited in IPR2022-00324, challenging U.S. Pat. No. 8,254,591.

*Staton Techiya* v. *Samsung*, Claim Construction Order, Exhibit—2012, Filed on Mar. 23, 2023—Cited in IPR2022-01078, challenging U.S. Pat. No. 11,057,701.

*Staton Techiya* v. *Samsung*, Docket Control Order, Exhibit—2003, Filed on Mar. 23, 2022—Cited in IPR2022-00242, challenging U.S. Pat. No. 8,111,839.

*Staton Techiya* v. *Samsung*, Docket Control Order, Exhibit—2003, Filed on Mar. 23, 2022—Cited in IPR2022-00243, challenging U.S. Pat. No. 8,111,839.

*Staton Techiya* v. *Samsung*, Docket Control Order, Exhibit—2003, Filed on May 18, 2022—Cited in IPR2022-00369, challenging U.S. Pat. No. 10,405,082.

*Staton Techiya* v. *Samsung*, Docket Control Order, Exhibit—2003, Filed on May 18, 2022—Cited in IPR2022-00388, challenging U.S. Pat. No. 10,966,015.

*Staton Techiya* v. *Samsung*, Docket Control Order, Exhibit—2003, Filed on May 18, 2022—Cited in IPR2022-00410, challenging U.S. Pat. No. 10,979,836.

*Staton Techiya* v. *Samsung*, Docket Control Order; Exhibit—2003, Filed on Mar. 21, 2022—Cited in IPR2022-00234, challenging U.S. Pat. No. 9124982.

*Staton Techiya* v. *Samsung*, Joint Motion to Consolidate, Exhibit—2005, Filed on Apr. 29, 2022—Cited in IPR2022-00242, challenging U.S. Pat. No. 8,111,839.

*Staton Techiya* v. *Samsung*, Joint Mtn to Consolidate, Exhibit—2005, Filed on Apr. 29, 2022—Cited in IPR2022-00243, challenging U.S. Pat. No. 8,111,839.

*Staton Techiya* v. *Samsung*, Joint MTN to Consolidate, Exhibit—2008, Filed on Apr. 29, 2022—Cited in IPR2022-00282, challenging U.S. Pat. No. 8,315,400.

*Staton Techiya* v. *Samsung*, P.R. 4-5(d) Joint Claim Construction Chart, Exhibit—2011, Filed on Mar. 23, 2023—Cited in IPR2022-01078, challenging U.S. Pat. No. 11,057,701.

*Staton Techiya, LLC* v. *Samsung Elecs. Co., Ltd.*, Appendix B to P.R. 4-3 Statement, Exhibit—2007, Filed on Nov. 8, 2022—Cited in IPR2022-00369, challenging U.S. Pat. No. 10,405,082.

*Staton Techiya, LLC* v. *Samsung Elecs. Co., Ltd.*, Appendix B to P.R. 4-3 Statement, Exhibit—2009, Filed on Nov. 18, 2022—Cited in IPR2022-01078, challenging U.S. Pat. No. 11,057,701.

*Staton Techiya, LLC* v. *Samsung Elecs. Co., Ltd.*, Appendix B to P.R. 4-3 Statement, Exhibit—2010, Filed on Nov. 8, 2022—Cited in IPR2022-00388, challenging U.S. Pat. No. 10,966,015.

*Staton Techiya, LLC* v. *Samsung Elecs., Co., Ltd.*, Appendix B to P.R. 4-3 Statement, Exhibit—2011, Filed on Nov. 18, 2022—Cited in IPR2022-01106, challenging U.S. Pat. No. 11,039,259.

*Staton Techiya, LLC, et al.* v. *Samsung Elecs. Co., Ltd., et al.*, Defendants' P.R. 4-2 Disclosures, Exhibit—2004, Filed on Oct. 11, 2022—Cited in IPR2022-01106, challenging U.S. Pat. No. 11,039,259.

*Staton Techiya, LLC, et al.* v. *Samsung Elecs. Co., Ltd., et al.*, Defendants' P.R. 4-2 Disclosures, Exhibit—2004, Filed on Oct. 7, 2022—Cited in IPR2022-01078, challenging U.S. Pat. No. 11,057,701.

*Staton Techiya, LLC, et al.* v. *Samsung Elecs. Co., Ltd., et al.*, Defendants' P.R. 4-2 Disclosures, Exhibit—2004, Filed on Oct. 7, 2022—Cited in IPR2022-01098, challenging U.S. Pat. No. 11,217,237.

*Staton Techiya, LLC, et al.* v. *Samsung Elecs. Co., Ltd., et al.*, Defendants' P.R. 4-2 Disclosures, Exhibit—2004, Filed on Oct. 7, 2022—Cited in IPR2022-01099, challenging U.S. Pat. No. 11,244,666.

*Staton Techiya, LLC, et al.* v. *Samsung Elecs. Co., Ltd., et al.*, Docket Control Order (Dkt. No. 43), Exhibit—2005, Filed on Oct. 7, 2022—Cited in IPR2022-01078, challenging U.S. Pat. No. 11,057,701.

*Staton Techiya, LLC, et al.* v. *Samsung Elecs. Co., Ltd., et al.*, Docket Control Order (Dkt. No. 43), Exhibit—2005, Filed on Oct. 7, 2022—Cited in IPR2022-01098, challenging U.S. Pat. No. 11,217,237.

*Staton Techiya, LLC, et al.* v. *Samsung Elecs. Co., Ltd., et al.*, Docket Control Order (Dkt. No. 43), Exhibit—2005, Filed on Oct. 7, 2022—Cited in IPR2022-01099, challenging U.S. Pat. No. 11,244,666.

*Staton Techiya, LLC, et al.* v. *Samsung Elecs. Co., Ltd., et al.*, Docket Control Order, Exhibit—2005, Filed on Oct. 11, 2022—Cited in IPR2022-01106, challenging U.S. Pat. No. 11,039,259.

*Staton Techiya, LLC, et al.* v. *Samsung Elecs. Co., Ltd., et al.*, Joint Motion to Consolidate (Dkt. No. 39), Exhibit—2007, Filed on Oct. 7, 2022—Cited in IPR2022-01078, challenging U.S. Pat. No. 11,057,701.

*Staton Techiya, LLC, et al.* v. *Samsung Elecs. Co., Ltd., et al.*, Joint Motion to Consolidate (Dkt. No. 39), Exhibit—2007, Filed on Oct. 7, 2022—Cited in IPR2022-01098, challenging U.S. Pat. No. 11,217,237.

*Staton Techiya, LLC, et al.* v. *Samsung Elecs. Co., Ltd., et al.*, Joint Motion to Consolidate (Dkt. No. 39), Exhibit—2007, Filed on Oct. 7, 2022—Cited in IPR2022-01099, challenging U.S. Pat. No. 11,244,666.

*Staton Techiya, LLC, et al.* v. *Samsung Elecs. Co., Ltd., et al.*, Joint Motion to Consolidate, Exhibit—2007, Filed on Oct. 11, 2022—Cited in IPR2022-01106, challenging U.S. Pat. No. 11,039,259.

*Staton Techiya, LLC, et al.* v. *Samsung Elecs. Co., Ltd., et al.*, Plaintiff's Infringement Contentions, dated Apr. 6, 2022, Exhibit—2008, Filed on Oct. 7, 2022—Cited in IPR2022-01078, challenging U.S. Pat. No. 11,057,701.

*Staton Techiya, LLC, et al.* v. *Samsung Elecs. Co., Ltd., et al.*, Plaintiff's P.R. 4-2 Disclosures, Exhibit—2003, Filed on Oct. 7, 2022—Cited in IPR2022-01099, challenging U.S. Pat. No. 11,244,666.

*Staton Techiya, LLC, et al.* v. *Samsung Elecs. Co., Ltd., et al.*, Plaintiffs' Infringement Contentions dated Apr. 6, 2022, Exhibit—2008, Filed on Oct. 11, 2022—Cited in IPR2022-01106, challenging U.S. Pat. No. 11,039,259.

*Staton Techiya, LLC, et al.* v. *Samsung Elecs. Co., Ltd., et al.*, Plaintiffs' Infringement Contentions, dated Apr. 6, 2022, Exhibit—2008, Filed on Oct. 7, 2022—Cited in IPR2022-01098, challenging U.S. Pat. No. 11,217,237.

*Staton Techiya, LLC, et al.* v. *Samsung Elecs. Co., Ltd., et al.*, Plaintiffs' Infringement Contentions, dated Apr. 6, 2022, Exhibit—2008, Filed on Oct. 7, 2022—Cited in IPR2022-01099, challenging U.S. Pat. No. 11,244,666.

*Staton Techiya, LLC, et al.* v. *Samsung Elecs. Co., Ltd., et al.*, Plaintiffs' P.R. 4-2 Disclosures, Exhibit—2003, Filed on Oct. 11, 2022—Cited in IPR2022-01106, challenging U.S. Pat. No. 11,039,259.

*Staton Techiya, LLC, et al.* v. *Samsung Elecs. Co., Ltd., et al.*, Plaintiffs' P.R. 4-2 Disclosures, Exhibit—2003, Filed on Oct. 7, 2022—Cited in IPR2022-01078, challenging U.S. Pat. No. 11,057,701.

*Staton Techiya, LLC, et al.* v. *Samsung Elecs. Co., Ltd., et al.*, Plaintiffs' P.R. 4-2 Disclosures, Exhibit—2003, Filed on Oct. 7, 2022—Cited in IPR2022-01098, challenging U.S. Pat. No. 11,217,237.

Stipulation Letter dated Apr. 20, 2022, Exhibit—1031, Filed on May 11, 2022—Cited in IPR2022-00324, challenging U.S. Pat. No. 8,254,591.

Stipulation Letter from D. Rokach to J. Snodgrass, Exhibit—1025, Filed on Nov. 10, 2022—Cited in IPR2022-01099, challenging U.S. Pat. No. 11,244,666.

(56)        References Cited

OTHER PUBLICATIONS

Stipulation Letter from D. Rokach to J. Snodgrass, Exhibit—1027, Filed on Nov. 10, 2022—Cited in IPR2022-01078, challenging U.S. Pat. No. 11,057,701.

Stipulation Letter from D. Rokach to J. Snodgrass, Exhibit—1030, Filed on Nov. 15, 2022—Cited in IPR2022-01098, challenging U.S. Pat. No. 11,217,237.

Stipulation Letter from D. Rokach to J. Snodgrass, Exhibit—1033, Filed on Nov. 10, 2022—Cited in IPR2022-01106, challenging U.S. Pat. No. 11,039,259.

Stipulation Letter, Exhibit—1015, Filed on Apr. 20, 2022—Cited in IPR2022-00282, challenging U.S. Pat. No. 8,315,400.

Stipulation Letter, Exhibit—1019, Filed on Jun. 14, 2022—Cited in IPR2022-00369, challenging U.S. Pat. No. 10,405,082.

Stipulation Letter, Exhibit—1019, Filed on Jun. 14, 2022—Cited in IPR2022-00388, challenging U.S. Pat. No. 10,966,015.

Stipulation Letter, Exhibit—1020, Filed on Jun. 14, 2022—Cited in IPR2022-00410, challenging U.S. Pat. No. 10,979,836.

Stipulation Letter, Exhibit—1023, Filed on May 10, 2022—Cited in IPR2022-00302, challenging U.S. Pat. No. 9,609,424.

Stipulation Letter, Exhibit—1044, Filed on Apr. 20, 2022—Cited in IPR2022-00242, challenging U.S. Pat. No. 8,111,839.

Stipulation Letter, Exhibit—1044, Filed on Apr. 20, 2022—Cited in IPR2022-00243, challenging U.S. Pat. No. 8,111,839.

Stipulation Letter; Exhibit—1034, Filed on Apr. 20, 2022—Cited in IPR2022-00234, challenging U.S. Pat. No. 9124982.

Summary of all applications in the '082 patent family, Exhibit—1018, Filed on Dec. 30, 2021—Cited in IPR2022-00369, challenging U.S. Pat. No. 10,405,082.

Summary of all applications in the '836 patent's family, Exhibit—1019, Filed on Jan. 14, 2022—Cited in IPR2022-00410, challenging U.S. Pat. No. 10,979,836.

Summary of Application in '839 Patent Priority Chain, Exhibit—1041, Filed on Dec. 13, 2021—Cited in IPR2022-00243, challenging U.S. Pat. No. 8,111,839.

Summary of applications in '015 patent family, Exhibit—1018, Filed on Jan. 4, 2022—Cited in IPR2022-00388, challenging U.S. Pat. No. 10,966,015.

Summary of applications in '591 priority chain, Exhibit—1030, Filed on Dec. 20, 2021—Cited in IPR2022-00324, challenging U.S. Pat. No. 8,254,591.

Summary of Applications in '839 Priority Chain, Exhibit—1041, Filed on Dec. 13, 2021—Cited in IPR2022-00242, challenging U.S. Pat. No. 8,111,839.

Summary of Applications in '982 Priority Chain; Exhibit—1032, Filed on Dec. 13, 2021—Cited in IPR2022-00234, challenging U.S. Pat. No. 9124982.

Techopedia, Faceplate, Exhibit—2011, Filed on Sep. 13, 2022—Cited in IPR2022-00242, challenging U.S. Pat. No. 8,111,839.

Techopedia, Faceplate; Exhibit—2010, Filed on Sep. 9, 2022—Cited in IPR2022-00234, challenging U.S. Pat. No. 9124982.

Termination Decision: Post-DI Settlement, Exhibit—20, Filed on Dec. 12, 2024—Cited in IPR2024-00559, challenging U.S. Pat. No. 11,610,587.

Termination Decision: Pre-DI settlement, Exhibit—16, Filed on Dec. 12, 2024—Cited in IPR2024-01003, challenging U.S. Pat. No. 9,191,083.

Termination Decision: Pre-DI settlement, Exhibit—16, Filed on Dec. 12, 2024—Cited in IPR2024-01004, challenging U.S. Pat. No. 9,614,943.

Termination Decision: Pre-DI settlement, Exhibit—16, Filed on Dec. 12, 2024—Cited in IPR2024-01031, challenging U.S. Pat. No. 7,049,850.

Termination Decision: Pre-DI settlement, Exhibit—17, Filed on Dec. 12, 2024—Cited in IPR2024-01034, challenging U.S. Pat. No. 9,279,263.

Termination Decision: Pre-DI settlementPaper15, Dec. 12, 2024—Cited in IPR2024-01033, challenging U.S. Pat. No. 8,434,966.

Transcript of Deposition of Chris Kyriakakis, Ph.D. taken Oct. 7, 2022, Exhibit—2007, Filed on Oct. 17, 2022—Cited in IPR2022-00302, challenging U.S. Pat. No. 9,609,424.

Transcript of Deposition of Christopher Struck, Exhibit—1028, Filed on Jun. 15, 2023—Cited in IPR2022-01078, challenging U.S. Pat. No. 11,057,701.

Transcript of Deposition of Dr. Les Atlas, Exhibit—2007, Filed on Oct. 17, 2022—Cited in IPR2022-00324, challenging U.S. Pat. No. 8,254,591.

Transcript of Deposition of Dr. Les Atlas; Exhibit—2007, Filed on Sep. 9, 2022—Cited in IPR2022-00234, challenging U.S. Pat. No. 9124982.

Transcript of Deposition of Les Atlas, Ph.D., Aug. 18, 2022, Exhibit—2007, Filed on Sep. 13, 2022—Cited in IPR2022-00242, challenging U.S. Pat. No. 8,111,839.

Transcript of Deposition of Les Atlas, Ph.D., Aug. 18, 2022, Exhibit—2007, Filed on Sep. 13, 2022—Cited in IPR2022-00243, challenging U.S. Pat. No. 8,111,839.

Transcript of Deposition of Les Atlas, Ph.D., Exhibit—2016, Filed on Apr. 10, 2023—Cited in IPR2022-01106, challenging U.S. Pat. No. 11,039,259.

Transcript of Deposition of Nathaniel Polish, Ph.D., taken Sep. 29, 2022, Exhibit—2007, Filed on Oct. 19, 2022—Cited in IPR2022-00253, challenging U.S. Pat. No. 9,491,542.

Transcript of Deposition of Nathaniel Polish, Ph.D., taken Sep. 29, 2022, Exhibit—2007, Filed on Oct. 19, 2022—Cited in IPR2022-00281, challenging U.S. Pat. No. 9,270,244.

Transcript of Deposition of Richard M. Stern, Exhibit—2010, Filed on Mar. 23, 2023—Cited in IPR2022-01078, challenging U.S. Pat. No. 11,057,701.

Transcript of Deposition of Richard M. Stern, Ph.D., taken Oct. 27, 2022, Exhibit—2009, Filed on Nov. 8, 2022—Cited in IPR2022-00369, challenging U.S. Pat. No. 10,405,082.

Transcript of Deposition of Richard M. Stern, Ph.D., taken Oct. 27, 2022, Exhibit—2009, Filed on Nov. 8, 2022—Cited in IPR2022-00388, challenging U.S. Pat. No. 10,966,015.

Transcript of Deposition of Richard Stern, Ph.D., Exhibit—2010, Filed on Sep. 9, 2022—Cited in IPR2022-00282, challenging U.S. Pat. No. 8,315,400.

U.S. Appl. No. 09/653,869, Exhibit—1007, Filed on Dec. 20, 2021—Cited in IPR2022-00324, challenging U.S. Pat. No. 8,254,591.

U.S. Pat. No. 10,405,082, Exhibit—1001, Filed on Dec. 30, 2021—Cited in IPR2022-00369, challenging U.S. Pat. No. 10,405,082.

U.S. Appl. No. 61/778,737, Exhibit—1008, Filed on Dec. 21, 2021—Cited in IPR2022-00281, challenging U.S. Pat. No. 9,270,244.

U.S. Appl. No. 62/575,713, Exhibit—1006, Filed on Dec. 30, 2021—Cited in IPR2022-00369, challenging U.S. Pat. No. 10,405,082.

U.S. Appl. No. 62/575,713, Exhibit—1006, Filed on Jan. 4, 2022—Cited in IPR2022-00388, challenging U.S. Pat. No. 10,966,015.

Wikipedia, Apple headphones, Exhibit—2010, Filed on Sep. 13, 2022—Cited in IPR2022-00243, challenging U.S. Pat. No. 8,111,839.

Wikipedia, Microphone, Exhibit—2012, Filed on 9/13/2022—Cited in IPR2022-00242, challenging U.S. Pat. No. 8,111,839.

Wikipedia, Microphone; Exhibit—2011, Filed on Sep. 9, 2022—Cited in IPR2022-00234, challenging U.S. Pat. No. 9124982.

Wiley Elec and Elecs Eng Dictionary (excerpts), Exhibit—2004, Filed on Mar. 21, 2022—Cited in IPR2022-00282, challenging U.S. Pat. No. 8,315,400.

Wiley Electrical and Electronics Engineering Dictionary (excerpt), Exhibit—2009, Filed on Oct. 7, 2022—Cited in IPR2022-01098, challenging U.S. Pat. No. 11,217,237.

Olwal, A. and Feiner S. Interaction Techniques Using Prosodic Features of Speech and Audio Localization. Proceedings of IUI 2005 (International Conference on Intelligent User Interfaces), San Diego, CA, Jan. 9-12, 2005, p. 284-286.

Bernard Widrow, John R. Glover Jr., John M. McCool, John Kaunitz, Charles S. Williams, Robert H. Hearn, James R. Zeidler, Eugene Dong Jr, and Robert C. Goodlin, Adaptive Noise Cancelling: Principles and Applications, Proceedings of the IEEE, vol. 63, No. 12, Dec. 1975.

Mauro Dentino, John M. McCool, and Bernard Widrow, Adaptive Filtering in the Frequency Domain, Proceedings of the IEEE, vol. 66, No. 12, Dec. 1978.

(56) References Cited

OTHER PUBLICATIONS

3M/Aearo Technologies' E-A-RFitTM Dual-Ear Validation System ("E-A-RFit"), Sept. 4, 2015 WayBack Machine capture of 3M's website contains an image of the E-A-RFit and states "[t]he 3M™ E-A-Rfit™ Dual Ear Validation System makes . . . " https://web.archive.org/web/20150904132810/http:/solutions.3m.com/wps/portal/3M/en_US/3M-PPE-Safety-Solutions/Personal-Protective-Equipment/safety-management/safety-training/hearing- protection-fit-testing/?WT.mc_id=www.3m.com/EARfitDe mo/ (SAM-TECH_00052276; Sam- Tech ; SAM-TECH 00052239), 2 pgs.
3M/Aearo Technologies' E-A-RFitTM Validation System ("E-A-RFit"), 2010 brochure from 3M' s website describes the E-A-RFit and identifies model 393-1000 as an available mode. https://multimedia.3m.com/mws/media/62914 90/3m-e-a-rfit-validation-system- brochure.pdf (SAM-TECH 00052186), 5 pages.
3M/Aearo Technologies' E-A-RFitTM Validation System ("E-A-RFit"), Abstract titled "New from ISEA member 3M Company (www.3m.com] is the E-A-Rfit Validation System a quantitative hearing protector fittest", publ. in Jul. 2012. New from ISEA member 3M Company (www.3m.com] is the E-A-Rfit Validation System a quantitative hearing protector fittest, EHS today, vol. 5, Iss.7, ISSN 1945-9599, Gale Group Trade & Industry Database (Jul. 2012), avail. at https://dialog.proquest.com/professional/docview/1095272736?accountid=154502 (SAM-TECH_00052203), 1 pg.
3M/Aearo Technologies' E-A-RFitTM Validation System ("E-A-RFit"), Apr. 24, 2007 article publ. by E.H. Berger from Aearo Technologies discusses E-A-RFit and notes that "[t]he E-A-RFitTM Validation System is a quick and accurate method of estimating real-ear attenuation for a given fitting of a pair of earplugs" and "has been designed and built to be an integral . . . " See E.H. Berger, Recommended Applications for the E-A-RFitTM Validation System in a Workplace Hearing Conservation Program, Aearo Company (2007) (SAM-TECH_00056087-SAM-TECH_0005609), 6 pgs.
3M/Aearo Technologies' E-A-RFitTM Validation System ("E-A-RFit"), Mar. 16, 2016 WayBack Machine capture of 3M's website lists the E-A-RFit for purchase. https://web.archive.org/web/20160316180537/ http://www.3m.com/3M/en_US/company- us/all-3m-products/-/All-3M- Products/Personal-Protective- Equipment/Hearing- Protection/Safety/Worker- Health-Safety/?N=5002385+8709322+8711017+8711405+8720 539+8720546+8720770+ 329 4857497&rt=r3 (SAM-TECH 00052201), 1 pages.
3M/Aearo Technologies' E-A-RFitTM Validation System ("E-A-RFit"), Mar. 20, 2016 WayBack Machine capture of 3M's website describes the Validation System and protection that the system offers. https://web.archive.org/web/20160320080156/ http:/www.3m.com/3M/en_US/company-us/all-3m-products/-/All-3M- Products/Personal-Protective- Equipment/Hearing- Protection/Safety/Worker- Health- Safety/?N=5002385+8709322+8711017+871 1405+8720539+8720546+3294857497&rt=r3 (SAM-TECH_00052278; SAM-TECH 00052292), 2 pages.
3M/Aearo Technologies' E-A-RFitTM Validation System ("E-A-RFit"), Sep. 10, 2015 WayBack Machine capture of 3M's website depicts a brochure describing the E-A-RFit and "Individual Fit Testing Using F-Mire." https://web.archive.org/web/20150910084252/ http:/multimedia.3m.com/mws/media/ 10622 670/earfit-dual-ear-brochure- us.pdf?fn=EARfit%20Dual- Ear%20Brochure%20US.pdf (SAM-TECH_00052333-SAM-TECH_00052336; SAM-TECH 00052339-SAM-TECH 00052339), 5 pages.
U.S. Appl. No. 90/019,169, Samsung Electronics Co, Ltd. and Samsung Electronics, America, Inc, Request For Ex Parte Reexamination Of U.S. Pat. No. 11,244,666, Feb. 24, 2023, 148 pages.
A binaural processor for missing data speech recognition in the presence of noise and small-room reverberation, Kalle Palomaki, Guy Brown & Deliang Wang, Speech Communication, 43, Sep. 2004, pp. 361-378.
A compact multi-sensor headset for hands-free communication, Liu, Zicheng & Seltzer, Michael & Acero, A. & Tashev, Ivan & Zhang, Zhengyou & Sinclair, Michael, IEEE Workshop on Applications of Signal Processing to Audio and Acoustics, 138-141. 10.1109/ASPAA. 2005.1540188, 5 pages.
A Dual—Mode Human—Machine Interface for Robotic Control Based on Acoustic Sensitivity of the Aural Cavity—Ravi Vaidyanathan, et al., Feb. 2006, 7 pages.
A Dual-Mode Human-Machine Interface for Robotic Control Based on Acoustic Sensitivity of the Aural Cavity Claim Chart (Exhibit N49 to Samsung's Invalidity Contentions), 2006, 7 pages.
A Local Active Noise Control System for Locomotive Drivers, internoise 2000, the 29th International Congress and Exhibition on Noise Control Enginerring, Nielsen, Saebo, Ottesen, Reinen, Sorsdal, Aug. 2000, 4 pages.
A MFCC-based CELP speech coder for server-based speech recognition in network environments, Yoon, Jae Sam, Gil Ho Lee, and Hong Kook Kim, IEICE Transactions on Fundamentals of Electronics, Communications and Computer Sciences 90.3, 626-632, Mar. 2007, 7 pages.
A Modified Coherence Based Method for Dual Microphone Speech Enhancement, M. Rahmani, et al., Signal Processing and Communications, 2007, 4 pages.
A New Two—Sensor Active Noise Cancellation Algorithm, K.C. Zangi, 1993 IEEE International Conference on Acoustics, Speech, and Signal Processing, Minneapolis, MN, USA, 1993, pp. 351-354 vol. 2, doi: 10, 4 pages.
A Pattern Recognition Approach to Voiced-Unvoiced-Silence Classification with Applications to Speech Recognition, B. Atal and L. Rabiner, IEEE Transactions on Acoustics, Speech, and Signal Processing, vol. 24, No. 3, pp. 201-212, Jun. 1976, 12 pages.
Active Noise Attenuation Using LQG/LTR Control, Garcia, Jose & Bortoloto, Edson & Ribeiro, Jean & Garcia, Eletronica de Potencia. 9. 23-27, Eletronica de Potencia. 9. 23-27. 10.18618/REP.2005.2.023027, Nov. 2004, 5 pages.
Active Noise Cancellation for Headphones Used in High Noise Environments Using Conventional Analog Circuitry, Mark C. Flohr, May 1, 1987, 74 pages.
Active Noise Control System for Headphone Applications Sen M. Kuo, et al. 2006, 5 pages.
Active Noise Control: Low-Frequency Techniques for Suppressing Acoustic Noise Leap Forward with Signal Processing, S.J. Elliott and P.A. Nelson, Oct. 1993, 24 pages.
Active Noise Reduction Headphone Measurement: Comparison Of Physical And Psychophysical Protocols And Effects Of Microphone Placement, PERALA, Apr. 10, 2006, 204 pages.
Active noise Reduction in an ear terminal, Ottesen, The Journal of the Acoustical Society of America, vol. 105, Issue 2, Feb. 1999, 4 pages.
Adaptive Feedback Active Noise Control Headset: Implementation, Evaluation, and its Extensions, Woon S. Gan, et al. 2005, 8 pages.
Adaptive Filtering in the Frequency Domain, M. Dentino, J. Mccool & B. Widrow, Proceedings of the IEEE, vol. 66, No. 12, pp. 1658-1659, Dec. 1978, 2 pages.
Adaptive Noise Cancellation in a Multimicrophone System for Distortion Product Otoacoustic Emission Acquisition, Rafael E. Delgado, et al., 2000, 11 pages.
Adaptive Noise Cancelling In Headsets, Per Rubak, Henrik D. Green & Lars G. Johansen, Proceedings of IEEE Nordic Signal Processing Symposium, NORSIG'96, Sep. 24-27, 1996, Espoo, Finland, 8 pages.
Air- and Bone-Conductive Integrated Microphones for Robust Speech Detection and Enhancement, Yanli Zheng, et al., 2003 IEEE Workshop on Automatic Speech Recognition and Understanding, 6 pages.
An Integrated Audio And Active Noise Control Headsets, W. S. Gan & S. M. Kuo, IEEE Transactions on Consumer Electronics, vol. 48, No. 2, pp. 242-247, May 2002, 6 pages.
Appendix 10A-10C for U.S. Pat. No. 10,979,836 to Samsung's Invalidity Contentions and P.R. 3-3 And 3-4 Disclosures for U.S. Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 41 pages.
Appendix 11A-11C for U.S. Pat. No. 11,039,259 to Samsung's Invalidity Contentions and P.R. 3-3 And 3-4 Disclosures for U.S.

(56) References Cited

OTHER PUBLICATIONS

Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 12 pages.

Appendix 12A-12C for U.S. Pat. No. 11,057,701 to Samsung's Invalidity Contentions and P.R. 3-3 And 3-4 Disclosures for U.S. Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 14 pages.

Appendix 13A-13C for U.S. Pat. No. 11,217,237 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 23 pages.

Appendix 14A-14C for U.S. Pat. No. 11,244,666 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 15 pages.

Appendix 1A-1C for U.S. Pat. No. 8,111,839 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 29 pages.

Appendix 2A-2C for U.S. Pat. No. 8,254,591 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 31 pages.

Appendix 3A-3C for U.S. Pat. No. 8,315,400 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 21 pages.

Appendix 4A-4C for U.S. Pat. No. 9,124,982 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 28 pages.

Appendix 5A-5C for U.S. Pat. No. 9,270,244 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 22 pages.

Appendix 6A-6C for U.S. Pat. No. 9,491,542 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 24 pages.

Appendix 7A-7C for U.S. Pat. No. 9,609,424 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 45 pages.

Appendix 8A-8C for U.S. Pat. No. 10,405,082 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 13 pages.

Appendix 9A-9Cfor U.S. Pat. No. 8,111,839 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 14 pages.

Apple's AirPods Pro ("AirPods Pro"), Article on Apple's website published Apr. 15, 2020 mentions the AirPods Pro has an Ear Tip Fit test available. https://support.apple.com/en-us/HT210633 (SAM-TECH_00072120-SAM-TECH_00072123), 4 pages.

Apple's AirPods Pro ("AirPods Pro"), article published by Dan Seifert on Mar. 29, 2019 reviews the AirPods Pro and states Apple is selling the second-gen AirPods in two ways: with the new wireless charging case for $199 or with the standard case for the same $159 as before. https://www.theverge.com/2019/3/29/182860 12/apple-airpods-2-new-2nd-gen-review-price-specs-features; (SAM-TECH_00057262-SAM-TECH_00057275), 14 pages.

Apple's AirPods Pro ("AirPods Pro"),Dec. 21, 2019 WayBack Machine capture of Apple's website displays an image of the AirPods Pro and states "[u]se the Ear Tip Fit Test to create the optimal listening experience—you'll get the right tip size for your ears, and the best seal for noise cancellation." https://web.archive.org/web/20191221170719/ https://www.apple.com/airpods-pro/ (SAM-TECH_00054447; SAM-TECH_00054134), 12 pages.

Apple's AirPods Pro ("AirPods Pro"),Nov. 2, 2019 article by Karisa Bell published on mashable.com discusses whether Apple's AirPods Pro are compatible with Androids. https://mashable.com/article/do-airpods-pro- work-with-android. (SAM-TECH_00052378-SAM-TECH_00052390), 13 pages.

Apple's AirPods Pro ("AirPods Pro"), Oct. 29, 2019 artcile by Sarah Rense also discusses testing out the AirPods Pro with active-noise cancellation. https://www.esquire.com/lifestyle/a29612084/apple-airpods-pro-active-noise-cancellation-review/ (SAM-TECH_00058067-SAM-TECH_00058080), 14 pages.

Apple's AirPods Pro ("AirPods Pro"), The specs of the AirPods Pro can be found here https://web.archive.org/web/20191224065355/ https://www.apple.com/airpods-pro/specs/ (SAM-TECH_00052343-SAM-TECH_00052352; SAM-TECH_00053159), May 6, 2022, 11 pages.

Apple's iPhone 11 (iPhone 11"), Oct. 11, 2019 article published by Jake Peterson discusses the eartip fit test using AirPods Pro and an iPhone running iOS 13.2. https://ios.gadgethacks.com/how-to/make- your-airpods-pro-fit-better-by-testing- rubber-tips-0210500/ (SAM-TECH_00056564-SAM-TECH_00056569), 6 pages.

Apple's iPhone 11 (iPhone 11"), Press release from Apple's website dated Sep. 10, 2019 states "Apple introduces dual camera iPhone 11" and that "Customers in the US, Puerto Rico, the US Virgin Islands and more than 30 other countries and regions will be able to pre-order iPhone 11 beginning at 5 a.m. PDT on Friday, Sep. 13 with availability beginning Friday, Sep. 20." https://www.apple.com/newsroom/2019/09/a pple-introduces-dual-camera-iphone-11/ (SAM-TECH_00056571-SAM-TECH_00056588), 18 pages.

Apple's iPhone 11 (iPhone 11"), Sep. 15, 2019 WayBack Machine capture of Apple's website has an image of the iPhone 11 and lists it for sale on the website. https://web.archive.org/web/20190915061032 /https://www.apple.com/shop/buy- iphone/iphone-11; (SAM-TECH_00055106-SAM-TECH_00055123), 18 pages.

Apple's iPhone 11 (iPhone 11"), WayBack Machine capture from Sep. 16, 2019 of Apple's website, displays the iPhone and states "Available 9.20." https://web.archive.org/web/20190916102733/ https://www.apple.com/iphone-11/specs/. (SAM-TECH_00056907), 1 pages.

Audiometric Ear Canal Probe with Active Ambient Noise Control, B. Rafaely & M. Furst, IEEE Transactions on Speech and Audio Processing, vol. 4, No. 3, pp. 224-230, May 1996, 7 pages.

Bang and Olufsen EarSet 2 Bluetooth Headset, At least by 2006, https://www .dexigner.com/news/9935 (SAM-TECH 00094865), 7 pages.

Bang and Olufsen EarSet 2 Bluetooth Headset, At least by 2006, https://www.beoworld.org/prod details.asp?pid=733 (SAM-TECH 00094798), 3 pages.

Berger, Preferred Methods for Measuring Hearing Protector Attenuation, Environmental Noise Control, 2005, The 2005 Congress and Exposition on Noise Control Engineering, 2005, 11 pages.

Brian Hobbs et al, Wideband Hearing, Intelligibility, and Sound Protection, Jan. 10, 2008 Final Report AFRL-RH-WP-TR-2009-0031 at 2 (SAM-TECH_00053002-116), 115 pages.

Build These Noise-Cancelling Headphones, Jules Ryckebusch, 1997, 10 pages.

Chung, Challenges and Recent Developments in Hearing Aids, Trends in Amplification, 2004, pp. 125-164, vol. 8, No. 4.

Combined feedback-feedforward active noise-reducing headset—The effect of the acoustics on broadband performance, Boaz Rafaely & Matthew Jones, J. Acoust. Soc. Am. Sep. 1, 2002; 112 (3): 981-989, 10 pages.

(56) References Cited

OTHER PUBLICATIONS

Dec. 25, 2005 WayBack Machine Capture of Maico' s website has an image of the Maico MI26 and discusses the products features. https://web.archive.org/web/20051225200404/http:/www.maico- diag-nostics.com/eprise/main/Maico/Products/ Files/MI26/SpecSheet. MI24- 26.NEW.pdf (SAM-TECH 00051161-SAM-TECH 00051162), 2 pages.

Declaration and Affirmation of Debbie Montgomery, as presented in *Samsung* v. *Techiya*, IPR2022-00410 as Exhibit 1018, including that Declaration's attached Exhibit A (2022), 10 pages.

Direct filtering for air- and bone-conductive microphones, Zicheng Liu, Zhengyou Zhang, A. Acero, J. Droppo and Xuedong Huang, IEEE 6th Workshop on Multimedia Signal Processing, 2004, Siena, Italy, 2004, pp. 363-366, 6 pages.

E-3 In-Flight Acoustic Exposure Studies and Mitigation Via Active Noise Reduction Headset, Frank Mobley, John Allen Hall, & Donald Yeager, Dec. 2002, 73 pages.

Etymotic ER-6 Earphones, At least by Feb. 7, 2005, https://www.cnet.com/reviews/etymoti c-er-6-review/ (SAM-TECH 00095121), 5 pages.

Etymotic ER-6 Earphones, At least by Feb. 7, 2005, https://www.etymotic.com/ephp/er6i- ts.aspx (SAM-TECH 00095178), 1 pages.

Etymotic's ER-33 Occlusion Effect Meter ("ER-33"), Apr. 9, 2001 WayBack Machine capture of Etymotic's website contains an image of the ER-33 and states that "[t]he ER-33 Occlusion Effect Meter quickly quantifies the occlusion effect and earmold leakage" and was on sale for $350.00. https://web.archive.org/web/20010404224259/ https://www.etymotic.com/ (SAM-TECH_00054976), 1 pages.

Etymotic's ER-33 Occlusion Effect Meter ("ER-33"), Aug. 2003 article by H. Gustav Mueller in the Hearing Journal, Mueller describes the ER-33 as a product manufactured by Etymotic that "costs no more than a few bottles of good wine." See H. Gustav Mueller, There's less talking in barrels, but the occlusion effect is still with us, 56 Hearing J. 10, 14 (2003) (SAM-TECH_00054761-SAM-TECH_00054764), 4 pages.

Etymotic's ER-33 Occlusion Effect Meter ("ER-33"), Dec. 5, 2004 article submitted by Wayne J. Staab to The Hearing Review, discusses the ER-33 and notes "[t]he occlusion effect was measured with the ER-33 Occlusion Effect meter (Figure 5) using a probe tube extending 2 mm beyond the receiver tip. The ER-33 is a hand-held device that measures both . . . " https://hearingreview.com/practice-building/practice-management/measuring- the-occlusion-effect-in-a-deep-fitting- hearing-device (SAM-TECH_00060339-SAM-TECH_00060350), 12 pgs.

Etymotic's ER-33 Occlusion Effect Meter ("ER-33"), Mar. 3, 2005 capture of Etymotic's website contains a description of the ER-33 which includes a sale price for $350.00. https://web.archive.org/web/20050303170952/ http://www.etymotic.com/pro/er33.asp (SAM-TECH_00054986), 1 pages.

Etymotic's ER-33 Occlusion Effect Meter ("ER-33"), Mar. 4, 2005 WayBack Machine capture of Etymotic's website contains a user manual for the ER-33 which was on sale at that time. https://web.archive.org/web/20050304030715/ http://www.etymotic.com/pdf/er33-oem- usermanual.pdf (SAM-TECH_00055001; SAM-TECH_00060165), 11 pages.

Ex. A1 (Nacre QuietPro) to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 49 pages.

Ex. A10 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 59 pages.

Ex. A11 (NaturalRecorder) to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 29 pages.

Ex. A12 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 28 pages.

Ex. A13 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 20 pages.

Ex. A14 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 26 pages.

Ex. A15 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 34 pages.

Ex. A16 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 26 pages.

Ex. A17 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 37 pages.

Ex. A18 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 34 pages.

Ex. A19 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 42 pages.

Ex. A2 (Silynx QuietOps) to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 69 pages.

Ex. A20 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 39 pages.

Ex. A21 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 52 pages.

Ex. A22 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 24 pages.

Ex. A23 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 45 pages.

Ex. A24 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 29 pages.

(56) References Cited

OTHER PUBLICATIONS

Ex. A25 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 16 pages.

Ex. A26 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 26 pages.

Ex. A27 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 32 pages.

Ex. A28 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 26 pages.

Ex. A29 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 28 pages.

Ex. A3 (Motorola H5) to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 55 pages.

Ex. A30 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 21 pages.

Ex. A31 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 343 pages.

Ex. A32 (Olympus WS-320M) to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 97 pages.

Ex. A33 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 24 pages.

Ex. A34 to Samsung's Invalidity Contentions and P.R. 3-3 And 3-4 Disclosures for U.S. Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 27 pages.

Ex. A35 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 65 pages.

Ex. A4 (Jawbone Aliph) to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 50 pages.

Ex. A5 (Snooper) to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 29 pages.

Ex. A6 (NCH Swift) to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 58 pages.

Ex. A7 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 66 pages.

Ex. A8 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 35 pages.

Ex. A9 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 39 pages.

Ex. B1 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 63 pages.

Ex. B10 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 73 pages.

Ex. B11 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 127 pages.

Ex. B12 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 67 pages.

Ex. B13 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 69 pages.

Ex. B14 to Samsung's Invalidity Contentions and P.R. 3-3 And 3-4 Disclosures for U.S. Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 78 pages.

Ex. B15 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 76 pages.

Ex. B16 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 102 pages.

Ex. B17 to Samsung's Invalidity Contentions and P.R. 3-3 And 3-4 Disclosures for U.S. Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 77 pages.

Ex. B18 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 110 pages.

(56)　　　References Cited

OTHER PUBLICATIONS

Ex. B19 to Samsung's Invalidity Contentions and P.R. 3-3 And 3-4 Disclosures for U.S. Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 102 pages.

Ex. B2 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 104 pages.

Ex. B3 to Samsung's Invalidity Contentions and P.R. 3-3 And 3-4 Disclosures for U.S. Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 39 pages.

Ex. B4 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 68 pages.

Ex. B5 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 79 pages.

Ex. B6 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 80 pages.

Ex. B7 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 68 pages.

Ex. B8 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 66 pages.

Ex. B9 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 72 pages.

Ex. C1 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 65 pages.

Ex. C10 to Samsung's Invalidity Contentions and P.R. 3-3 And 3-4 Disclosures for U.S. Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 96 pages.

Ex. C11 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 140 pages.

Ex. C12 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 51 pages.

Ex. C13 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 40 pages.

Ex. C14 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 115 pages.

Ex. C15 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 112 pages.

Ex. C2 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 144 pages.

Ex. C3 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 103 pages.

Ex. C4 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 123 pages.

Ex. C5 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 97 pages.

Ex. C6 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 141 pages.

Ex. C7 to Samsung's Invalidity Contentions and P.R. 3-3 And 3-4 Disclosures for U.S. Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 89 pages.

Ex. C8 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 169 pages.

Ex. C9 to Samsung's Invalidity Contentions and P.R. 3-3 And 3-4 Disclosures for U.S. Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 66 pages.

Ex. D1 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 47 pages.

Ex. D10 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 32 pages.

Ex. D11 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 58 pages.

Ex. D12 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 68 pages.

(56) References Cited

OTHER PUBLICATIONS

Ex. D13 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 40 pages.

Ex. D14 to Samsung's Invalidity Contentions and P.R. 3-3 And 3-4 Disclosures for U.S. Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 28 pages.

Ex. D15 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 26 pages.

Ex. D16 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 38 pages.

Ex. D17 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 38 pages.

Ex. D18 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 34 pages.

Ex. D19 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 42 pages.

Ex. D2 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 30 pages.

Ex. D20 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 41 pages.

Ex. D21 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 25 pages.

Ex. D22 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 28 pages.

Ex. D23 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 67 pages.

Ex. D24 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 51 pages.

Ex. D25 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 24 pages.

Ex. D26 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 17 pages.

Ex. D27 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 40 pages.

Ex. D28 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 26 pages.

Ex. D29 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 28 pages.

Ex. D3 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 29 pages.

Ex. D30 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 20 pages.

Ex. D31 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 21 pages.

Ex. D32 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 254 pages.

Ex. D4 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 128 pages.

Ex. D5 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 120 pages.

Ex. D6 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 77 pages.

Ex. D7 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 62 pages.

Ex. D8 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 54 pages.

Ex. D9 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 61 pages.

(56)         References Cited

OTHER PUBLICATIONS

Ex. E1 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 136 pages.

Ex. E10 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 86 pages.

Ex. E11 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 40 pages.

Ex. E12 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 54 pages.

Ex. E13 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 123 pages.

Ex. E14 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 101 pages.

Ex. E15 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 147 pages.

Ex. E16 to Samsung's Invalidity Contentions and P.R. 3-3 And 3-4 Disclosures for U.S. Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 95 pages.

Ex. E17 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 23 pages.

Ex. E18 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 29 pages.

Ex. E2 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 59 pages.

Ex. E3 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 79 pages.

Ex. E4 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 63 pages.

Ex. E5 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 101 pages.

Ex. E6 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 49 pages.

Ex. E7 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 75 pages.

Ex. E8 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 54 pages.

Ex. E9 (corrected) to Samsung's Invalidity Contentions and P.R. 3-3 And 3-4 Disclosures for U.S. Pat. Nos. 8,111,839, 8,254,591, 8,315,400, 9, 124,982, 9,270,244, 9,491,542, 9,609,424, 10,405,082, 10,966,015 (Case No. 2:22-CV-00053-JRG-RSP), served May 18, 2022, 55 pages.

Ex. F1 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 192 pages.

Ex. F10 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 133 pages.

Ex. F11 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 55 pages.

Ex. F12 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 82 pages.

Ex. F13 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 174 pages.

Ex. F14 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 151 pages.

Ex. F15 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 221 pages.

Ex. F16 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 139 pages.

Ex. F17 to Samsung's Invalidity Contentions and P.R. 3-3 And 3-4 Disclosures for U.S. Pat. Nos. 8, 111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 27 pages.

Ex. F18 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 39 pages.

(56) References Cited

OTHER PUBLICATIONS

Ex. F2 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 80 pages.

Ex. F3 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 105 pages.

Ex. F4 (corrected) to Samsung's Invalidity Contentions and P.R. 3-3 And 3-4 Disclosures for U.S. Pat. Nos. 8,111,839, 8,254,591, 8,315,400, 9, 124,982, 9,270,244, 9,491,542, 9,609,424, 10,405,082, 10,966,015 (Case No. 2:22-CV-00053-JRG-RSP), served May 18, 2022, 78 pages.

Ex. F5 (corrected) to Samsung's Invalidity Contentions and P.R. 3-3 And 3-4 Disclosures for U.S. Pat. Nos. 8,111,839, 8,254,591, 8,315,400, 9, 124,982, 9,270,244, 9,491,542, 9,609,424, 10,405,082, 10,966,015 (Case No. 2:22-CV-00053-JRG-RSP), served May 18, 2022, 81 pages.

Ex. F6 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 61 pages.

Ex. F7 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 116 pages.

Ex. F8 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 68 pages.

Ex. F9 (corrected) to Samsung's Invalidity Contentions and P.R. 3-3 And 3-4 Disclosures for U.S. Pat. Nos. 8,111,839, 8,254,591, 8,315,400, 9, 124,982, 9,270,244, 9,491,542, 9,609,424, 10,405,082, 10,966,015 (Case No. 2:22-CV-00053-JRG-RSP), served May 18, 2022, 78 pages.

Ex. G1 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 143 pages.

Ex. G10 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 51 pages.

Ex. G11 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 47 pages.

Ex. G12 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 35 pages.

Ex. G13 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 40 pages.

Ex. G14 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 29 pages.

Ex. G15 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 259 pages.

Ex. G16 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 96 pages.

Ex. G17 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 74 pages.

Ex. G18 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 58 pages.

Ex. G19 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 41 pages.

Ex. G2 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 41 pages.

Ex. G20 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 40 pages.

Ex. G21 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 29 pages.

Ex. G22 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 83 pages.

Ex. G23 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 94 pages.

Ex. G24 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 166 pages.

Ex. G25 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 69 pages.

Ex. G26 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 134 pages.

Ex. G27 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 64 pages.

(56)　　　　　References Cited

OTHER PUBLICATIONS

Ex. G28 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 54 pages.

Ex. G29 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 35 pages.

Ex. G3 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 40 pages.

Ex. G30 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 50 pages.

Ex. G31 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 52 pages.

Ex. G32 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 242 pages.

Ex. G33 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 166 pages.

Ex. G34 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 185 pages.

Ex. G35 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 56 pages.

Ex. G4 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 212 pages.

Ex. G5 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 114 pages.

Ex. G6 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 92 pages.

Ex. G7 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 81 pages.

Ex. G8 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 81 pages.

Ex. G9 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 68 pages.

Ex. H1 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 187 pages.

Ex. H10 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 124 pages.

Ex. H11 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 159 pages.

Ex. H12 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 141 pages.

Ex. H15 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 175 pages.

Ex. H16 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 92 pages.

Ex. H17 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 44 pages.

Ex. H18 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 32 pages.

Ex. H19 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 114 pages.

Ex. H2 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 138 pages.

Ex. H20 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 78 pages.

Ex. H3 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 93 pages.

Ex. H4 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 59 pages.

(56) References Cited

OTHER PUBLICATIONS

Ex. H6 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 75 pages.

Ex. H7 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 73 pages.

Ex. H8 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 55 pages.

Ex. H9 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 86 pages.

Ex. I1 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 209 pages.

Ex. I10 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 161 pages.

Ex. I11 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 219 pages.

Ex. I12 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 182 pages.

Ex. I15 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 219 pages.

Ex. I16 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 112 pages.

Ex. I17 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 190 pages.

Ex. I18 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 120 pages.

Ex. I2 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 183 pages.

Ex. I3 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 121 pages.

Ex. I4 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 73 pages.

Ex. I5 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 138 pages.

Ex. I6 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 79 pages.

Ex. I7 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 87 pages.

Ex. I8 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 48 pages.

Ex. I9 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 86 pages.

Ex. J1 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 91 pages.

Ex. J10 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 75 pages.

Ex. J11 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 129 pages.

Ex. J12 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 340 pages.

Ex. J13 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 331 pages.

Ex. J14 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 134 pages.

Ex. J15 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 63 pages.

Ex. J16 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 253 pages.

(56)     References Cited

OTHER PUBLICATIONS

Ex. J17 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 62 pages.

Ex. J18 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 57 pages.

Ex. J19 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 154 pages.

Ex. J2 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 66 pages.

Ex. J20 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 102 pages.

Ex. J21 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 88 pages.

Ex. J22 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 66 pages.

Ex. J23 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 85 pages.

Ex. J24 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 82 pages.

Ex. J25 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 89 pages.

Ex. J26 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 103 pages.

Ex. J27 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 83 pages.

Ex. J28 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 239 pages.

Ex. J29 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 172 pages.

Ex. J3 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 199 pages.

Ex. J30 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 240 pages.

Ex. J4 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 145 pages.

Ex. J5 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 141 pages.

Ex. J6 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 98 pages.

Ex. J7 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 75 pages.

Ex. J8 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 68 pages.

Ex. J9 to Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 71 pages.

Excerpts from Discrete-Time Signal Processing, Third Edition, Alan V. Oppenheim & Ronald W. Schafer, Aug. 18, 2009, 161 pages.

Exhibit E9—Invalidity of U.S. Pat. No. 9,270,244 ("the '244 Patent") in view of U.S. Pat. No. 6,567,524 ("Svean"), pp. 1-55 (date not available), 55 pages.

Exhibit F5—Invalidity of U.S. Pat. No. 9,491,542 ("the '542 Patent") in view of U.S. Pat. App. Pub. 2011/0293103 ("Park"), pp. 1-81 (date not available), 81 pages.

Exhibit H5—Invalidity of U.S. Pat. No. 10,405,082 ("the '082 Patent") in view of U.S. Pat. Appl. Pub. No. 2014/0163976, pp. 1-151 (date not available), 151 pages.

Exhibit K1 (Calhoun) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 469 pages.

Exhibit K10 (Kelliher) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 157 pages.

Exhibit K11 (Kopra) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 285 pages.

Exhibit K12 (Lagassey '043) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 332 pages.

Exhibit K13 (Lemelson) to Samsung's Invalidity Contentions and P.R. 3-3 And 3-4 Disclosures for U.S. Pat. Nos. 11,039,259,

(56) References Cited

OTHER PUBLICATIONS 11,057,701, 11,217,237, and 11,244,666 (Case No. 2:22-CV-00053-JRG-RSP), served Jul. 6, 2022, 206 pages.

Exhibit K14 (Pickering) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 45 pages.

Exhibit K15 (Schuler) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 281 pages.

Exhibit K16 (Soufflet) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 64 pages.

Exhibit K17 (White) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 186 pages.

Exhibit K18 (BlueAnt V1) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 266 pages.

Exhibit K19 (LG Chocolate) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 168 pages.

Exhibit K2 (Cerra) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 279 pages.

Exhibit K20 (Midomi) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 262 pages.

Exhibit K21 (Promptu) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 219 pages.

Exhibit K22 (Samsung SCH-a950) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 288 pages.

Exhibit K23 (W850) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 170 pages.

Exhibit K24 (EARS) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 98 pages.

Exhibit K25 (Motorola Pebl) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 110 pages.

Exhibit K26 (Silynx QuietOps) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 218 pages.

Exhibit K27 (NACRE QuietPro) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 306 pages.

Exhibit K28 (Shazam) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 174 pages.

Exhibit K29 (Vlingo) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 69 pages.

Exhibit K3 (Chen '353) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 269 pages.

Exhibit K30 (Yoon) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 78 pages.

Exhibit K4 (Comerford) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 136 pages.

Exhibit K5 (Couper) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 170 pages.

Exhibit K6 (Emoto) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 157 pages.

Exhibit K7 (Zaykovskiy) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 124 pages.

Exhibit K8 (Hunter) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 114 pages.

Exhibit K9 (Jones) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 115 pages.

Exhibit L1 (Alves 801) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 83 pages.

Exhibit L10 (QuietOps) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 38 pages.

Exhibit L11 (QuietPro) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 54 pages.

Exhibit L12 (Visser '958) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 162 pages.

Exhibit L13 (Zhang 099) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 123 pages.

Exhibit L14 (Byford) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 61 pages.

Exhibit L15 (Mejia '156) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 135 pages.

Exhibit L16 (Yang '130) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 83 pages.

Exhibit L2 (Burnett 421) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 71 pages.

(56)          References Cited

OTHER PUBLICATIONS

Exhibit L3 (Hietanen) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 70 pages.

Exhibit L4 (Huang 798) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 30 pages.

Exhibit L5 (Jaber) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 70 pages.

Exhibit L6 (Lg HBM-730) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 93 pages.

Exhibit L7 (Nokia BH-600) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 57 pages.

Exhibit L8 (Nokia BH-900) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 75 pages.

Exhibit L9 (Pedersen) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 83 pages.

Exhibit M1 (Armstrong) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 53 pages.

Exhibit M10 (Melanson) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 82 pages.

Exhibit M11 (Nemirovski 368) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 66 pages.

Exhibit M12 (Platz 077) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 57 pages.

Exhibit M13 (Rasmussen 245) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 44 pages.

Exhibit M14 (Svean 359) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 92 pages.

Exhibit M15 (Victorian 625) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 128 pages.

Exhibit M16 (Zurek 379) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 60 pages.

Exhibit M17 (Jawbone) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 164 pages.

Exhibit M18 (QuietOps) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 128 pages.

Exhibit M19 (Nacre QuietPro) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 205 pages.

Exhibit M2 (Boersma) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 68 pages.

Exhibit M20 (SenSay) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 110 pages.

Exhibit M21 (Andrea) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 65 pages.

Exhibit M22 (Darbut) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 88 pages.

Exhibit M23 (Ramakrishnan) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 96 pages.

Exhibit M3 (Dijsktra 972) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 56 pages.

Exhibit M4 (Hamacher 031) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 52 pages.

Exhibit M5 (Hietanen) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 80 pages.

Exhibit M6 (Hotvet) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 35 pages.

Exhibit M7 (Kondo 701) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 53 pages.

Exhibit M8 (Kvalgy) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 81 pages.

Exhibit M9 (Light) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 87 pages.

Exhibit N1 (Platz 077) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 104 pages.

Exhibit N10 (Bose) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 67 pages.

Exhibit N11 (Emoto) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 96 pages.

Exhibit N12 (Dijkstra 243) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 117 pages.

Exhibit N13 (Cohen 908) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 115 pages.

(56) References Cited

OTHER PUBLICATIONS

Exhibit N14 (Rast) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 123 pages.

Exhibit N15 (Bothra 629) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 53 pages.

Exhibit N16 (Victorian 625) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 139 pages.

Exhibit N17 (Engle) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 90 pages.

Exhibit N18 (Svean 359) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 128 pages.

Exhibit N19 (Hotvet) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 73 pages.

Exhibit N2 (Kvaløy) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 79 pages.

Exhibit N20 (Killion 056) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 74 pages.

Exhibit N21 (Bothra 087) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 72 pages.

Exhibit N22 (Melanson) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 86 pages.

Exhibit N23 (Andrea) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 90 pages.

Exhibit N24 (Hohman) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 82 pages.

Exhibit N25 (Bergeron) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 100 pages.

Exhibit N26 (Frank) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 116 pages.

Exhibit N27 (Darbut 423) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 92 pages.

Exhibit N28 (QuietPro) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 205 pages.

Exhibit N29 (QuietOps) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 172 pages.

Exhibit N3 (Inanaga) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 100 pages.

Exhibit N30 (Jawbone) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 189 pages.

Exhibit N31 (EarSet 2) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 172 pages.

Exhibit N32 (Etymotic ER-6) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 256 pages.

Exhibit N33 (Zen) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 188 pages.

Exhibit N34 (Motorola H605) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 121 pages.

Exhibit N35 (Peltor Lite-Com II) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 223 pages.

Exhibit N36 (Discovery 655) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 308 pages.

Exhibit N37 (MX200 Series) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 121 pages.

Exhibit N38 (Sony S700) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 155 pages.

Exhibit N39 (H5 Miniblue) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 172 pages.

Exhibit N4 (Rosenberg) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 92 pages.

Exhibit N40 (3D Active Ambient IEM) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 291 pages.

Exhibit N41 (Armstrong 422) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 232 pages.

Exhibit N42 (Hohn) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 160 pages.

Exhibit N43 (Mejia 228) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 180 pages.

Exhibit N44 (Nemirovski 368) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 264 pages.

Exhibit N45 (Thomasson) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 95 pages.

(56)                References Cited

OTHER PUBLICATIONS

Exhibit N46 (Zurek 003) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 230 pages.
Exhibit N47 (Kurcan) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 444 pages.
Exhibit N48 (Rafaely) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 205 pages.
Exhibit N49 (Vaidyanathan) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 155 pages.
Exhibit N5 (Visser 958) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 117 pages.
Exhibit N50 (Westerlund) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 154 pages.
Exhibit N51 (Zhang) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 138 pages.
Exhibit N6 (Terlizzi) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 123 pages.
Exhibit N7 (Light) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 103 pages.
Exhibit N8 (Boersma) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 107 pages.
Exhibit N9 (McCune) to Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 118 pages.
Experimentation To Address Appropriate Test Techniques For Measuring The Attenuation Provided By Double ANR Hearing Protectors, Susan E. Mercy, Christopher Tubb and Soo H. James, New Directions for Improving Audio Effectiveness (pp. 18-1-18-14). Meeting Proceedings RTO-MP-HFM-123, Paper 18. Neuilly-sur-seine, France: RTO, Apr. 1, 2005, 15 pages.
File History of corresponding Reexamination U.S. Appl. No. 90/015,146, filed Oct. 28, 2022, 1270 pages.
File History of corresponding Reexamination U.S. Appl. No. 90/019,169, filed Feb. 24, 2023, Reexamination Certificate Issued Oct. 11, 2023 as U.S. Pat. No. 11,244,666 C1., 998 pages.
Fit-Testing of Hearing Protection, WITT, The Hearing Review, May 21, 2008, 9 pages.
Gennum Zen Digital Wireless Headset ("Zen"), At least by 2004, CNET Article—Gennum Zen Bluetooth Headset Review (SAM-TECH 00098419), 4 pages.
Gennum Zen Digital Wireless Headset ("Zen"), At least by 2004, Gennum Zen User Manual (SAM-TECH 00098432), 2005, 44 pages.
Gennum Zen Digital Wireless Headset ("Zen"), At least by 2004, Globe and Mail Article—Gennum Z-E-N Headset for Bluetooth (SAM-TECH 00098485), 5 pages.
Huseyin Dogan, Trym Holter, & Ingrid Svagard, Trial of a special end user terminal that aids field operators during emergency rescue operations, Proceedings of the 3rd International !SCRAM China Workshop, Harbin, China, at 4 (Aug. 2008) discusses the PARAT as well (SAM-TECH_00051920-SAM-TECH_00051931), 12 pages.
In-Ear Microphone Speech Data Recognition using HMMs, R. S. Kurcan, M. P. Fargues and R. Vaidyanathan, 2006 IEEE 12th Digital Signal Processing Workshop & 4th IEEE Signal Processing Education Workshop, Teton National Park, WY, USA, 2006, 5 pages.
In-Ear Microphone Speech Data Segmentation and Recognition using Neural Networks, G. Bulbuller, Monique Fargues & Ravi Vaidyanathan, IEEE 12th Digital Signal Processing Workshop and 4th IEEE Signal Processing Education Workshop, 2006, 6 pages.
In-Ear Microphone Techniques For Severe Noise Situations, N. Westerlund, M. Dahl, I. Claesson, Nov. 2005, 39 pages.
Isolated Word Recognition from In-Ear Microphone Data Using Hidden Markov Models (HMM), Remzi Serdar Kurcan, Mar. 2006, 179 pages.
Jawbone Aliph, At least by Sep. 9, 2004, https://www.capecodtimes.com/story/news/20 06/12/24/new-earphones-let-you- go/50845129007 (SAM-TECH 00062054), 2 pages.
Jawbone Aliph, At least by Sep. 9, 2004, https://www.cnet.com/reviews/aliph- iawbone-bluetooth-headset-review/ (SAM-TECH 00060121), 3 pages.
Jawbone Aliph, At least by Sep. 9, 2004, https://www.wired.com/2004/09/military- headset-reaches-masses (SAM-TECH 00062036), 7 pages.
Jawbone Aliph, At least by Sep. 9, 2004, Jawbone User Manual (SAM-TECH_00061992), 16 pages.
Learning-Based Three Dimensional Sound Localization Using a Compact Non-Coplanar Array of Microphones, Kamen Y. Guentchev and John J. Weng, AAAI Technical Report SS-98-02, 1998, 10 pages.
Maico MI26 Tymp/audiometer combo ("Maico MI26"), Aug. 12, 2004 WayBack Machine Capture of Maico' s website has an image of the Maico MI26 and lists the Maico MI26 as a product available for purchase. https://web.archive.org/web/20040422090329/http://www.maico- diagnostics.com:80/eprise/main/Maico/US_e n/ProductCategories/LSTO1_Tympanometers (SAM-TECH_00060329-SAM-TECH 00060331), 3 pages.
Mar. 17, 2006 Wayback Machine capture of Maico' s website has a user manual available for the Maico MI26 https://web.archive.org/web/20060317092410/ http:/www.maico-diagnostics.com/eprise/main/Maico/Products/ Files/MI26/1162- 0322REVD.pdf (SAM-Tech 00051168-SAM-TECH 00051215), 48 pages.
Mar. 17, 2006 WayBack Machine Capture of Maico's website discusses frequently asked questions about the Maico MI26 andis' features. https://web.archive.org/web/20060317092109/http://www.maico- diagnostics.com/eprise/main/Maico/Products/Files/MI24/FAQ.MI24-26.pdf (SAM-Tech 00051250-SAM-TECH 00051251), 2 pages.
Methods Of Developing And Validating A Field-MIRE Approach For Measuring Hearing Protector Attenuation, Berger, Elliott & Voix, Jeremie & Kieper, R, Feb. 9, 2007, in connection with 3M/Aearo Technologies' E-A-RFitTM Validation System ("E-A-RFit"); This article was originally prepared for the 32nd Annual Conference of the National Hearing Conservation Association, held on Feb. 15-17, 2007, in Savannah, Georgia, and published in Spectrum, vol. 24, Suppl. 1, 16 pages.
Methods of measuring the attenuation of hearing protection devices, E H Berger, The Journal of the Acoustical Society of America vol. 79,6 (1986), 34 pages.
Microphone Array for Headset with Spatial Noise Suppressor, Ivan Tashev, Michael Seltzer & Alex Acero, 2005, 4 pages.
Microphone Array Processing for Robust Speech Recognition, Michael L. Seltzer, Jul. 2003, 163 pages.
Motorola H5 Miniblue Bluetooth Headset, Jan. 14, 2005, https://newatlas.com/ces-2006-bluetooth- innovations-abound-inner-ear-headset- bluetooth-keyboard-and-wireless-ipod- companion/4977/ (SAM-TECH_00060368) (Motorola H5 Miniblue Bluetooth Headset), 12 pages.
Motorola H5 Miniblue Bluetooth Headset, Jan. 14, 2005, https://www .engadget.com/2006-01-04- motorolas-h5-miniblue-bluetooth- headset.html (SAM-TECH 00060628), 3 pages.

(56)     References Cited

OTHER PUBLICATIONS

Motorola H5 Miniblue Bluetooth Headset, Jan. 14, 2005, https://www.cnet.com/tech/mobile/motorola- h5-miniblue-bluetooth-headset/ (SAM-TECH_00060424) (Motorola H5 Miniblue Bluetooth Headset), 5 pages.

Motorola H5 Miniblue Headset ("Miniblue"), Jan. 2006, Motorola H9 Bluetooth Headset User Manual (SAM-TECH 00060509-14), 6 pages.

Motorola H605, At least by 2006, CNET Article—Motorola H605 Bluetooth Headset Review (SAM-TECH 00098639), 4 pages.

Motorola H605, At least by 2006, Motorola H605 User Manual (SAM-TECH 00098719), 5 pages.

Motorola H605, At least by 2006, PhoneArena Article—Motorola H605 Review (SAM-TECH 00098743), 12 pages.

Motorola Miniblue Press Release (https://web.archive.org/web/20060212115000/ http://www.motorola.com/motoinfo/product/de tails/0,, 133,00.html) (SAM-TECH 00056060), retrieved on May 16, 2022, 1 page.

Motorola's Astro XTS 5000 Digital Portable Radio ("Motorola XTS 5000"), At least by Jun. 2002, Motorola's Detailed Service Manuel has a release date in 2003. See Detailed Service Manuel for Astro XTS 5000 VHF/UHF Range 1/Range 2/700-800 MHZ, Digital Portable Radios (2003) (SAM-TECH_00051382-SAM-TECH 00051711), 330 pages.

Motorola's Astro XTS 5000 Digital Portable Radio ("Motorola XTS 5000"), Jun. 14, 2002 WayBack Machine capture of Motorola Inc.'s website contains an image of the Motorola and states that "[t]he top of the line XTS 5000 portable radio is ready and equipped to meet the needs of demanding environments" and that IS "Motorola's newest maximum performance two-way radio." https://web.archive.org/web/20020614082842/ http://www.motorola.com:80/cgiss/portables/ xts5000.shtml (SAM-TECH_00051718)., 1 pages.

Motorola's XTS 2500 Digital Portable Radio ("Motorola XTS 2500"), Motorola XTS 2500's Basic Service Manual dated 2002-2003, see XTS 2500 XTS 1500 MT 1500 700-800 MHz Digital Portable Radios, Basic Service Manual at 70 (SAM_00051287-SAM-TECH_00051374), 88 pages.

Motorola's XTS 2500 Digital Portable Radio ("Motorola XTS 2500"), Nov. 9, 2001, WayBack Machine capture of Motorola's website contains an image of the XTS 2500 and states that "[t]he XTS 2500 portable radio is Motorola's high-performance, small-sized, digital two-way radio." https://web.archive.org/web/20020804062125/ http://www.motorola.com:80/cgiss/portables/xts2500.shtml (SAM-TECH 00051258), 1 pages.

Mueller, There's less talking in barrels, but the occlusion effect is still with us, The Hearing Journal, Aug. 2003, pp. 10-16, vol. 56, No. 8.

Muggleton, Nacre's QUIETPRO+ Intelligent Hearing System: Delivering Performance and Hearing Protection Now for the Future of the Soldier, SoldierMod Jan. 2009, pp. 28-29, vol. 2.

Multi-Microphone Correlation-Based Processing for Robust Automatic Speech Recognition, Thomas M. Sullivan, Department of Electrical and Computer Engineering Carnegie Mellon University, Aug. 1996, 113 pages.

Multi-Microphone Signal Acquisition for Speech Recognition Systems, Kevin Fink, EE 586—Speech Recognition Systems, Dec. 16, 1993, 13 pages.

Multi-sensory microphones for robust speech detection, enhancement and recognition, Zhengyou Zhang, Zicheng Liu, M. Sinclair, A. Acero, L. Deng, J. Droppo, Xuedong Huang, Yanli Zheng, 2004 IEEE International Conference on Acoustics, Speech, and Signal Processing 3 (2004), 4 pages.

NACRE QuietPro, In a Mar. 7, 2013 presentation by Blake Martin of Honeywell Safety Products to the Alberta Industrial Fire Protection Association, Mr. Martin identifies "2005" as the "First commercial success for Quietpro." (SAM-TECH_00054652), 33 pages.

NACRE QuietPro, In Aug. 2006, Nacre won U.S. Government Contract No. W912DQ-06-D-0037 to supply the NACRE QuietPro to the U.S. military. U.S. Government Contract No. W912DQ-06-D-0037 (SAM-TECH 00055735), 3 pages.

NACRE QuietPro, In proceedings before the U.S. Trademark Trial and Appeal Board, Nacre stated that it "has used in commerce with the United States, long since prior to Apr. 28, 2006, the registered trademark QUIETPRO on one or more of headphones, earphones . . ." *Nacre AS* v. *Silynx Communications, Inc*, Sep. 4, 2007 Notice of Opposition. (SAM-TECH_00054696), 9 pages.

NACRE QuietPro, Mar. 9, 2005, Article posted at: https://www.tu.no/artikler/quietproverner-og-forsterker-horselen/261960 (SAM-TECH 00097600), 6 pages.

NACRE QuietPro, Mar. 9, 2005, Honeywell Quietpro QP100ex Mar. 2013 presentation (SAM-TECH_00063985), 33 pages.

NACRE QuietPro, Mar. 9, 2005, IEEE Explore Article (SAMTECH_00063687), 6 pages.

NACRE QuietPro, Mar. 9, 2005, NACRE QuietPro User Manual v2.0 (SAMTECH 00055181), 48 pages.

NACRE QuietPro, Mar. 9, 2005, New Scientist Article (SAMTECH_00064068), 2 pages.

NACRE QuietPro, Mar. 9, 2005, SoldierMod Article (SAM-TECH_00065729), 2 pages.

NACRE QuietPro, Mar. 9, 2005, WayBack Machine capture of Nacre's website contains an image of the NACRE QuietPro and states that "Nacre has secured MNOK 27,5 from a consortium led by Ferd Venture" and that "[m]ost of the money will be spent to boost efforts within sales and marketing of QUIETPRO in the global military market.", (SAM-TECH_00054131) 2 pages.

Nacre's PARAT earplug ("Parat"), 1999 article publ.by one of the PARAT's designers Georg E. Ottensen, discusses the PARAT system and states, "[a]n active ear terminal IS beeing designed atSEVTEF Telecom and informatics. The acronym of the consept is PARAT—Personal Active Radio/Audio Terminal." Georg E. Ottesen, Active noise reduction in an ear terminal, The Journal of the Acoustical Society of America 105, 300(1999); https://doi.org/10.1121/1.424828, SINTEF Telecom and Informatics, N-7465 (SAM-TECH 00051952-SAM-TECH 00051955), 4 pgs.

Nacre's PARAT earplug ("Parat"), Jan. 2004 publication by Fredrik Vraalsen et al., describes how "[p]articular attention has been given to voice interaction m noisy industrial scenarios, utilising the PARAT earplug." Fredrik Vraalsen, Trym Holter, ingrid Storruste Svagard, and Oyvind Kvennas, A Multimodal Context Aware Mobile Maintenance Terminal For Noisy Environments, Sintef Ict, N-7465 Trondheim, Norway, 79, 79 (Jan. 2004) (SAM-TECH_00051938-SAM-TECH 00051951), 14 pages.

Noise attenuation and proper insertion of earplugs into ear canals, Markku Toivonen, Rauno Pääkkönen, Seppo Savolainen, Kyösti Lehtomäki, The Annals of occupational hygiene, vol. 46,6 (2002): 527-530, 4 pages.

Nov. 3, 2019 article published by Imran Hussain discusses how to use the ear tip fit test with the AirPods Pro and an iOS device such as the iPhone 11 for the best fit. https://www.esquire.com/lifestyle/a29612084/apple-airpods-pro-active-noise- cancellation-review/ (SAM-TECH_00052413-SAM-TECH_00052424), 12 pages.

Oct. 20, 2019 article by Tim Hardwick discussing how to perform an ear tip fit test using Apple's AirPods Pro with Apple's iPhone 11. https://www.macrumors.com/how- to/perform-ear-tip-fit-test-airpods-pro/; (SAM-TECH 00052357-SAM-TECH 00052370), 14 pages.

Oct. 29, 2019 on BusinessToday.in states the AirPods Pro require Apple devices running iOS 13.2 or later, iPadOS 13.2 or later, watchOS 6.1 or later, tvOS 13.2 or later, or macOS Catalina 10.15.1 or later. https://www.businesstoday.in/technology/launch/story/apple-airpods-pro-with- noise- cancellation-launched-check-out-price-in-india features-235269-2019- 10-29 (SAM-TECH 00061346-SAM-TECH 00061349), 4 pages.

Oct. 31, 2019 article published by Charlie Sorrel discusses the Ear tip fit test for the AirPods Pro in the iPhone settings. https://www.cultofmac.com/662548/airpods- pro-ear-tip-fit-test/; (SAM-TECH 00056870-SAM-TECH 00056881), 12 pages.

Olympus WS-320M, At least by Nov. 25, 2005 (Olympus WS-320M) https://web.archive.org/web/20051125000137mp_, http://www.olympusamerica.com/cpg_se ction/cpg_vr_digitalmusic.asp (SAM-TECH 00051760), 2 pages.

Olympus WS-320M, At least by Nov. 25, 2005 (Olympus WS-320M) https://web.archive.org/web/20060314095402/, http://www.

(56)         References Cited

OTHER PUBLICATIONS olympusamerica.com/cpg_sectio n/product.asp?product= 1195&fl= 2 (SAM-TECH 00051767; SAM-TECH 00051753), 3 pages.
Olympus WS-320M, At least by Nov. 25, 2005 Olympus WS-320M Instruction Manual (SAM-TECH 00051833), 87 pages.
Optimal Feedback Control Formulation of the Active Noise Cancellation Problem: Pointwise and Distributed, Kambiz C. Zangi, RLE Technical Report No. 583, Research Laboratory of Electronics Massachusetts Institute of Technology, May 1994, 158 pages.
Oshana, DSP Software Development Techniques for Embedded and Real-Time Systems, Chapters 3 and 4, pp. 35-121, Elsevier, Inc., Amsterdam, Netherlands (2006).
Peltor Lite-Com II, At least by 1999, Peltor Lite-Com II Manual (SAM-TECH_00099254), 13 pages.
Peltor Lite-Com II, At least by 1999, Peltor Lite-Com II Brochure (SAM-TECH 00099203), 6 pages.
Performance of dual microphone in-the-ear hearing aids, Michael Valente, Gerald Schuchmant, Lisa G. Potts & Lucille B. Beck, Journal of the American Academy of Audiology, 2000, 9 pages.
Plantronics Discovery 655, At least by 2006, CNET Article—Plantronics Discovery 655 Bluetooth Headset Review (SAM-TECH_ 00099287), 4 pages.
Plantronics Discovery 655, At least by 2006, Plantronics Discovery 655 Brochure (SAM-TECH_00099296), 2 pages.
Plantronics Discovery 655, At least by 2006, Plantronics Discovery 655 User Guide (SAM-TECH_00099344), 16 pages.
Plantronics Discovery 655, At least by 2006, Silicon Poip Culture Article—Plantronics Discovery 655 (SAM-TECH_00099387), 4 pages.
Plantronics MX200, At least by 2006, Plantronics MX200 Brochure (SAM-TECH_00099419), 2 pages.
Plantronics MX200, At least by 2006, Plantronics MX200 User Guide (SAM-TECH_00099435), 2 pages.
Plantronics MX200, At least by 2006, Plantronics MX250 User Guide (SAM-TECH_00099461), 2 pages.
PocketLint Article—Zen Gennum Bluetooth Headset (SAM-TECH_ 00098490), Feb. 3, 2005, 13 pages.
Preferred methods for measuring hearing protector attenuation, Elliott Berger, International Congress on Noise Control Engineering 2005, INTERNOISE 2005, 10 pages.
Products of Interest, Project Muse, Computer Music Journal, vol. 30, No. 3, Fall 2006, 16 pages.
Reducing the Negative Effects of Ear-Canal Occlusion, Samuel S. Job, Department of Electrical and Computer Engineering Brigham Young University, 2002, 6 pages.
Research in Motion's BlackBerry 7520 ("BlackBerry"), At least by 2004, Blackberry 7520 Wireles Handheld Model No. RALIIIN, Version 4.1 User Guide, last modified Mar. 6, 2006 (SAM-TECH 00054461-SAM-TECH 00054618), 158 pages.
Research in Motion's BlackBerry 7520 ("BlackBerry"), At least by 2004, BlackBerry Wireless Handheld Getting Started Guide (SAM-TECH 00228841), 13 pages.
Research in Motion's BlackBerry 7520 ("BlackBerry"), Nextel Services Guide for the Blackberry is dated the year 2004; (SAM-TECH 00226708), 29 pages.
Research in Motion's BlackBerry 7520 ("BlackBerry"), Jun. 28, 2006 WayBack Machine capture of the BlackBerry lists it for sale and describes the Blackberry as a "strong addition to the product line-up." https://web.archive.org/web/20060628035351 /http://www. blackberry-7520.com (SAM-TECH_00054619; SAM-TECH_ 00054624; SAM-TECH_00054622), 3 pages.
Robert Oshana, DSP Software Development Techniques for Embedded and Real-Time Systems, Embedded Technology Series, Elsevier Inc, 2006, ISBN-10: 0-7506-7759-7, 601 pages.
Ronald M. Aarts, Roy Irwan, and Augustus J. E .. Janssen, Efficient Tracking of the Cross-Correlation Coefficient, IEEE Transactions on Speech and Audio Processing, vol. 10, No. 6, Sep. 2002, 12 pages.

Samsung Electronics Co, Ltd, And Samsung Electronics, America, Inc, v. Staton Techiya, LLC, IPR2022-00559, Feb. 9, 2024, 88 pages.
Samsung's Invalidity Contentions and P.R. 3-3 And 3-4 Disclosures for U.S. Pat. Nos. 11,039,259, 11,057,701, 11,217,237, and 11,244,666 (Case No. 2:22-CV-00053-JRG-RSP), served Jul. 6, 2022, 1009 pages.
Samsung's Invalidity Contentions and P.R. 3-3 And 3-4 Disclosures for U.S. Pat. Nos. 8,111,839, 8,254,591, 8,315,400, 9,124,982, 9,270,244, 9,491,542, 9,609,424, 10,405,082, 10,966,015 (Case No. 2:22-CV-00053-JRG-RSP), served May 18, 2022, 1307 pages.
Samsung's Motion for Summary Judgment of Invalidity under 35 U.S.C. §112 of the '666 Patent (Redacted) (Dkt. No. 457), Jun. 26, 2023, 78 pages.
Samsung's Reply in Support of Its Motion for Summary Judgment of Invalidity under 35 U.S.C. § 112 of the '666 Patent (Redacted) (Dkt. No. 556), Aug. 7, 2023, 22 pages.
SeboTek Hearing Systems' PAC (Post Auricular Canal) Instrument ("Sebotek"), Mar. 19, 2003 WayBack Machine capture of SeboTek's website contains a description of the PAC, which notes that "[t]he PAC is an exciting new hearing system by SeboTek that is significantly different from traditional hearing aids. If offers deep canal fitting, superior acoustics, incredible discreetness, and unmatched comfort." https://web.archive.org/web/20030319140205 / http:// www.sebotek.com:80/ (SAM-TECH_00052377), 1 pages.
SeboTek Hearing Systems' PAC (Post Auricular Canal) Instrument ("Sebotek"), May 26, 2007 WayBack Machine capture of SeboTek's website contains a description of the PAC, and notes that "Prior to 2003, depending on the level of hearing loss, consumers could choose between four primary styles, none of which offered superior sound quality, comfort or cosmetic appeal. All that changed in 2003, when SeboTek introduced the . . . " https://web.archive.org/web/ 20070526135524 /http://www.sebotek.com:80/OurProducts/our Products.html (SAM-TECH 00052392), 1 pg.
SeboTek Hearing Systems' PAC (Post Auricular Canal) Instrument ("Sebotek"), Oct. 6, 2003 post by Bruce Gefvert, Director of Sales and Marketing at SeboTek Hearing Systems, on audiologyonline. com discusses the PAC, and states "PAC refers to Post Auricular Canal, an entirely new style of hearing aid that is intended to provide hearing professionals with one more option for treating hearing loss in the mild to severe ranges." https://www.audiologyonline. com/ask-th•• experts/sebotek-pac-post-auricular-canal-601 (SAM_ 00052353-SAM-TECH 00052356), 4 pages.
SeboTek Hearing Systems' PAC (Post Auricular Canal) Instrument ("Sebotek"), Publication by King Chung in 2004 mentions that "SeboTek VoiceQ and Vivatone have recently launched newly designed behind-the-ear or postauricular canal (PAC, as SeboTek preferred) hearing aids that have . . . " See King Chung, Challenges and recent developments in hearing aids. Part II . . . , 8 Trends Amplif.125,150(2004), avail. at https://www.ncbi.nlm.nih.gov/pmc/ articles/PMC4111464/pdf/10.1177_108471380400800 402.pdf (SAM-TECH_00062067-SAM-TECH_00062106), 40 pgs.
Sensaphonics 3D Active Ambient In-Ear Monitor System, At least by 2006, Products of Interest Article (SAM-TECH 00096723), 16 pages.
Sensaphonics 3D Active Ambient In-Ear Monitor System, At least by 2006, Sensaphonics 3D Active Ambient IEM System Article (SAM-TECH 00100065), 1 pages.
Sensaphonics 3D Active Ambient In-Ear Monitor System, At least by 2006, Sensaphonics 3D Active Ambient In-Ear Monitor System User Guide (SA•• TECH 00100046), 16 pages.
Silynx QuietOps, Oct. 4, 2007 Applicant's Answer to Opposer's Notice of Opposition (SAM-TECH 00052371), 6 pages.
Silynx QuietOps, https://defense- update.com/20080513_c4ops. html (SAM-TECH 00057150), 2 pages.
Silynx QuietOps, QuietOps Pocket Guide (Rev. 2.00) (Silynx QuietOps), Jul. 2007, 34 pages.
Small-footprint keyword spotting using deep neural networks, G. Chen, C. Parada and G. Heigold, 2014 IEEE International Conference on Acoustics, Speech and Signal Processing (ICASSP), Florence, Italy, 2014, pp. 4087-4091, 5 pages.

(56)        References Cited

OTHER PUBLICATIONS

Sonar-operator active noise reduction insert-earphone: Prototype preliminary test and evaluation, Josephs. Russotti, Naval Submarine Medical Research Laboratory, Report No. 1225, Feb. 18, 2003, 22 pages.

Sonomax's Sonomax: SonoCustom and SonoPass ("Sonomax"), Apr. 8, 2006 WayBack Machine capture of Sonomax's website contains an image of the SonoCustom and describes it as a "cost effective, comfortable and resusable earpiece." https://web.archive.org/web/20060408165744 /http://sonomax.com.au:80/index.cfm/fittingprocess/ (SAM-TECH 00052436), 1 pages.

Sonomax's Sonomax: SonoCustom and SonoPass ("Sonomax"), Apr. 8, 2006 WayBack Machine capture of Sonomax's website contains an image of the Sonomax and states that "[t]ens of Thousands of people around the world give the SonoCustom a big thumbs up for comfort." https://web.archive.org/web/20060408170243 /http://sonomax.com.au/index.cfm/aboutus/so nomax_solution/ (SAM-TECH 00052472; SAM-TECH 00052998), 3 pages.

Sonomax's Sonomax: SonoCustom and SonoPass ("Sonomax"), Apr. 8, 2006 WayBack Machine capture of Sonomax's website contains an image of the Sonomax and states that "[t]he Sonomax is a hearing protection system that combines a uniquely designed earpiece, the SonoCustom, with an optimised hardware and software application, called SonoPass." https://web.archive.org/web/20060408170221 /http://sonomax.com.au:80/index.cfm/testingo rocess/ (SAM-TECH 00052425), 1 pages.

Sonomax's Sonomax: SonoCustom and SonoPass ("Sonomax"), Jun. 15, 2006 WayBack Machine capture of Sonomax's website contains an image of the Sonomax and states that "application provides employers the unique ability to quantify and track hearing protection performance and produce detailed reports." https://web.archive.org/web/20060615054658 /http://www.sonomax.com.au/index.cfm/testi ngprocess/ (SAM-TECH 00052589), 1 pages.

Sonomax's Sonomax: SonoCustom and SonoPass ("Sonomax"), Jun. 15, 2006 WayBack Machine capture of Sonomax's website contains frequently asked questions about the Sonomax and states that SonoPass, our proprietary Windows-based software, drives the fitting process and provides immediate proof of functionality. https://web.archive.org/web/20060615054356 /http://www.sonomax.com.au:80/index.cfm/fa q/ (SAM-TECH 00052643), 1 pages.

Sony S700 Walkman, At least by Oct. 13, 2006, EAFIT Article—The Sony Walkman (SAM-TECH 00099514), 9 pages.

Sony S700 Walkman, At least by Oct. 13, 2006, IDG Article—Sony's New Walkman Players Pack Noise Canceling (SAM-TECH 00099533), 3 pages.

Sony S700 Walkman, At least by Oct. 13, 2006, Sony Walkman User Manual (SAM-TECH_00099557), 22 pages.

Sony S700 Walkman, At least by Oct. 13, 2006, Stuff Article—Sony NW-S700 Review (SAM-TECH_00099579), 8 pages.

Sound Source Localization and Separation, Biniyam Tesfaye Taddese, Mathematics, Statistics, and Computer Science Honors Projects (2006), 53 pages.

Speaker Turn Segmentation Based on Between-Channel Differences, Daniel P.W. Ellis & Jerry C. Liu, LabROSA, Dept. of Electrical Engineering, Columbia University, 2004, 6 pages.

Spectral analysis of speech by linear prediction, J. Makhoul, IEEE Transactions on Audio and Electroacoustics, vol. 21, No. 3, pp. 140-148, Jun. 1973, 9 pages.

Speech Input Hardware Investigation for Future Dismounted Soldier Computer Systems, Jeffrey C. Bos & David W. Tack, DRDC Toronto CR 2005-064, May 1, 2005, 26 pages.

Speech Modeling with Magnitude-Normalized Complex Spectra and Its Application to Multisensory Speech Enhancement, A. Subramanya, Z. Zhang, Z. Liu and A. Acero, 2006 IEEE International Conference on Multimedia and Expo, Toronto, ON, Canada, 2006, pp. 1157-1160, 4 pages.

Speech Recognition in Severely Disturbed Environments Combining Ear-Mic and Active Noise Control, N. Westerlund, M. Dahl, I. Claesson, Published 2002, Engineering, Computer Science, 7 pages.

Strand, et al. On the Feasibility of ASR in Extreme Noise Using the Parat Earplug Communication Terminal, IEEE, 2003, pp. 315-320.

Survey of the Speech Recognition Techniques for Mobile Devices, Dmitry Zaykovskiy, Department of Information Technology, SPECOM'2006, St. Petersburg, Jun. 2006, 6 pages.

Techiya's Opposition to Samsung's Motion for Summary Judgment of Invalidity under 35 U.S.C. § 112 of the '666 Patent (Redacted) (Dkt. No. 515), Jul. 24, 2023, 30 pages.

Techiya's Sur-Reply to Samsung's Motion for Summary Judgment of Invalidity under 35 U.S.C. § 112 of the '666 Patent (Dkt. No. 587), Aug. 21, 2023, 5 pages.

Techniques and applications for wearable augmented reality audio, Härmä, Aki & Turku, Julia & Tikander, Miikka & Karjalainen, M & Lokki, Tapio & Nironen, H & Vesa, Sampo (2003), 20 pages.

The Effect of Hearing Aid Microphone Location on the Intelligibility of Hearing Aid—Transduced Speech, John Robert Franks, Dec. 1975, 208 pages.

Using Audio-Based Signal Processing to Passively Monitor Road Traffic, Orla Duffner, Centre for Digital Video Processing and School of Electronic Engineering Dublin City University, Jul. 2006, 262 pages.

Verifying the attenuation of earplugs in situ: Method validation using artificial head and numerical simulations, Annelies Bockstael, Bram De Greve, Timothy Van Renterghem, Dick Botteldooren, Wendy D'Haenens, Hannah Keppler, Leen Maes, Birgit Philips, Freya Swinnen, Bart Vinck, The Journal of the Acoustical Society of America; 124 (2): 973-981, Aug. 1, 2008, 10 pages.

Vraalsen, A Multimodal Context Aware Mobile Maintenance Terminal for Noisy Environments, 2004, pp. 79-92.

Zhengyou Zhang, et al., Multi-Sensory Microphones for Robust Speech Detection, Enhancement and Recognition, Microsoft Research, 2004, 4 pages.

* cited by examiner

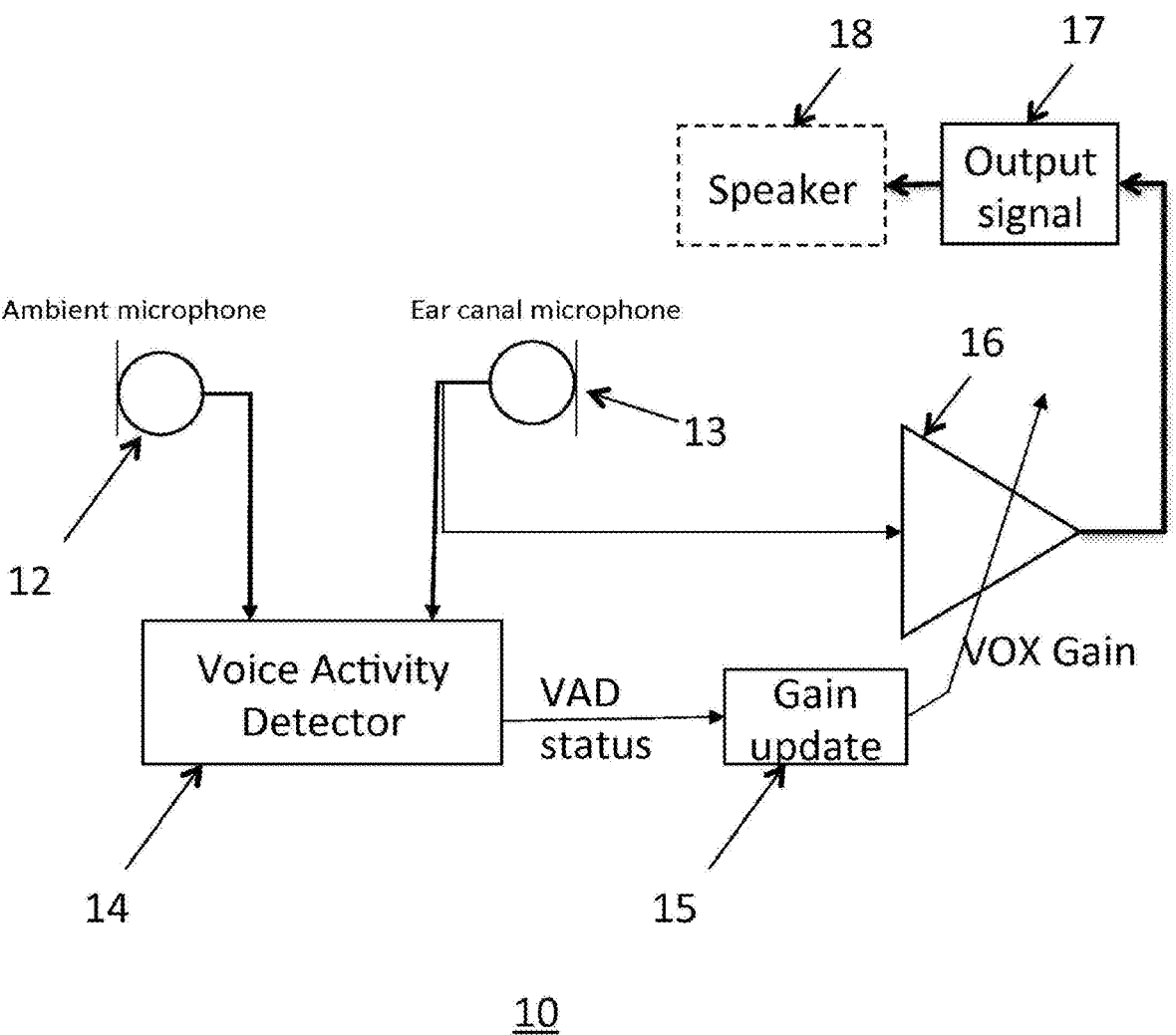
FIG. 1: Exemplary configuration of VAD system.

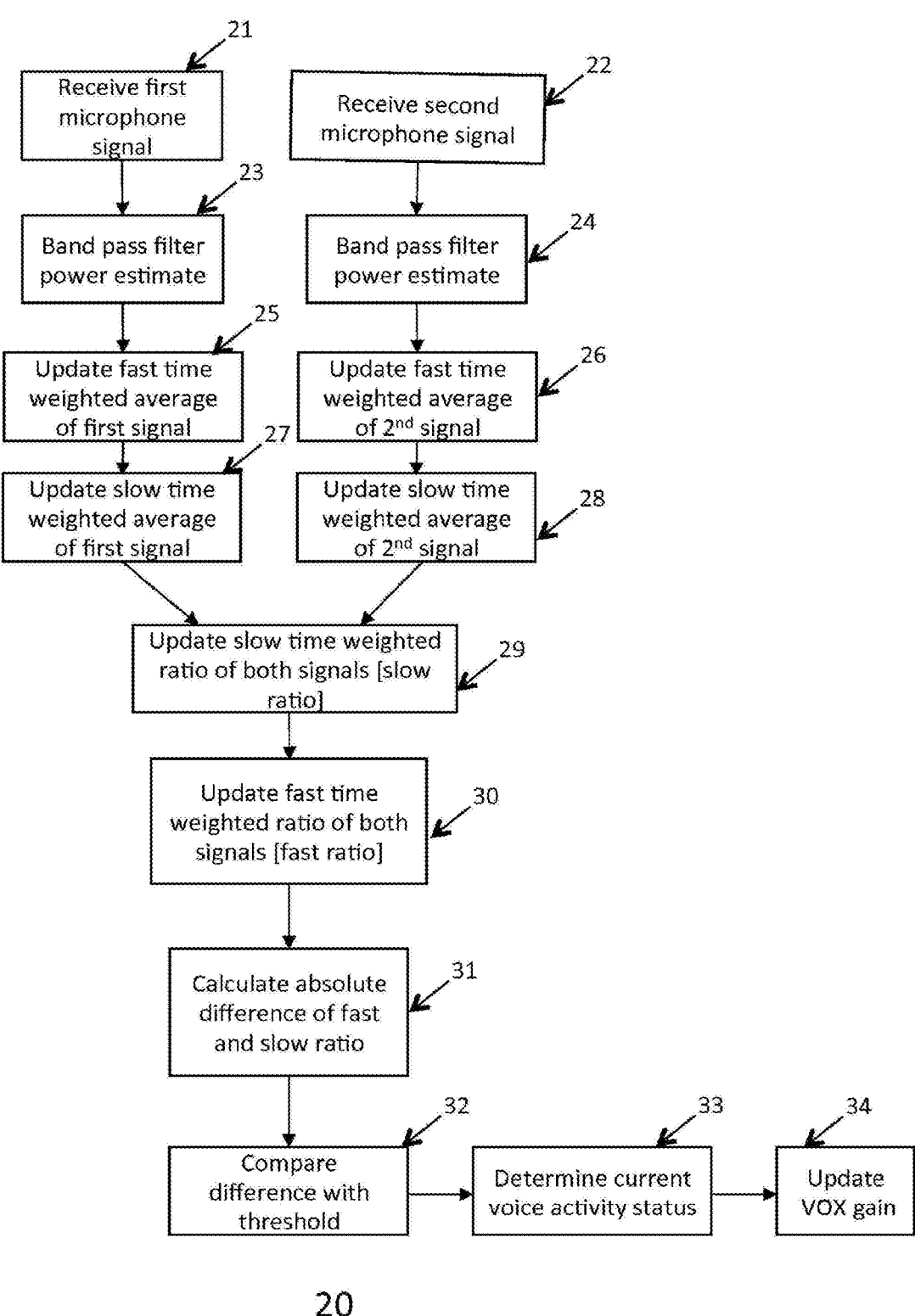
20
FIG. 2: Exemplary method for determining voice activity status

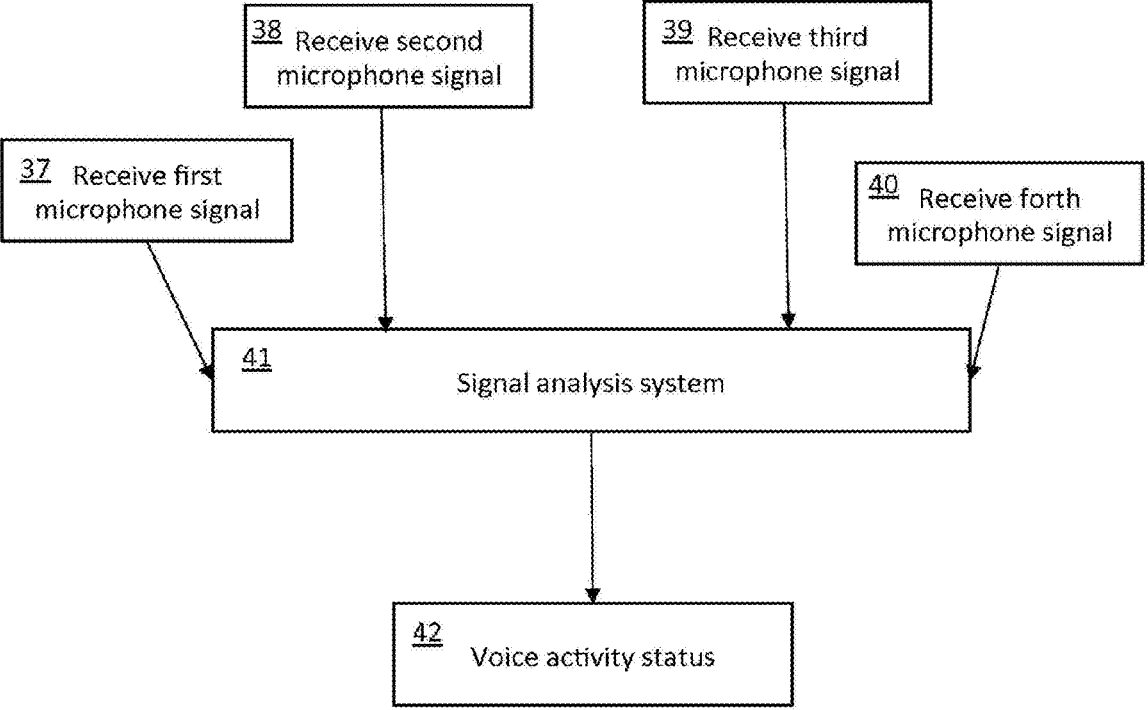
35
FIG. 3: Overview of system for determining voice activity status.

ROBUST VOICE ACTIVITY DETECTOR SYSTEM FOR USE WITH AN EARPHONE

CROSS-REFERENCE TO RELATED APPLICATION(S)

This application is a continuation of an claims priority to U.S. patent application Ser. No. 17/013,538, filed 5 Sep. 2020, which is a continuation of and claims priority to U.S. patent application Ser. No. 16/227,695, filed 20 Dec. 2018, which is a continuation of and claims priority to U.S. patent application Ser. No. 14/922,475, filed on Oct. 26, 2015, which claims priority to U.S. Provisional Patent Application No. 62/068,273, filed on Oct. 24, 2014, which are both hereby incorporated by reference in their entireties.

FIELD OF THE INVENTION

The present embodiments relate to detection of voice activity in noisy environments.

BACKGROUND OF THE INVENTION

Robust voice activity detection in noisy sound environments is a very difficult problem when using a small device mounted in the ear. Such systems that rely on using fixed thresholds often suffer from false positives and false negatives.

SUMMARY OF THE INVENTION

A method of adjusting a gain on a voice operated control system can include receiving a first microphone signal, receiving a second microphone signal, updating a slow time weighted ratio of the filtered first and second signals, and updating a fast time weighted ratio of the filtered first and second signals. The method can further include calculating an absolute difference between the fast time weighted ratio and the slow time weighted ratio, comparing the absolute difference with a threshold, and increasing the gain when the absolute difference is greater than the threshold. In some embodiments the threshold can be fixed. In some embodiments the method can further include band limiting or band pass filtering the first microphone signal to provide a filtered first signal, band limiting or band pass filtering the second microphone signal to provide a filtered second signal, calculating a power estimate of the filtered first signal including a fast time weighted average and a slow time weighted average of the filtered first signal, and calculating a power estimate of the filtered second signal including a fast time weighted average and a slow time weighed average of the filtered second signal. In some embodiments the threshold is dependent on the slow time weighted average. In some embodiments, the threshold value is set to a time averaged value of the absolute difference and in some embodiments the threshold value is set to the time averaged value of the absolute difference using a leaky integrator used for time smoothing. The step of band limiting or band pass filtering can use a weighted fast Fourier transform operation. In some embodiments, the method can further include determining a current voice activity status based on the comparison step. In some embodiments, the method can further include determining a current voice activity status using Singular Value Decomposition, a neural net system, or a bounded probability value.

The embodiments can also include an electronic device for adjusting a gain on a voice operated control system which can include one or more processors and a memory having computer instructions. The instructions, when executed by the one or more processors causes the one or more processors to perform the operations of receiving a first microphone signal, receiving a second microphone signal, updating a slow time weighted ratio of the filtered first and second signals, and updating a fast time weighted ratio of the filtered first and second signals. The one or more processors can further perform the operations of calculating an absolute difference between the fast time weighted ratio and the slow time weighted ratio, comparing the absolute difference with a threshold, and increasing the gain when the absolute difference is greater than the threshold. In some embodiments, adjusting or increasing the gain involves adjusting a gain of an overall system or of a total output. In some embodiments, adjusting the gain involves adjusting the gain from a first microphone, from a second microphone or from both. In some embodiments, adjusting the gain involves adjusting the gain at the output of a VAD or comparator or other output. In some embodiments, adjusting the gain can involve any combination of gain adjustment mentioned above.

In some embodiments, electronic device can further include the memory having instructions when executed by the one or more processors to cause the one or more processors to perform the operations of band limiting or band pass filtering the first microphone signal to provide filtered first signal, band limiting or band pass filtering the second microphone signal to provide a filtered second signal, calculating a power estimate of the filtered first signal including a fast time weighted average and a slow time weighted average of the filtered first signal, and calculating a power estimate of the filtered second signal including a fast time weighted average and a slow time weighed average of the filtered second signal. In some embodiments the threshold is fixed or the threshold is dependent on the slow time weighted average. In some embodiments, the first microphone signal is received by an ambient signal microphone and the second microphone signal is received by a ear canal microphone. The ambient signal microphone and the ear canal microphone can be part of an earphone device having a sound isolating barrier or a partially sound isolating barrier to isolate the ear canal microphone from an ambient environment. The earphone device can be any number of devices including, but not limited to a headset, earpiece, headphone, ear bud or other type of earphone device. In some embodiments, the sound isolating barrier or partially sound isolating barrier is an inflatable balloon or foam plug. In some embodiments, the memory further includes instructions causing the operation of determining a current voice activity status based on the comparison step. In some embodiments, the memory further includes instructions causing the operation of determining a current voice activity status using Singular Value Decomposition, neural net systems, or a bounded probability value. In some embodiments, the first microphone signal is optionally processed using an analog or a digital band-pass filter and in some embodiments the second microphone signal is optionally processed using an analog or a digital band-pass filter. In some embodiments, at least one characteristic of the first or second microphone signals includes a short-term power estimate.

BRIEF DESCRIPTION OF THE DRAWINGS

The invention may be understood from the following detailed description when read in connection with the accompanying drawing. It is emphasized, according to common practice, that various features of the drawings may not be drawn to scale. On the contrary, the dimensions of the various features may be arbitrarily expanded or reduced for clarity. Moreover, in the drawing, common numerical references are used to represent like features. Included in the drawing are the following figures:

FIG. 1 is a block diagram of a voice activity detector system in accordance with an embodiment;

FIG. 2 is a flow chart of a method for determining voice activity status in accordance with an embodiment herein; and FIG. 3 is an overview block diagram of a system for determining voice activity status in accordance with an embodiment herein.

DETAILED DESCRIPTION OF THE INVENTION

A new method and system is presented to robustly determined voice activity using typically two microphones mounted in a small earpiece. The determined voice activity status can be used to control the gain on a voice operated control system to gate the level of a signal directed to a second voice receiving system. This voice receiving system can be a voice communication system (e.g. radio or telephone system), a voice recording system, a speech to text system, a voice machine-control system. The gain of the voice operated control system is typically set to zero when no voice active is detected, and set to unity otherwise. The overall data rate in a voice communication system can therefore be adjusted, and large data rate reductions are possible: thereby increasing the number of voice communications channels and/or increasing the voice quality for each voice communication channel. The voice activity status can also be used to adjust the power used in a wireless voice communication system, thereby extending the battery life of the system.

FIG. 1 describes an exemplary overview or system 10 of an embodiment in accordance the present invention. In one exemplary embodiment, two microphones in an earphone are used to determine voice activity of the earphone wearer. The first microphone 12 is an ambient sound microphone, detecting sound in the ambient environment of the earphone wearer. The second microphone 13 is an ear-canal microphone detecting sound in the ear canal of the earphone wearer. In a preferred embodiment, the earphone incorporates a sound isolating or a partially sound isolating barrier to isolate the ear canal microphone from the ambient environment, where this barrier can be an inflatable balloon or foam plug. The microphones 12 and 13 can serve as inputs to a voice activity detector or VAD 14. The voice activity detector 14 can provide a VAD status to a gain update module 15. The gain update module 15 and the ear canal microphone 13 can provide inputs to an amplifier 16. The output from the gain update module 15 serves as the voice controller gain input signal to the amplifier 16. The amplifier 16 can provide an output signal 17 which can be used by a speaker 18 for example.

FIG. 2 describes a method 20 for determining the status of user voice activity of the earphone system in FIG. 1. The first and second microphone signals are received at 21 and 22 and are band pass filtered (or "band limited") and a power estimate of these filtered first and second microphone signals are calculated at 23 and 24 respectively. In the preferred embodiment, the band pass filtering is accomplished by a weighted FFT operation, familiar to those skilled in the art, with the signal power estimated between approximately 100 Hz and 2 kHz.

$$P\_1(t)=W*FFT(M\_1(t))$$

$$P\_2(t)=W*FFT(M\_2(t))$$

Where

P_1(t) is the weighted power estimate of signal microphone 1 at time t.

W is a frequency weighting vector.

FFT( ) is a Fast Fourier Transform operation.

M_1(t) is the signal from the first microphone at time t.

M_2(t) is the signal from the second microphone at time t.

A fast-time weighted average of the two band pass filtered power estimates is calculated at 25 and 26 respectively, with a fast time constant, which in the preferred embodiment is equal to 45 ms.

$$AV\_M1\_fast(t)=a*AV\_M1\_fast(t-1)+(a-1)*P\_1(t)$$

$$AV\_M2\_fast(t)=a*AV\_M2\_fast(t-1)+(a-1)*P\_1(t)$$

Where

AV_M1_fast(t) is the fast time weighted average of the first band pass filtered microphone signal.

AV_M2_fast(t) is the fast time weighted average of the second band pass filtered microphone signal.

a is a fast time weighting coefficient.

A slow-time weighted average of the two band pass filtered power estimates is calculated at 27 and 28 respectively, with a fast time constant which in the preferred embodiment is equal to 500 ms.

$$AV\_M1\_slow(t)=b*AV\_M1\_slow(t-1)+(b-1)*P\_1(t)$$

$$AV\_M2\_slow(t)=b*AV\_M2\_slow(t-1)+(b-1)*P\_1(t)$$

Where

AV_M1_slow(t) is the slow time weighted average of the first band pass filtered microphone signal.

AV_M2_slow(t) is the slow time weighted average of the second band pass filtered microphone signal.

b is a slow time weighting coefficient, where a>b.

The ratio of the two fast time weighted power estimates is calculated at 30 (i.e., the fast weighted power of the second microphone divided by the fast weighted power of the first microphone).

$$ratio\_fast(t)=AV\_M2\_fast(t)/AV\_M1\_fast(t)$$

The ratio of the two slow time weighted power estimates is calculated at 29 (ie the slow weighted power of the second microphone divided by the slow weighted power of the first microphone).

$$ratio\_slow(t)=AV\_M2\_slow(t)/AV\_M1\_slow(t)$$

The absolute difference of the two above ratio values is then calculated at 31.

$$diff(t)=abs(ratio\_fast(t)-ratio\_slow(t))$$

Note that the updating of the slow time weighted ratio in one embodiment is of the first filtered signal and the second filtered signal where the first filtered signal and the second filtered signal are the slow weighted powers of the first and second microphone signals. Similarly, updating of the fast time weighted ratio is of the first filtered signal and the second filtered signal where the first filtered signal and the second filtered signals are the fast weighted powers of the first and second microphone signals. As noted above, the absolute differences between the fast time weighted ratio and the slow time weighted ratios are calculated to provide a value.

This value is then compared with a threshold at 32, and if the value diff(t) is greater than this threshold, then we determine that voice activity is current in an active mode at 33, and the VOX gain value is updated at 34 or in this example increased (up to a maximum value of unity).

In one exemplary embodiment the threshold value is fixed.

In a second embodiment the threshold value is dependent on the slow weighted level AV_M1 slow.

In a third embodiment the threshold value is set to be equal to the time averaged value of the diff(t), for example calculated according to the following:

$$\text{threshold}(t)=c*\text{threshold}(t-1)+(c-1)*\text{diff}(t)$$

where c is a time smoothing coefficient such that the time smoothing is a leaky integrator type with a smoothing time of approximately 500 ms.

FIG. 3 is a diagram showing a high level overview of a system 35 to detect voice activity status. The system 35 uses a signal analysis system 41 to analyze at least 2 audio input signals (e.g., 37, 38, 39, and 40) to determine a voice activity status at 42, where this status can be a binary value (e.g., 0="no voice activity" and 1="voice activity", or the status can be a bounded probability value, e.g., between 0% and 100%, where the value is a probability likelihood of voice activity. The signal analysis system 41 can utilize the previously described method, where 2 input signals from a single earphone are used to determine a voice activity status. Alternative methods for determining voice activity can include algorithms using Singular Value Decomposition (SVD) or neural net systems.

Although the invention is illustrated and described herein with reference to specific embodiments, the invention is not intended to be limited to the details shown. Rather, various modifications may be made in the details within the scope and range of equivalents of the claims and without departing from the embodiments claimed.

I claim:

1. An earphone comprising:
   a first ambient microphone configured to generate a first microphone signal;
   a second ambient microphone configured to generate a second microphone signal;
   a third microphone configured to generate a third microphone signal;
   an ear canal microphone configured to generate a fourth microphone signal;
   a sound isolating barrier, wherein the first microphone and second microphone sample the environment on a first side of the sound isolating barrier and the ear canal microphone samples an environment on a second side of the sound isolating barrier where the first side and second side are separated by the sound isolating barrier;
   memory configured to store instructions;
   a processor configured to execute the instructions to perform operations, the operations comprising:
   receiving the first microphone signal;
   receiving the second microphone signal;

receiving the third microphone signal;
   receiving the fourth microphoned signal;
   generating a modified first microphone signal by applying a first filter to the first microphone signal;
   generating a modified second microphone signal by applying a second filter to the second microphone signal;
   generating a modified third microphone signal by applying a third filter to the third microphone signal;
   generating a modified fourth microphone signal by applying a fourth filter to the fourth microphone signal;
   generating a first ratio of a time weighted power estimate of the first microphone signal to the a time weighted power estimate of the second microphone signal;
   generating a second ratio of the time weighted power estimate of the first microphone signal to a time weighted power estimate of the third microphone signal;
   generating a third ratio of the time weighted power estimate of the first microphone signal to a time weighted power estimate of the fourth microphone signal;
   detecting if there is voice activity, wherein there is voice activity when the first ratio is above a first threshold and the second ratio is above a second threshold and the third ratio is above a third threshold; and
   generating a binary voice activity status, where a value of 0 refers to no voice activity and a 1 refers to detected voice activity.

2. The earphone according to claim 1, wherein a first filter is applied to the first microphone signal prior to generating the first, second and third ratios, wherein the first filter is a bandpass filter.

3. The earphone according to claim 2, wherein the bandpass filter is configured to pass frequencies primarily between 100 Hz to 2 kHz.

4. The earphone according to claim 1, wherein a second filter is applied to the second microphone signal prior to generating the first, second and third ratios, wherein the second filter is a bandpass filter.

5. The earphone according to claim 4, wherein the bandpass filter is configured to pass frequencies primarily between 100 Hz to 2 kHz.

6. The earphone according to claim 1, wherein a third filter is applied to the third microphone signal prior to generating the first, second and third ratios, wherein the third filter is a bandpass filter.

7. The earphone according to claim 6, wherein the bandpass filter is configured to pass frequencies primarily between 100 Hz to 2 kHz.

8. The earphone according to claim 1, wherein a fourth filter is applied to the fourth microphone signal prior to generating the first, second and third ratios, wherein the fourth filter is a bandpass filter.

9. The earphone according to claim 8, wherein the bandpass filter is configured to pass frequencies primarily between 100 Hz to 2 kHz.

* * * * *